(12) United States Patent
Iwaki et al.

(10) Patent No.: US 8,017,252 B2
(45) Date of Patent: *Sep. 13, 2011

(54) LIGHT EMITTING DEVICE AND ELECTRONIC APPLIANCE USING THE SAME

(75) Inventors: Yuji Iwaki, Atsugi (JP); Satoshi Seo, Kawasaki (JP); Takahiro Kawakami, Isehara (JP); Hisao Ikeda, Atsugi (JP); Junichiro Sakata, Atsugi (JP); Tomoya Aoyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 996 days.

This patent is subject to a terminal disclaimer.

(21) Appl. No.: 11/452,979

(22) Filed: Jun. 15, 2006

(65) Prior Publication Data

US 2006/0292394 A1 Dec. 28, 2006

(30) Foreign Application Priority Data

Jun. 22, 2005 (JP) .................. 2005-181806
Jul. 25, 2005 (JP) .................. 2005-213708

(51) Int. Cl.
*H05B 33/12* (2006.01)
(52) U.S. Cl. ........ 428/690; 428/917; 313/504; 313/506; 257/40; 585/26
(58) Field of Classification Search ................ 428/690, 428/917; 313/504, 506; 257/40; 585/26
See application file for complete search history.

(56) References Cited

U.S. PATENT DOCUMENTS

| 5,989,737 | A | 11/1999 | Xie et al. |
| 6,013,384 | A | 1/2000 | Kido et al. |
| 6,361,886 | B2 | 3/2002 | Shi et al. |
| 6,380,687 | B1 | 4/2002 | Yamazaki |

(Continued)

FOREIGN PATENT DOCUMENTS

CN 1236825 12/1999

(Continued)

OTHER PUBLICATIONS

T. Nakada et al., "Multi Photon Emission Organic EL Devices Using Charge-Transfer Complex as Charge Generation," The 63rd Autumn Meeting, Sep. 24, 2002, vol. 27a-ZL-12, pp. 1165.

(Continued)

*Primary Examiner* — David Wu
*Assistant Examiner* — Vu A Nguyen
(74) *Attorney, Agent, or Firm* — Eric J. Robinson; Robinson Intellectual Property Law Office, P.C.

(57) ABSTRACT

A light emitting device comprises a pair of electrodes and a mixed layer provided between the pair of electrodes. The mixed layer contains an organic compound which contains no nitrogen atoms, i.e., an organic compound which dose not have an arylamine skeleton, and a metal oxide. As the organic compound, an aromatic hydrocarbon having an anthracene skeleton is preferably used. As such an aromatic hydrocarbon, t-BuDNA, DPAnth, DPPA, DNA, DMNA, t-BuDBA, and the like are listed. As the metal oxide, molybdenum oxide, vanadium oxide, ruthenium oxide, rhenium oxide, and the like are preferably used. Further, the mixed layer preferably shows absorbance per 1 μm of 1 or less or does not show a distinct absorption peak in a spectrum of 450 to 650 nm when an absorption spectrum is measured.

14 Claims, 46 Drawing Sheets

U.S. PATENT DOCUMENTS

| | | | |
|---|---|---|---|
| 6,423,429 B2 | 7/2002 | Kido et al. | |
| 6,465,115 B2 * | 10/2002 | Shi et al. | 428/690 |
| 6,483,236 B1 | 11/2002 | Hung | |
| 6,486,601 B1 | 11/2002 | Sakai et al. | |
| 6,489,638 B2 | 12/2002 | Seo et al. | |
| 6,509,109 B1 | 1/2003 | Nakamura et al. | |
| 6,518,700 B1 | 2/2003 | Friend et al. | |
| 6,552,496 B2 | 4/2003 | Yamazaki | |
| 6,589,673 B1 | 7/2003 | Kido et al. | |
| 6,642,544 B1 | 11/2003 | Hamada et al. | |
| 6,774,573 B2 | 8/2004 | Yamazaki | |
| 6,830,494 B1 | 12/2004 | Yamazaki et al. | |
| 6,936,961 B2 | 8/2005 | Liao et al. | |
| 7,158,161 B2 | 1/2007 | Gyoutoku et al. | |
| 7,511,421 B2 | 3/2009 | Tsutsui et al. | |
| 7,732,808 B2 | 6/2010 | Ikeda et al. | |
| 2001/0004190 A1 | 6/2001 | Nishi et al. | |
| 2001/0025959 A1 | 10/2001 | Yamazaki et al. | |
| 2001/0041270 A1 | 11/2001 | Maruyama et al. | |
| 2001/0043046 A1 | 11/2001 | Fukunaga | |
| 2001/0046611 A1 | 11/2001 | Kido et al. | |
| 2001/0053559 A1 | 12/2001 | Nagao et al. | |
| 2002/0093290 A1 | 7/2002 | Yamazaki | |
| 2002/0180349 A1 | 12/2002 | Aziz et al. | |
| 2003/0111666 A1 | 6/2003 | Nishi et al. | |
| 2003/0189401 A1 | 10/2003 | Kido et al. | |
| 2003/0214246 A1 | 11/2003 | Yamazaki | |
| 2004/0227460 A1 | 11/2004 | Liao et al. | |
| 2005/0006667 A1 | 1/2005 | Yamazaki | |
| 2005/0035708 A1 | 2/2005 | Yamazaki et al. | |
| 2005/0084712 A1 | 4/2005 | Kido et al. | |
| 2005/0084713 A1 | 4/2005 | Kido et al. | |
| 2005/0084994 A1 * | 4/2005 | Yamazaki et al. | 438/29 |
| 2005/0098207 A1 | 5/2005 | Matsumoto et al. | |
| 2005/0106419 A1 | 5/2005 | Endoh et al. | |
| 2005/0116633 A1 * | 6/2005 | Yamazaki et al. | 313/506 |
| 2005/0170208 A1 | 8/2005 | Yatsunami et al. | |
| 2005/0218396 A1 | 10/2005 | Tsuchiya et al. | |
| 2006/0008740 A1 | 1/2006 | Kido et al. | |
| 2006/0263638 A1 | 11/2006 | Kawakami et al. | |
| 2007/0152572 A1 * | 7/2007 | Kawakami et al. | 313/505 |
| 2007/0170843 A1 | 7/2007 | Kawamura et al. | |
| 2007/0182317 A1 | 8/2007 | Kido et al. | |
| 2007/0200125 A1 | 8/2007 | Ikeda et al. | |
| 2008/0191611 A1 | 8/2008 | Iwaki et al. | |
| 2009/0026922 A1 * | 1/2009 | Iwaki et al. | 313/504 |
| 2009/0230856 A1 | 9/2009 | Tsutsui et al. | |

FOREIGN PATENT DOCUMENTS

| | | |
|---|---|---|
| EP | 0 948 063 | 10/1999 |
| EP | 0949696 A | 10/1999 |
| EP | 1 065 723 | 1/2001 |
| EP | 1 093 167 | 4/2001 |
| EP | 1 160 891 | 12/2001 |
| EP | 1 351 558 | 10/2003 |
| EP | 1478025 A | 11/2004 |
| EP | 1 524 706 | 4/2005 |
| EP | 1351558 B | 7/2006 |
| JP | 02-288092 A | 11/1990 |
| JP | 03-114197 | 5/1991 |
| JP | 03-190088 | 8/1991 |
| JP | 03-274695 | 12/1991 |
| JP | 03-274695 A | 12/1991 |
| JP | 04-357694 | 12/1992 |
| JP | 06-267658 | 9/1994 |
| JP | 06-267658 A | 9/1994 |
| JP | 06-290873 | 10/1994 |
| JP | 07-312289 | 11/1995 |
| JP | 07-312289 A | 11/1995 |
| JP | 09-063771 | 3/1997 |
| JP | 10-255985 | 9/1998 |
| JP | 10-308284 | 11/1998 |
| JP | 11-251067 | 9/1999 |
| JP | 11-297474 | 10/1999 |
| JP | 11-297474 A | 10/1999 |
| JP | 11-307259 A | 11/1999 |
| JP | 11-307264 A | 11/1999 |
| JP | 2000-191560 A | 7/2000 |
| JP | 2000-315580 | 11/2000 |
| JP | 2000-315580 A | 11/2000 |
| JP | 2001-076868 | 3/2001 |
| JP | 2001-185354 | 7/2001 |
| JP | 2002-015873 | 1/2002 |
| JP | 2003-146951 | 5/2003 |
| JP | 2003-146951 A | 5/2003 |
| JP | 2003-229278 | 8/2003 |
| JP | 2003-272860 | 9/2003 |
| JP | 2004-075580 A | 3/2004 |
| JP | 2004-269706 A | 9/2004 |
| JP | 2004-342614 A | 12/2004 |
| JP | 2004-349007 | 12/2004 |
| JP | 2004-349007 A | 12/2004 |
| JP | 2005-026121 | 1/2005 |
| JP | 2005-026121 A | 1/2005 |
| JP | 2005-123095 | 5/2005 |
| JP | 2005-251587 A | 9/2005 |
| WO | WO-2005/020643 | 3/2005 |
| WO | WO 2005/031798 | 4/2005 |
| WO | WO 2006/101016 | 9/2006 |

OTHER PUBLICATIONS

S. Tokito et al., "Metal Oxides as a Hole-Injecting Layer for an Organic Electroluminescent Device," Journal of Applied Physics, Jan. 1, 1996, vol. 29, pp. 2750-2753.

Y. Yang et al. "Polyaniline as a Transparent Electrode for Polymer Light-Emitting Diodes: Lower Operating Voltage and Higher Efficiency;" Applied Physics Letters, Mar. 7, 1994, vol. 64, No. 10, pp. 1245-1247.

Office Action (Application No. 200610094005.0) Dated Dec. 25, 2009.

International Search Report (Application No. PCT/JP2006/308481) Dated Aug. 1, 2006.

Written Opinion (Application No. PCT/JP2006/308481) Dated Aug. 1, 2006.

Tao.S et al., Anthracene Derivative for a Non-Doped Blue-Emitting Organic Electroluminescence Device With Both Excellent Color Purity and High Efficiency, Chem. Phys. Lett. (Chemical Physics Letters), 2004, vol. 397, pp. 1-4.

* cited by examiner

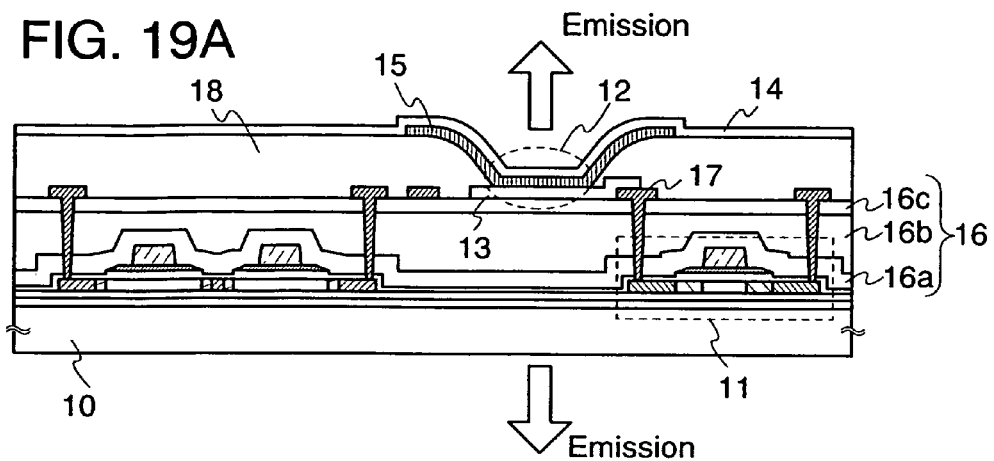
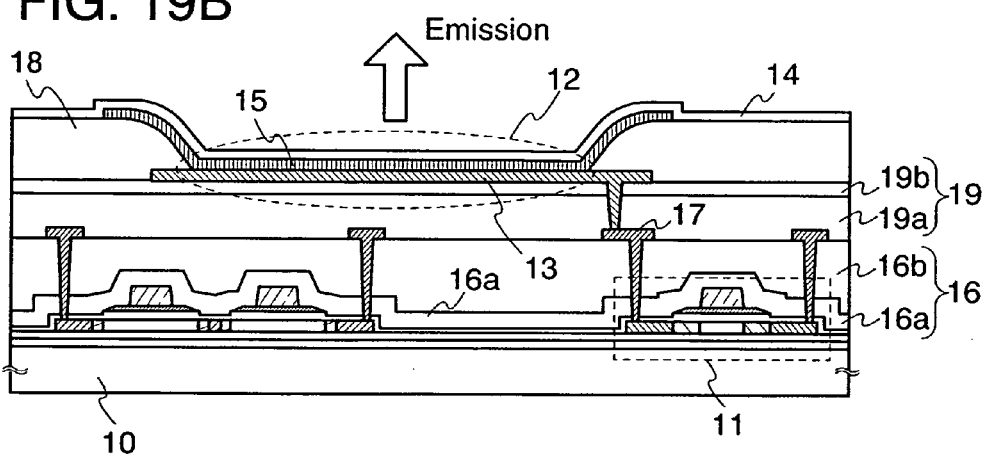
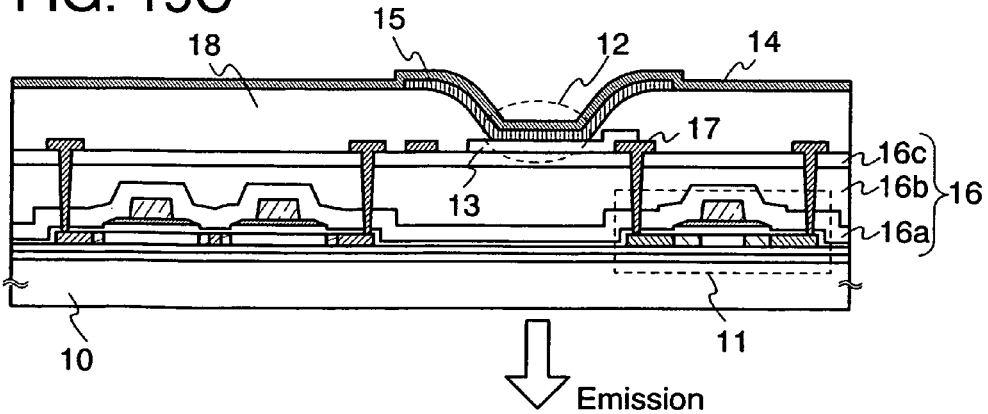

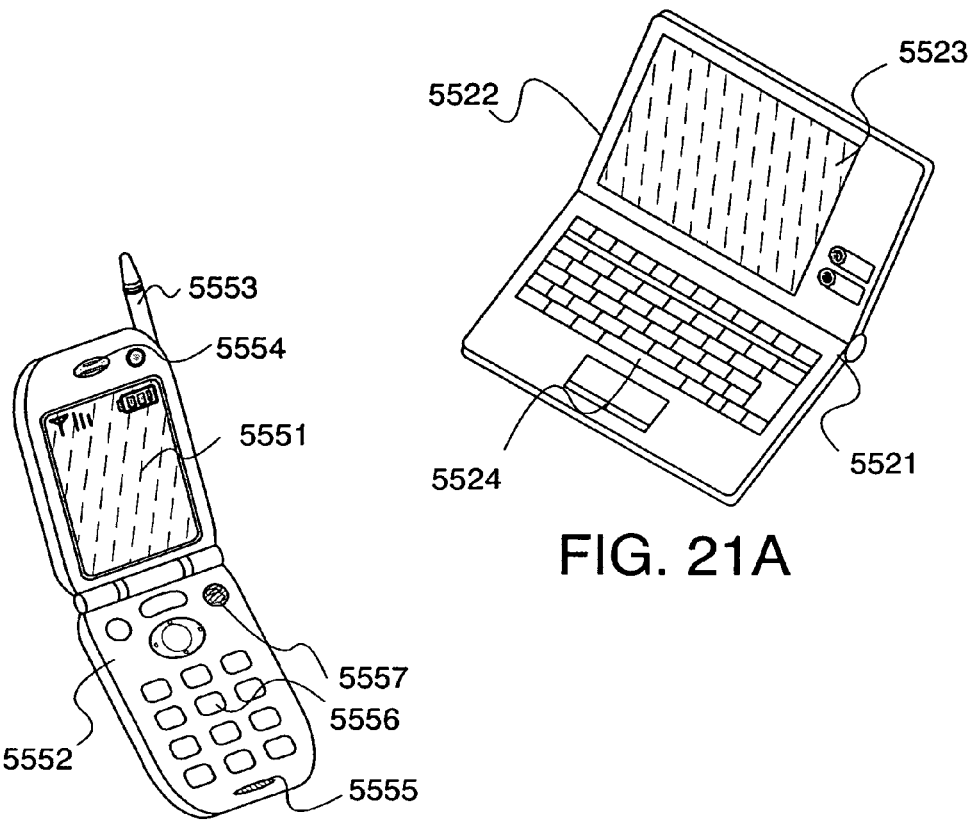
FIG. 21A
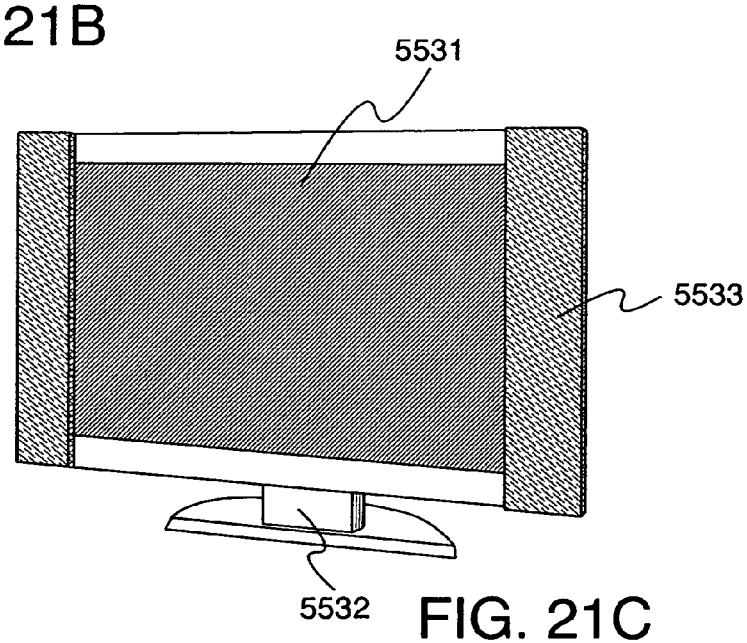
FIG. 21B
FIG. 21C

LIGHT EMITTING DEVICE AND ELECTRONIC APPLIANCE USING THE SAME

BACKGROUND OF THE INVENTION

1. Field of the Invention

The present invention relates a light emitting element having a layer containing a light emitting substance formed between a pair of electrodes, a light emitting device including the light emitting element, and an electronic appliance.

2. Description of the Related Art

A light emitting element, which has recently been attracting attention as a pixel of a display device or a light source of a lighting device, has a light emitting layer between a pair of electrodes. When current flows between the pair of electrodes, a light emitting substance contained in the light emitting layer emits light.

In development of such a light emitting element, one of important problems is to prevent short-circuiting caused between a pair of electrodes of the light emitting element. One reason of shirt-circuiting caused between a pair of electrodes is a projection generated on each surface of the electrodes. Such a projection is generated when ITO and the like are crystallized, for example. The short-circuiting between the pair of electrodes can be suppressed by reducing roughness of each surface of the electrodes by covering the projection with a thick layer. However, by providing the thick layer, driving voltage of the light emitting element is sometimes increased. Therefore, a technique by which a thick layer is provided without increasing driving voltage has been developed. For example, patent document 1 discloses a technique by which a mixed film in which divanadium pentoxide and α-NPD (note that, α-NPD is also referred to as NPB) are mixed is provided. It is suggested that the short-circuiting can be prevented by providing such a mixed film in the patent document 1.

It is thought that the technique as disclosed in the patent document 1 is extremely effective to reduce short-circuiting caused between a pair of electrodes. However, with respect to absorption spectrum characteristics of the mixed film, in which divanadium pentoxide and α-NPD are mixed, there are large variations in absorption intensity being dependent on an absorption wavelength especially in a visible light region. Accordingly, the amount of light absorbed in the mixed film is varied depending on wavelengths of light emission, thereby causing; difference in light extraction efficiency for each wavelength of light emission.

Patent Document 1: Japanese Patent Application Laid-Open No. 2005-123095

SUMMARY OF THE INVENTION

It is an object of the present invention to provide a light emitting element, which can reduce an operational defect due to crystallization of a compound contained in a layer provided between a pair of electrodes, and a light emitting device and an electronic appliance using the light emitting element. Moreover, it is another object of the present invention to provide a light emitting element, which can prevent variations in light extraction efficiency being dependent on colors of light emission, and a light emitting device and an electronic appliance using the light emitting element.

One feature of a light emitting element of the present invention is that a mixed layer containing an organic compound such as an aromatic hydrocarbon which does not contain a nitrogen atom, more specifically, an organic compound which dose not have an arylamine skeleton, and a metal oxide is provided between a pair of electrodes. Further, when measuring an absorption spectrum, the mixed layer preferably shows absorbance per 1 µm of 1 or less, or does not show a distinct absorption peak in a range of wavelengths of 450 to 650 nm.

In an aspect of the present invention, a light emitting element includes a layer containing an aromatic hydrocarbon and a metal oxide between a pair of electrodes. The aromatic hydrocarbon is not particularly limited; however, an aromatic hydrocarbon having hole mobility of $1\times10^{-6}$ cm$^2$/Vs or more (and more preferably, $1\times10^{-6}$ to $1\times10^{0}$ cm$^2$/Vs) is preferably used. As such an aromatic hydrocarbon, for example, 2-tert-butyl-9,10-di(2-naphthyl)anthracene; anthracene; 9,10-diphenylanthracene; tetracene; rubrene; perylene; 2,5,8,11-tetra(tert-butyl)perylene; and the like can be given. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 95%, or absorbance per 1 µm in the spectrum of 450 to 650 nm is 1 or less, and concretely, 0.3 to 0.8.

In another aspect of the present invention, a light emitting element includes a light emitting layer between a first electrode and a second electrode, and a layer containing an aromatic hydrocarbon and a metal oxide between the light emitting layer and the first electrode. When voltage is applied to each of the first and second electrodes so that potential of the first electrode is higher than that of the second electrode, a light emitting substance contained in the light emitting layer emits light. The aromatic hydrocarbon is not particularly limited; however, an aromatic hydrocarbon having hole mobility of $1\times10^{-6}$ cm$^2$/Vs or more (more preferably, $1\times10^{-6}$ to $1\times10^{0}$ cm$^2$/Vs) is preferably used. As such an aromatic hydrocarbon, for example, 2-tert-butyl-9,10-di(2-naphthyl)anthracene; anthracene; 9,10-diphenylanthracene; tetracene; rubrene; perylene; 2,5,8,11-tetra(tert-butyl)perylene; and the like can be given. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 95%, or absorbance per 1 µm in the spectrum of 450 to 650 nm is 1 or less, and concretely, 0.3 to 0.8.

In another aspect of the present invention, a light emitting element includes a light emitting layer, a first mixed layer, and a second mixed layer between a first electrode and a second electrode, and when voltage is applied to each of the first and second electrodes so that potential of the first electrode is higher than that of the second electrode, a light emitting substrate contained in the light emitting layer emits light. In such a light emitting element, the light emitting layer is provided to be closer to the first electrode than the first mixed layer. The second mixed layer is provided to be closer to the second electrode than the first mixed layer. The first mixed layer contains a substance of one or more of an alkali metal, an alkali earth metal, an alkali metal oxide, an alkali earth metal oxide, an alkali metal fluoride, or an alkali earth metal fluoride; and a substance having an electron transporting property. As the alkali metal, lithium (Li), sodium (Na), potassium (K), and the like can be given here, for example. As the alkali earth metal, magnesium (Mg), calcium (Ca), and the like can be given, for example. As the alkali metal oxide, lithium oxide ($Li_2O$), sodium oxide ($Na_2O$), potassium oxide ($K_2O$), and the like can be given. As the alkali earth metal oxide, magnesium oxide (MgO), calcium oxide (CaO), and the like can be given. As the alkali metal fluoride, lithium fluoride (LiF), cesium fluoride (CsF), and the like can be given. As alkali earth metal fluoride, magnesium fluoride ($MgF_2$), calcium fluoride ($CaF_2$), and the like can be given. Further, the second mixed layer contains an aromatic hydrocarbon and a metal oxide. The aromatic hydrocarbon is not particularly limited here; however, an aromatic hydrocarbon having hole mobility of $1\times10^{-6}$ $cm^2/Vs$ or more is preferably used. As such an aromatic hydrocarbon, for example, 2-tert-butyl-9,10-di(2-naphthyl)anthracene; anthracene; 9,10-diphenylanthracene; tetracene; rubrene; perylene; 2,5,8,11-tetra(tert-butyl)perylene; and the like can be given. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 95%, or absorbance per 1 μm in the spectrum of 450 to 650 nm is 1 or less, and concretely, 0.3 to 0.8.

In another aspect of the present invention, a light emitting element includes n (n is a given natural number) pieces of light emitting layers between a first electrode and a second electrode; and a first mixed layer and a second mixed layer between an m-th light emitting layer (m is a given natural number of $1\leqq m\leqq n$) and an (m+1)-th light emitting layer, wherein when voltage is applied to each of the first and second electrodes so that potential of the first electrode is higher than that of the second electrode, a light emitting substance contained in the light emitting layer emits light. The first mixed layer is provided to be closer to the first electrode than the second mixed layer. The first mixed layer contains a substance selected from the group consisting of an alkali metal, an alkali earth metal, an alkali metal oxide, an alkali earth metal oxide, an alkali metal fluoride, and an alkali earth metal fluoride; and a substance having an electron transporting property. As the alkali metal, lithium (Li), sodium (Na), potassium (K), and the like can be given here, for example. As the alkali earth metal, magnesium (Mg), calcium (Ca), and the like can be given, for example. As the alkali metal oxide, lithium oxide ($Li_2O$), sodium oxide ($Na_2O$), potassium oxide ($K_2O$), and the like can be given. As the alkali earth metal oxide, magnesium oxide (MgO), calcium oxide (CaO), and the like can be given. As alkali metal fluoride, lithium fluoride (LiF), cesium fluoride (CsF), and the like can be given. As alkali earth metal fluoride, magnesium fluoride ($MgF_2$), calcium fluoride ($CaF_2$), and the like can be given. Further, the second mixed layer contains an aromatic hydrocarbon and a metal oxide. The aromatic hydrocarbon is not particularly limited here; however, an aromatic hydrocarbon having hole mobility of $1\times10^{-6}$ $cm^2/Vs$ or more is preferably used. As such an aromatic hydrocarbon, for example, 2-tert-butyl-9,10-di(2-naphthyl)anthracene; anthracene; 9,10-diphenylanthracene; tetracene; rubrene; perylene; 2,5,8,11-tetra(tert-butyl)perylene; and the like can be given. As the metal oxide, a metal oxide showing an electron accepting property to aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 95%, or absorbance per 1 μm in the spectrum of 450 to 650 nm is 1 or less, and concretely, 0.3 to 0.8.

In another aspect of the present invention, a light emitting element includes a layer containing an aromatic hydrocarbon and a metal oxide between a pair of electrodes. The aromatic hydrocarbon is not particularly limited; however, an aromatic hydrocarbon having hole mobility of $1\times10^{-6}$ $cm^2/Vs$ or more (and more preferably, $1\times10^{-6}$ to $1\times10^{0}$ $cm^2/Vs$) is preferably used. As such an aromatic hydrocarbon having favorable hole mobility, for example, aromatic hydrocarbons having 14 to 60 carbon atoms and containing an anthracene skeleton such as 2-tert-butyl-9,10-di(2-naphthyl)anthracene; 9,10-di(naphthalen-1-yl)-2-tert-butylanthracene; anthracene; 9,10-diphenylanthracene; 9,10-bis(3,5-diphenylphenyl)anthracene; 9,10-di(naphthalen-2-yl)anthracene; 2-tert-butylanthracene; 9,10-di (4 methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene bianthryl; 10,10(-di(2-phenylphenyl)-9,9(-bianthryl; 10,10(-bis[(2,3,4,5,6-pentaphenyl)phenyl]-9,9(-bianthryl; and 9,10-di(4-phenylphenyl)-2-tert-butylanthracene, can be given. Among the aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 100%.

In another aspect of the present invention, a light emitting element includes a light emitting layer between a first electrode and a second electrode, and a layer containing an aromatic hydrocarbon and a metal oxide between the light emitting layer and the first electrode. When voltage is applied to each of the first and second electrodes so that potential of the first electrode is higher than that of the second electrode, a light emitting substance contained in the light emitting layer emits light. The aromatic hydrocarbon is not particularly limited; however, an aromatic hydrocarbon having hole mobility of 1×10−6 cm2/Vs or more (more preferably, 1×10−6 to 1×100 cm2/Vs) is preferably used. As such an aromatic hydrocarbon having favorable hole mobility, for example, aromatic hydrocarbons having 14 to 60 carbon atoms and containing an anthracene skeleton such as 2-tert-butyl-9,10-di(2-naphthyl)anthracene; 9,10-di(naphthalene-1-yl)-2-tert-butyl anthracene 9,10-di(naphthalen-1-yl)-2-tert-butyl anthracene; anthracene; 9,10-diphenylanthracene; 9,10-bis(3,5-diphenylphenyl)anthracene; 9,10-di(naphthalene-2-yl)anthracene 9,10-di(naphthalen-2-yl)anthracene; 2-tert-butylanthracene; 9,10-di(4-methylnaphthalene-1-yl)anthracene 9,10-di(4-methylnaphthalen-1-yl)anthracene; 9,10-bis[2-(naphthalen-1-yl)phenyl]anthracene 9,10-bis[2-(naphthalen-1-yl)phenyl]anthracene; 2,3,6,7-tetramethyl-9,10-di(naphthalene-1-yl)anthracene 2,3,6,7-tetramethyl-9,10-di(naphthalen-1-yl)anthracene; 2,3,6,7-tetramethyl-9,10-di(naphthalene-2-yl)anthracene bianthryl 2,3,6,7-tetramethyl-9,10-di(naphthalen-2-yl)anthracene bianthryl; 10,10(-di(2-phenylphenyl)-9,9(-bianthryl; 10,10(-bis[(2,3,4,5,6-pentaphenyl)phenyl]-9,9(-bianthryl; and 9,10-di(4-phenylphenyl)-2-tert-butylanthracene, can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 100%.

In another aspect of the present invention, a light emitting element includes a light emitting layer, a first mixed layer, and a second mixed layer between a first electrode and a second electrode, wherein when voltage is applied to each of the first and second electrodes so that potential of the first electrode is higher than that of the second electrode, a light emitting substance contained in the light emitting layer emits light. In the light emitting element, the light emitting layer is provided to be closer to the first electrode than the first mixed layer. The second mixed layer is provided to be closer to the second electrode than the first mixed layer. The first mixed layer contains a substance selected from the group consisting of an alkali metal, an alkali earth metal, an alkali metal oxide, an alkali earth metal oxide, an alkali metal fluoride, and an alkali earth metal fluoride; and a substance having an electron transporting property. As the alkali metal, lithium (Li), sodium (Na), potassium (K), and the like can be given here, for example. As the alkali earth metal, magnesium (Mg), calcium (Ca), and the like can be given, for example. As the alkali metal oxide, lithium oxide (Li2O), sodium oxide (Na2O), potassium oxide (K2O), and the like can be given. As the alkali earth metal oxide, magnesium oxide (MgO), calcium oxide (CaO), and the like can be given. As the alkali metal fluoride, lithium fluoride (LiF), cesium fluoride (CsF), and the like can be given. As the alkali earth metal fluoride, magnesium fluoride (MgF2), calcium fluoride (CaF2), and the like can be given. Further, the second mixed layer contains an aromatic hydrocarbon and a metal oxide. The aromatic hydrocarbon is not particularly limited here; however, an aromatic hydrocarbon having hole mobility of 1×10−6 cm2/Vs or more is preferably used. As such an aromatic hydrocarbon having favorable hole mobility, for example, aromatic hydrocarbons having 14 to 60 carbon atoms and containing an anthracene skeleton such as 2-tert-butyl-9,10-di(2-naphthyl)anthracene; 9,10-di(naphthalene-1-yl)-2-tert-butylanthracene 9,10-di(naphthalen-1-yl)-2-tert-butylanthracene; anthracene; 9,10-diphenylanthracene; 9,10-bis(3,5-diphenylphenyl)anthracene; 9,10-di(naphthalene-2-yl)anthracene 9,10-di(naphthalen-2-yl)anthracene; 2-tert-butylanthracene; 9,10-di(4-methylnaphthalene-1-yl)anthracene 9,10-di(4-methylnaphthalen-1-yl)anthracene; 9,10-bis[2-(naphthalene-1-yl)phenyl]anthracene 9,10-bis[2-(naphthalen-1-yl)phenyl]anthracene; 2,3,6,7-tetramethyl-9,10-di(naphthalene-1-yl)anthracene 2,3,6,7-tetramethyl-9,10-di(naphthalen-1-yl)anthracene; 2,3,6,7-tetramethyl-9,10-di(naphthalene-2-yl)anthracene bianthryl 2,3,6,7-tetramethyl-9,10-di(naphthalen-2-yl)anthracene bianthryl; 10,10(-di(2-phenylphenyl)-9,9(-bianthryl; 10,10(-bis[(2,3,4,5,6-pentaphenyl)phenyl]-9,9(-bianthryl; and 9,10-di(4-phenylphenyl)-2-tert-butylanthracene, can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 100%.

In another aspect of the present invention, a light emitting element includes n (n is a given natural number) pieces of light emitting layers between a first electrode and a second electrode; and a first mixed layer and a second mixed layer between an m-th light emitting layer (m is a given natural number of $1 \leq m \leq n$) and an (m+1)-th light emitting layer, wherein when voltage is applied to each of the first and second electrodes so that potential of the first electrode is higher than that of the second electrode, a light emitting substance contained in the light emitting layer emits light. The first mixed layer is provided to be closer to the first electrode than the second mixed layer. The first mixed layer contains a substance selected from the group consisting of an alkali metal, an alkali earth metal, an alkali metal oxide, an alkali earth metal oxide, an alkali metal fluoride, and an alkali earth metal fluoride; and a substance having an electron transporting property. As the alkali metal, lithium (Li), sodium (Na), potassium (K), and the like can be given here, for example. As the alkali earth metal, magnesium (Mg), calcium (Ca), and the like can be given, for example. As the alkali metal oxide, lithium oxide ($Li_2O$), sodium oxide ($Na_2O$), potassium oxide ($K_2O$), and the like can be given. As the alkali earth metal oxide, magnesium oxide (MgO), calcium oxide (CaO), and the like can be given. As the alkali metal fluoride, lithium fluoride (LiF), cesium fluoride (CsF), and the like can be given. As the alkali earth metal fluoride, magnesium fluoride ($MgF_2$), calcium fluoride ($CaF_2$), and the like can be given. Further, the second mixed layer contains an aromatic hydrocarbon and a metal oxide. The aromatic hydrocarbon is not particularly limited here; however, an aromatic hydrocarbon having hole mobility of $1 \times 10^{-6}$ $cm^2$/Vs or more is preferably used. As such an aromatic hydrocarbon having favorable hole mobility, for example, aromatic hydrocarbons having 14 to 60 carbon atoms and containing an anthracene skeleton such as 2-tert-butyl-9,10-di(2-naphthyl)anthracene; 9,10-di(naphthalen-1-yl)-2-tert-butylanthracene; anthracene; 9,10-diphenylanthracene; 9,10-bis(3,5-diphenylphenyl)anthracene; 9,10-di(naphthalen-2-yl)anthracene; 2-tert-butylanthracene; 9,10-di(4-methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene bianthryl; 10,10'-di(2-phenylphenyl)-9,9'-bianthryl; 10,10'-bis[(2,3,4,5,6- pentaphenyl)phenyl]-9,9'-bianthryl; and 9,10-di(4-phenylphenyl)-2-tert-butylanthracene, can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a peak derived from resonance of unpaired electrons, and transmittance in a spectrum of 450 to 650 nm is 80% or more, and concretely, 80 to 100%.

In another aspect of the present invention, a light emitting element includes a layer containing an aromatic hydrocarbon and a metal oxide between a pair of electrodes. The aromatic hydrocarbon is not particularly limited; however, an aromatic hydrocarbon having hole mobility of $1\times10^{-6}$ cm$^2$/Vs or more (more preferably, $1\times10^{-6}$ to $1\times10^{0}$ cm$^2$/Vs) is preferably used. As such an aromatic hydrocarbon having favorable hole mobility, for example, aromatic hydrocarbons having 14 to 60 carbon atoms and containing an anthracene skeleton such as 2-tert-butyl-9,10-di(2-naphthyl)anthracene; 9,10-di(naphthalen-1-yl)-2-tert-butyl anthracene; anthracene; 9,10-diphenylanthracene; 9,10-bis(3,5-diphenylphenyl)anthracene; 9,10-di(naphthalen-2-yl)anthracene; 2-tert-butylanthracene; 9,10-di(4-methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene bianthryl; 10,10'-di(2-phenylphenyl)-9,9'-bianthryl; 10,10'-bis[(2,3,4,5,6-pentaphenyl)phenyl]-9,9'-bianthryl; and 9,10-di(4-phenylphenyl)-2-tert-butylanthracene, can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. The aromatic hydrocarbon and the metal oxide are preferably mixed in the layer so that when the layer containing these substances is measured by an electron spin resonance technique, the layer shows a spectrum with a g-value of 2.0027 to 2.0030, and transmittance in a spectrum of 450 to 650 nm is 80% or more, and concretely, 80 to 100%.

In another aspect of the present invention, a light emitting device includes any of the light emitting elements described above.

In another aspect of the present invention, an electronic appliance uses a light emitting device, which includes any of the light emitting elements described above as a pixel, for a display portion.

In another aspect of the present invention, an electronic appliance uses a light emitting device, which includes any of the light emitting elements described above as a light source, for a lighting portion.

By implementing the present invention, a light emitting element whose an operational defect due to crystallization of a layer provided between a pair of electrodes is reduced, can be obtained. Since an aromatic hydrocarbon and a metal oxide are mixed in the layer, a layer which is not easily crystallized can be formed.

By implementing the present invention, a light emitting element, in which the length of a light path through which emitted light passes can be easily changed, can be obtained. This is because providing a mixed layer containing an aromatic hydrocarbon and a metal oxide between a pair of electrodes makes it possible to obtain a light emitting element requiring less driving voltage, which is dependent on increase in thickness of the mixed layer. As a result, a distance between the light emitting layer and one of the electrodes can be easily changed.

By implementing the present invention, a light emitting element, in which short-circuiting is not easily caused between a pair of electrodes, can be obtained. Since a mixed layer containing an aromatic hydrocarbon and a metal oxide is provided between the pair of electrodes, a light emitting element requiring extremely low deriving voltage, which is dependent on increase in thickness of the mixed layer, can be obtained. As a result, by increasing the thickness of the mixed layer, concavity and convexity generated on a surface (i.e., unflatness of a surface) of one of the electrodes can be easily reduced.

By implementing the present invention, a light emitting element, in which variations in light extraction efficiency caused depending on an emission wavelength can be prevented, can be obtained. Since a mixed layer, which contains an aromatic hydrocarbon and a metal oxide used in the present invention has a characteristic of less variations in absorbance, which is dependent on a wavelength, even if light emissions are differed in wavelength, the amount of light emission loss caused by being absorbed in the mixed layer provided between the light emitting layer and one of the electrodes is not so much differed.

By implementing the present invention, a light emitting element which emits light with high color purity can be obtained, thereby obtaining a light emitting device being capable of providing images with favorable colors. This is because the length of the light path through which light passes can be easily changed and adjusted to be a suitable length without increasing driving voltage.

BRIEF DESCRIPTION OF DRAWINGS

FIGS. 19A to 19C are cross sectional views explaining modes of cross sections of light emitting devices of the present invention;

FIGS. 21A to 21C are diagrams explaining modes of electronic appliances to which the present invention is applied;

DETAILED DESCRIPTION OF THE INVENTION

Embodiment Modes

The embodiment modes according to the present invention will hereinafter be described with reference to the accompanying drawings. It is easily understood by those skilled in the art that the embodiment modes and details herein disclosed can be modified in various ways without departing from the purpose and the scope of the present invention. The present invention should not be interpreted as being limited to the description of the embodiment modes to be given below.

Embodiment Mode 1

One embodiment mode of a light emitting element of the present invention will be described with reference to FIG. 1.

Figure 1:
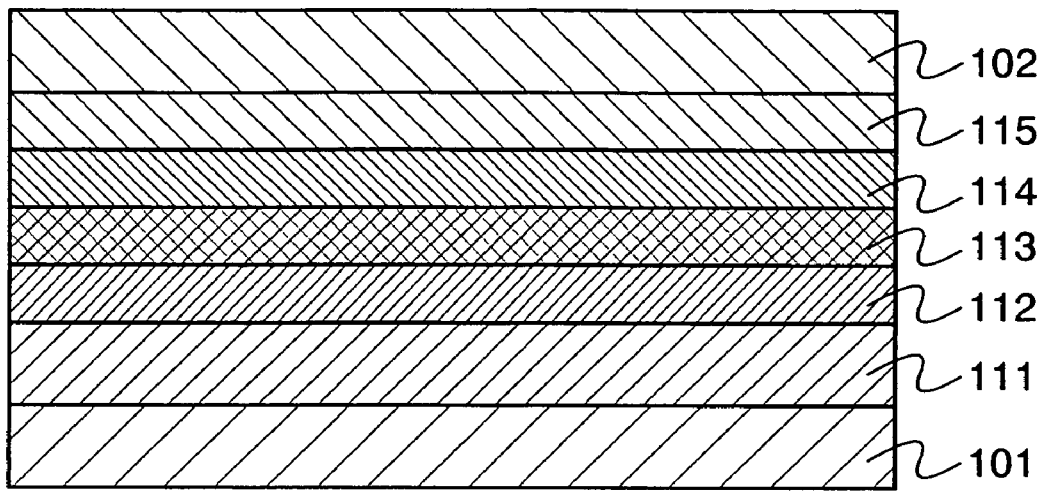
FIG. 1 is a diagram explaining one mode of a light emitting element of the present invention.

FIG. 1 shows a light emitting element having a light emitting layer 113 between a first electrode 101 and a second electrode 102. In the light emitting element shown in FIG. 1, a mixed layer 111 is provided between the light emitting layer 113 and the first electrode 101. A hole transporting layer 112 is provided between the light emitting layer 113 and the mixed layer 111. An electron transporting layer 114 and an electron injecting layer 115 are provided between the light emitting layer 113 and the second electrode 102. In this light emitting element, when voltage is applied to both the first electrode 101 and the second electrode 102 so that potential of the first electrode 101 is higher than that of the second electrode 102 holes are injected to the light emitting layer 113 from the side of the first electrode 101 whereas electrons are injected to the light emitting layer 113 from the side of the second electrode 102. Then, the holes and electrons injected to the light emitting layer 113 are recombined. The light emitting layer 113 contains a light emitting substance. The light emitting substance is excited by excitation energy generated by recombination of the holes and electrons. The light emitting substance in an excited state emits light upon returning to a ground state.

The first electrode 101, the second electrode 102, and each layer provided between the first electrode 101 and the second electrode 102 will be described in detail below.

A substance used for forming the first electrode 101 is not particularly limited. A substance having a low work function such as aluminum and magnesium can be used in addition to a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride. This is because holes are generated from the mixed layer 111 when applying voltage to the light emitting element of the present invention.

The second electrode 102 is preferably formed using a substance having a low work function such as aluminum and magnesium. When a layer generating electrons is provided between the second electrode 102 and the light emitting layer 113, however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 102 may be formed by appropriately selecting either a substance having a high work function or a substance having a low work function in accordance with a characteristic of a layer provided between the second electrode 102 and the light emitting layer 113.

Note that one or both the first electrode 101 and the second electrode 102 is/are preferably formed so that one or both of the electrodes can transmit light.

The mixed layer 111 contains an aromatic hydrocarbon and a metal oxide. The aromatic hydrocarbon is not particularly limited; however, an aromatic hydrocarbon having hole mobility of $1\times10^{-6}$ cm$^2$/Vs or more (more preferably, $1\times10^{-6}$ to $1\times10^{0}$ cm$^2$/Vs) is preferably used. When the aromatic hydrocarbon has hole mobility of $1\times10^{-6}$ cm$^2$/Vs or more, holes injected from the metal oxide can be efficiently transported. As such an aromatic hydrocarbon having hole mobility of $1\times10^{-6}$ cm$^2$/Vs or more, for example, 2-tert-butyl-9,10-di(2-naphthyl)anthracene (abbreviation: t-BuDNA); anthracene; 9,10-diphenylanthracene; tetracene; rubrene; perylene; 2,5,8,11-tetra(tert-butyl)perylene; and the like can be given. In addition, pentacene, coronene, and the like can be used. An aromatic hydrocarbon having hole mobility of $1\times10^{-6}$ cm$^2$/Vs or more and having 14 to 42 carbon atoms such as listed aromatic hydrocarbons is preferably used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. In addition, metal oxides such as titanium oxide, chromium oxide, zirconium oxide, hafnium oxide, tantalum oxide, tungsten oxide, or silver oxide can also be used. By mixing the metal oxide and the aromatic hydrocarbon as mentioned above, charge-transfer can be generated, which results in generation of a charge-transfer complex. The mixed layer 111 in which a charge-transfer complex is generated, contains unpaired electrons. Further, as compared with a mixed film, in which divanadium pentoxide and αA-NPD are mixed, disclosed in the related art as described above (Japanese Patent Application Laid-Open No. 2005-123095) and a mixed film in which dirhenium heptaoxide and α-NPD are mixed, the mixed layer 111 containing a metal oxide and an aromatic hydrocarbon shows extremely less variations in absorbance, which is dependent on an absorption wavelength in a visible light region which is a region of 450 to 650 nm (i.e., less variations in transmittance in a visible light region), and therefore, the amount of light emission loss caused by absorption of light emission in the mixed layer 111 is less dependent on a light emission wavelength. Therefore, providing the mixed layer 111 makes it possible to prevent light extraction efficiency from varying for each color (i.e., for each wavelength) of light emission. The metal oxide is preferably contained in the mixed layer 111 so that a mass ratio of the metal oxide with respect to the aromatic hydrocarbon (=metal oxide/aromatic hydrocarbon) is 0.5 to 2 or a molar ratio thereof is 1 to 4. When the mixed layer 111 contains the metal oxide and the aromatic hydrocarbon with such a mixture ratio, the transmittance of light in a spectrum of 450 to 650 nm can be set to be 80% or more, and specifically, 80 to 95%, in the mixed layer 111. Such the transmittance allows a light emitting element to extract light emission more efficiently. Further, aromatic hydrocarbons have generally a property of being easily crystallized; however, when an aromatic hydrocarbon is mixed with a metal oxide like this embodiment mode, the aromatic hydrocarbon is not easily crystallized. Furthermore, molybdenum oxide is particularly crystallized easily among metal oxides; however, when molybdenum oxide is mixed with an aromatic hydrocarbon like this embodiment mode, the molybdenum oxide is not easily crystallized. By mixing the aromatic hydrocarbon and the metal oxide in this manner, the aromatic hydrocarbon and the metal oxide mutually hinder crystallization, in consequence, a layer which is not easily crystallized can be obtained. Moreover, since aromatic hydrocarbons have a high glass transition temperature, when the mixed layer 111 containing an aromatic hydrocarbon is applied as a mixed layer like this embodiment mode, a mixed layer having a more excellent heat resistance property along with a function of more favorably injecting holes also to the hole transporting layer 112 can be obtained as compared with a hole injecting layer formed using 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); or the like. With respect to a glass transition temperature of t-BuDNA, which is one of aromatic hydrocarbons used in the present invention for reference, a glass transition temperature of t-BuDNA is 127° C., and it is know that the glass transition temperature is higher than 98° C. of a glass transition temperature of α-NPD, which is described in the patent document 1.

The hole transporting layer 112 has a function of transporting holes. In the light emitting element of this embodiment mode, the hole transporting layer 112 has a function of transporting holes to the light emitting layer 113 from the mixed layer 111. Providing the hole transporting layer 112 makes it possible to create a distance between the mixed layer 111 and the light emitting layer 113. Consequently, it is possible to prevent quenching of light emission due to metal contained in the mixed layer 111. The hole transporting layer 112 is preferably formed using a substance having a hole transporting property. In particular, the hole transporting layer 112 is preferably formed using a substance having a hole transporting property with hole mobility of $1\times10^{-6}$ cm$^2$/Vs or more (more preferably, $1\times10^{-6}$ to $1\times10^{0}$ cm$^2$/Vs), or a bipolar substance. Note that the substance having the hole transporting property is a substance having higher hole mobility than electron mobility, and preferably corresponds to a substance in which a ratio of hole mobility to electron mobility (i.e., hole mobility/electron mobility) is larger than 100. As specific examples of the substance having the hole transporting property, 4,4'-bis[N-(1-naphthyl)-N-phenylamino] biphenyl (abbreviation: NPB); 4,4'-bis[N-(3-methylphenyl)-N-phenylamino] biphenyl (abbreviation: TPD); 1,3,5-tris[N,N-di(m-tolyl)amino]benzene (abbreviation: m-MTDAB); 4,4',4"-tris(N-carbazolyl) triphenylamine (abbreviation: TCTA); and the like can be given. Further, the bipolar substance is a substance in which a ratio of mobility of one carrier to mobility of the other carrier is 100 or less, and preferably, 10 or less. As the bipolar substance, for example, 2,3-bis(4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like can be given. Among bipolar substances, in particular, a bipolar substance having mobility of holes and electrons of $1\times10^{-6}$ cm$^2$/Vs or more (more preferably, $1\times10^{-6}$ to $1\times10^{0}$ cm$^2$/Vs), is preferably used.

The light emitting layer 113 contains a light emitting substance. The light emitting substance is a substance having favorable light emitting efficiency which can emit light with a desired wavelength. The light emitting layer 113 may be formed using only a light emitting substance. When quenching due to a concentration is caused, the light emitting layer 113 is preferably a layer in which a light emitting substance is dispersed in a substance having a larger energy gap than that of the light emitting substance. By dispersing the light emitting substance in the light emitting layer 113, quenching of light emission due to a concentration can be prevented. Here, an energy gap indicates an energy gap between a LUMO level and a HOMO level.

The light emitting substance is not particularly limited, and a substance with favorable light emitting efficiency, which can emit light with a desired light emission wavelength may be used. For example, in order to obtain red light emission, for example, the following substances showing emission spectrum with peaks in a spectrum of 600 to 680 nm can be employed as the light emitting substance: 4-dicyanomethylen-2-isopropyl-6-[2-(1,1,7,7-tetramethyl-9-julolidyl)ethenyl]-4H-pyran (abbreviation: DCJTI); 4-dicyanomethylene-2-methyl-6-[2-[(1,1,7,7-tetramethyl-9-julolidy)ethenyl]-4H-pyran (abbreviation: DCJT); 4-dicyanomethylene-2-tert-butyl-6-[2-(1,1,7,7-tetramethyl-9-julolidy]ethenyl]-4H-pyran (abbreviation: DCJTB); periflanthene; 2,5-dicyano-1,4-bis(2-[10-methoxy-1,1,7,7-tetramethyl-9-julolidyl] ethenyl)benzene and the like. In order to obtain green light emission, a substance showing emission spectrum with peaks in a spectrum of 500 to 550 nm such as N,N'-dimethylquinacridon (abbreviation: DMQd), coumarin 6, coumarin 545T, or tris(8-quinolinolato)aluminum (abbreviation: $Alq_3$) can be employed as the light emitting substance. In order to obtain blue light emission, the following substances showing emission spectrum with peaks in a spectrum of 420 to 500 nm can be employed as the light emitting substance: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolato)-4-phenylphenolato-gallium (abbreviation: BGaq); bis(2-methyl-8-quinolinolato)-4-phenylphenolato-aluminum (abbreviation: BAlq); and the like. In addition to the above mentioned substances, which emit fluorescence, the following substances, which emit phosphorescence, can be used as the light emitting material: bis[2-(3,5-bis(trifluoromethyl)phenyl)pyridinato-N,$C^{2'}$]iridium(III) picolinate (abbreviation: $Ir(CF_3ppy)_2(pic)$); bis[2-(4,6-difluorophenyl)pyridinato-N,$C^{2'}$]iridium(III) acetylacetonate (abbreviation: Flr(acac)); bis[2-(4,6-difluorophenyl)pyridinato-N,$C^{2'}$]iridium(III) picolinate (abbreviation: Flr(pic)); tris(2-phenylpyridinato-N,$C^{2'}$) iridium (abbreviation: $Ir(ppy)_3$); and the like.

A substance (also referred to as a host) used for dispersing a light emitting substance, which is contained in the light emitting layer 113 along with the light emitting substance is not particularly limited, and may be appropriately selected in consideration for an energy gap and the like of a substance used for the light emitting substance. For example, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a quinoxaline derivative such as 2,3-bis(4-diphenylaminophenyl) quinoxaline (abbreviation: TPAQn), or 2,3-bis{4-[N-(1-naphthyl)-N-phenylamino]phenyl}-dibenzo[f,h]quinoxaline (abbreviation: NPADiBzQn); a metal complex such as bis[2-(2-hydroxyphenyl)pyridinato]zinc (abbreviation: $Znpp_2$), or bis[2-(2-hydroxyphenyl)benzoxazolato]zinc (abbreviation: $Zn(BOX)_2$); and the like can be used. Note that a light emitting substance is referred to as a guest with respect to the host.

The electron transporting layer 114 has a function of transporting electrons. In the light emitting element of this embodiment mode, the electron transporting layer 114 has a function of transporting electrons injected from the second electrode 102 side to the light emitting layer 113. Providing the electron transporting layer 114 makes it possible to create a distance between the second electrode 102 and the light emitting layer 113. Consequently, quenching of light emission due to metal contained in the second electrode 102 can be prevented. The electron transporting layer is preferably formed using a substance having an electron transporting property. In particular, the electron transporting layer is preferably formed using a substance having an electron transporting property with electron mobility of $1 \times 10^{-6}$ $cm^2/Vs$ or more (more preferably, $1 \times 10$ to $1 \times 10^0$ $cm^2/Vs$), or a bipolar substance. Further, the substance having the electron transporting property is a substance having higher electron mobility than hole mobility, and corresponds to a substance in which a ratio of electron mobility to hole mobility (i.e., electron mobility/hole mobility) is larger than 100. As specific examples of the substance having the electron transporting property, a metal complex such as tris(8-quinolinolato)aluminum (abbreviation: $Alq_3$), tris(4-methyl-8-quinolinolato) aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$); 2-(4-biphenylyl)-5-(4-tert-butylphenyl)-1,3,4-oxadiazole (abbreviation: PBD); 1,3-bis[5-(ptert-butylphenyl)-1,3,4-oxadiazole-2-yl]benzene (abbreviation: OXD-7); TAZ; p-EtTAZ; BPhen; BCP; 4,4'-bis(5-methylbenzoxazolyl-2-yl)stilbene (abbreviation: BZOS); and the like can be given. Further, the bipolar substance is the same as described above. Note that the electron transporting layer 114 and the hole transporting layer 112 may be formed using the same bipolar substance.

The electron injecting layer 115 has a function of helping injection of electrons to the electron transporting layer 114 from the second electrode 102. By providing the electron injecting layer 115, difference in electron affinity between the second electrode 102 and the electron transporting layer 114 can be reduced, thereby injecting electrons easily. The electron injecting layer 115 is preferably formed using a substance whose electron affinity is larger than that of a substance used for forming the electron transporting layer 114 and smaller than that of a substance used for forming the second electrode 102, or a substance whose energy band is curved when it is provided as a thin film with a thickness of about 1 to 2 nm between the electron transporting layer 114 and the second electrode 102. As specific examples of substances, which can be used for forming the electron injecting layer 115, the following inorganic materials can be given: alkali metals such as lithium (Li), and the like; alkali earth metal such as magnesium (Mg), and the like; alkali metal fluorides such as cesium fluoride (CsF), and the like; alkali earth metal fluorides such as calcium fluoride ($CaF_2$), and the like; alkali metal oxides such as lithium oxide ($Li_2O$), sodium oxide ($Na_2O$), potassium oxide ($K_2O$), and the like; alkali earth metal oxides such as calcium oxide (CaO) and magnesium oxide (MgO) and the like. When these substances are formed as thin films, their energy bands can be curved and the injection of electrons can be carried out easily, and therefore, these substances are preferable. In addition to the inorganic materials, organic materials, which can be used for forming the electron transporting layer 114 such as bathophenanthroline (abbreviation: BPhen), bathocuproin (abbreviation: BCP), 3-(4-tert-butylphenyl)-4-(4-ethylphenyl)-5-(4-biphenylyl)-

1,2,4-triazole (abbreviation: p-EtTAZ), and 3-(4-tert-butylphenyl)-4-phenyl-5-(4-biphenylyl)-1,2,4-triazole (abbreviation: TAZ), can be used to form the electron injecting layer 115 by selecting a substance having higher electron affinity than that of a substance used for forming the electron transporting layer 114 from among them. That is, the electron injecting layer 115 may be formed by selecting a substance having electron affinity which is relatively higher than that of the electron transporting layer 114 from substances having electron transporting properties. Further, in a case of providing the electron injecting layer 115, the second electrode 102 is preferably formed using a substance having a low work function such as aluminum.

A substance having an electron transporting property used for the electron transporting layer 114 and an aromatic hydrocarbon contained in the mixed layer 111 in the light emitting element as described above are selected respectively so that when mobility of the substance having the electron transporting property used for the electron transporting layer 114 is compared with mobility of the aromatic hydrocarbon contained in the mixed layer 111, a ratio of mobility of one of the substances having the electron transporting property and the aromatic hydrocarbon to mobility of the other substance is preferably set to be 1,000 or less. By selecting the respective substances in such a manner, recombination efficiency in the light emitting layer can be improved.

Figure 2:
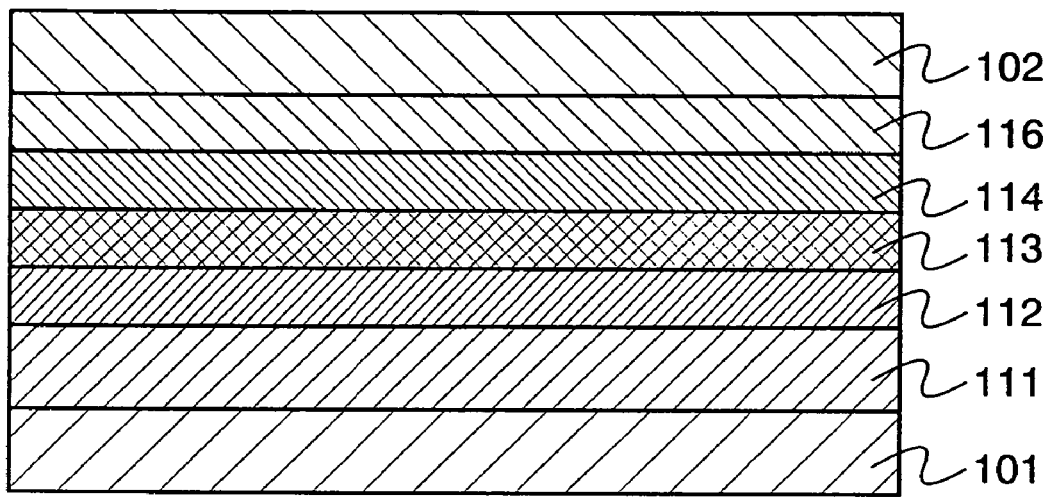
FIG. 2 is a diagram explaining one mode of a light emitting element of the present invention.

Note that the light emitting element having the hole transporting layer 112, the electron transporting layer 114, the electron injecting layer 115, and the like in addition to the mixed layer 111 and the light emitting layer 113 is shown in this embodiment mode; however, a mode of the light emitting element is not necessarily limited thereto. For example, as shown in FIG. 2, an electron generating layer 116 and the like may be provided as substitute for the electron injecting layer 115. The electron generating layer 116 generates electrons, and can be formed by mixing at least one substance of one or more of a substance having an electron transporting property and a bipolar substance, and a substance showing an electron donating property with respect to the above substance. In this case, a substance having electron mobility of $1 \times 10^{-6}$ cm$^2$/Vs or more (more preferably, $1 \times 10^{-6}$ to $1 \times 10^0$ cm$^2$/Vs) is preferably used among the substance having the electron transporting property and the bipolar substance. As the substance having the electron transporting property and the bipolar substance, the above mentioned substances can be used, respectively. Further, as the substance showing the electron donating property, at least one substance selected from the group consisting of alkali metals and alkali earth metals such as lithium (Li), calcium (Ca), sodium (Na), potassium (K), magnesium (Mg), and the like can be used. Furthermore, at least one substance selected from the group consisting of alkali metal oxides, alkali earth metal oxides, alkali metal fluorides, alkali earth metal fluorides, and the like such as lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), and the like can be used as the substance showing the electron donating property.

Figure 3:
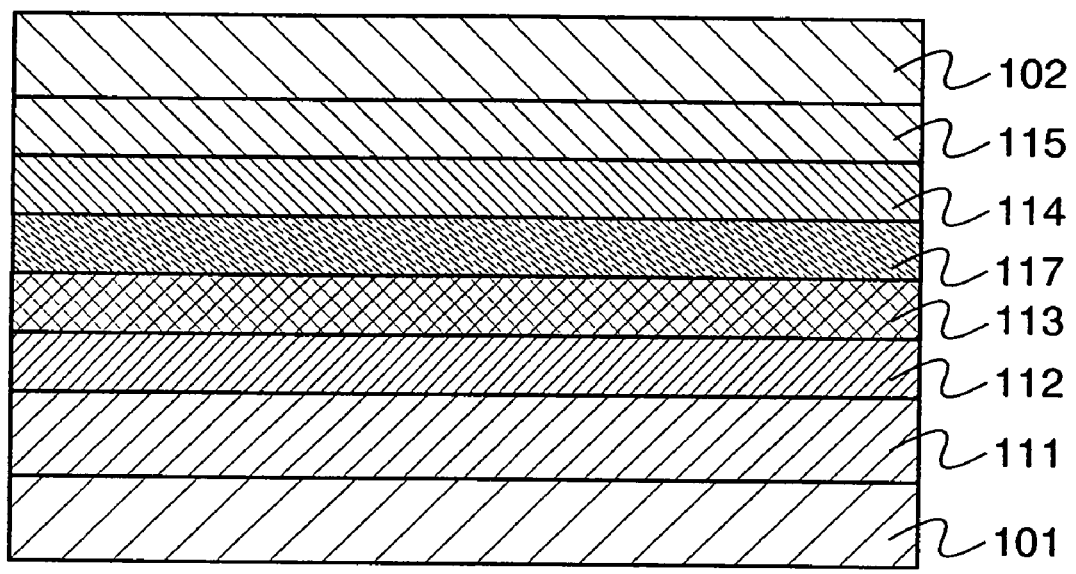
FIG. 3 is a diagram explaining one mode of a light emitting element of the present invention.

Further, as shown in FIG. 3, a hole blocking layer 117 may be provided between the light emitting layer 113 and the electron transporting layer 114. Providing the hole blocking layer 117 makes it possible to prevent holes from flowing toward the second electrode 102 through the light emitting layer 113, thereby improving recombination efficiency of carriers. In addition, excitation energy generated in the light emitting layer 113 can be prevented from transferring to other layer such as the electron transporting layer 114. The hole blocking layer 117 can be formed by selecting, in particular, a substance having larger ionization potential and larger excitation energy than that of a substance used for forming the light emitting layer 113 from among substances, which can be used for forming the electron transporting layer 114, such as BAlq, OXD-7, TAZ, and BPhen. That is, the hole blocking layer 117 may be formed by selecting a substance so that ionization potential of the hole blocking layer 117 is relatively larger than that of the electron transporting layer 114. Similarly, a layer for blocking electrons from flowing toward the second electrode 102 through the light emitting layer 113 may be provided between the light emitting layer 113 and the hole transporting layer 112.

Note that an operator of the present invention may appropriately select whether or not the electron injecting layer 115, the electron transporting layer 114, and the hole transporting layer 112 are provided. For example, in a case where a defect such as an optical quenching due to metal is not caused without providing the hole transporting layer 112, the electron transporting layer 114, and the like, or in a case where injection of electrons can be preferably performed from the electrode without providing the electron injecting layer 115, these layers are not necessarily required to be provided.

By forming the light emitting layer having the mixed layer 111 containing an aromatic hydrocarbon and a metal oxide, defects due to crystallization of a layer formed between a pair of electrodes can be reduced. More specifically, a short-circuiting between a pair of electrodes which is caused as a result of generation of concavity and convexity due to the crystallization, can be reduced as compared with a light emitting element having a layer only containing an aromatic hydrocarbon or a metal oxide. Further, since the mixed layer 111 can generate holes, by providing the mixed layer 111 containing an aromatic hydrocarbon and a metal oxide, a light emitting element having less variations in driving voltage, which is dependent on the thickness of the mixed layer 111, can be obtained. As a consequence, a distance between the light emitting layer 113 and the first electrode 101 can be easily adjusted by changing the thickness of the mixed layer 111. That is, the length of a light path through which emitted light passes (light path length), can be easily adjusted so that light emission can be efficiently extracted to an external portion or color purity of light extracted to an external portion is improved. Further, by increasing the thickness of the mixed layer 111, the concavity and convexity on the surface of the first electrode 101 can be reduced, thereby reducing short-circuiting between the pair of electrodes.

The light emitting element described above may be formed by using a method by which the second electrode 102 is formed after the mixed layer 111, the hole transporting layer 112, the light emitting layer 113, the electron transporting layer 114, the electron injecting layer 115, and the like are stacked over the first electrode 101 in this order. Alternatively, the light emitting layer may be formed by using a method by which the electron injecting layer 115, the electron transporting layer 114, the light emitting layer 113, the hole transporting layer 112, and the mixed layer 111 are stacked over the second electrode 102 in this order. In a case where the mixed layer 111 is formed after the formation of the light emitting layer 113 like the latter method, even when the first electrode 101 is formed by sputtering, the mixed layer 111 serve as a protection layer, and hence, it is possible to form a favorable light emitting element in which damage due to sputtering of a layer formed using an organic compound such as the light emitting layer 113 is not easily generated.

Embodiment Mode 2

One mode of a light emitting element of the present invention will be described with reference to FIG. 4.

Figure 4:
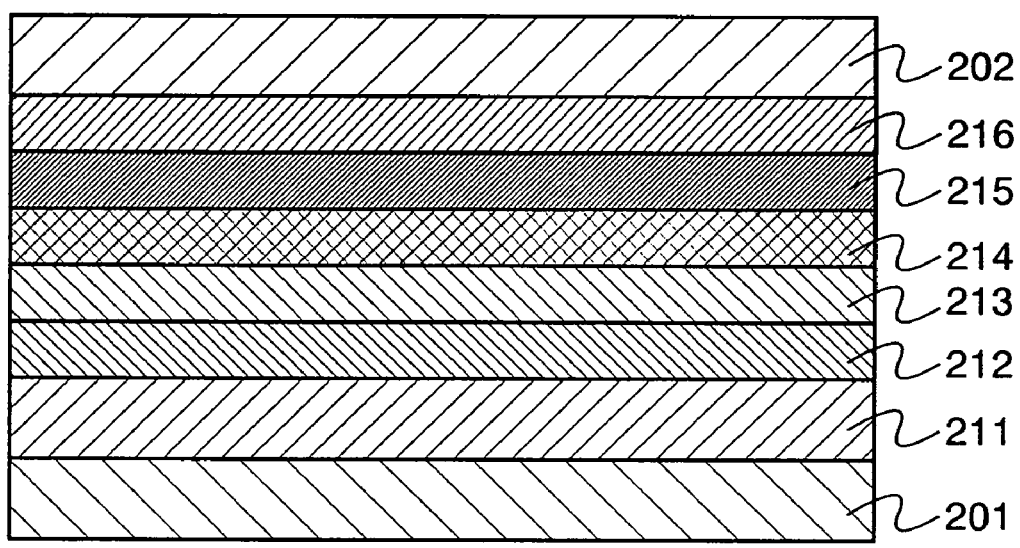
FIG. 4 is a diagram explaining one mode of a light emitting element of the present invention.

FIG. 4 shows a light emitting element having a light emitting layer 213, a first mixed layer 215, and a second mixed layer 216 between a first electrode 201 and a second electrode 202, in which the light emitting layer 213 is provided to be closer to the first electrode 201 than the first mixed layer 215 and the second mixed layer 216 is provided to be closer to the second electrode 202 than the first mixed layer 215. In this light emitting element, a hole injecting layer 211 and a hole transporting layer 212 are provided between the light emitting layer 213 and the first electrode 201, and an electron transporting layer 214 is provided between the light emitting layer 213 and the first mixed layer 215. The first mixed layer 215 contains at least one substance selected from the group consisting of an alkali metal, an alkali earth metal, an alkali metal oxide, an alkali earth metal oxide, an alkali metal fluoride, and an alkali earth metal fluoride; and a substance having an electron transporting property. The second mixed layer 216 contains an aromatic hydrocarbon and a metal oxide. The light emitting layer 213 contains a light emitting substance. When voltage is applied to each of the first electrode 201 and the second electrode 202 so that potential of the first electrode 201 is higher than that of the second electrode 202, electrons are injected to the electron transporting layer 214 from the first mixed layer 215, holes are injected to the second electrode 202 from the second mixed layer 216, and holes are injected to the hole injecting layer 211 from the first electrode 201. Further, holes injected to the light emitting layer 213 from the first electrode 201 side and electrons injected to the light emitting layer 213 from the second electrode 202 side are recombined. The light emitting substance contained in the light emitting layer 213 is excited by excitation energy generated by the recombination. The excited light emitting substance emits light upon returning to a ground state.

The first electrode 201, the second electrode 202, and each layer provided between the first electrode 201 and the second electrode 202 will be described in detail below.

The first electrode 201 is preferably formed using a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride.

The second electrode 202 is preferably formed using a substance having a low work function such as aluminum and magnesium. When a layer generating electrons is provided between the second electrode 202 and the light emitting layer 213, however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 202 may be formed by appropriately selecting either a substance having a high work function or a substance having a low work function in accordance with a characteristic of a layer provided between the second electrode 202 and the light emitting layer 213.

Note that one or both the first electrode 201 and the second electrode 202 is/are preferably formed so that one or both the electrodes can transmit light.

The hole injecting layer 211 of this embodiment mode has a function of helping injection of holes to the hole transporting layer 212 from the first electrode 201. Providing the hole injecting layer 211 makes it possible to reduce difference in ionization potential between the first electrode 201 and the hole transporting layer 212 so that holes are easily injected. The hole injecting layer 211 is preferably formed using a substance whose ionization potential is smaller than that of a substance used for forming the hole transporting layer 223 and larger than that of a substance used for forming the first electrode 201. As specific examples of substances which can be used for forming the hole injecting layer 211, a low molecular material such as phthalocyanine (abbreviation: $H_2Pc$) or copper phthalocyanine (abbreviation: CuPc), a high molecular material such as a poly(ethylenedioxythiophene)/poly(styrene sulfonate) solution (PEDOT/PSS), and the like can be given.

The hole transporting layer 212 has a function of transporting holes. In the light emitting element of this embodiment mode, the hole transporting layer 212 has a function of transporting holes to the light emitting layer 213 from the hole injecting layer 211. Providing the hole transporting layer 212 makes it possible to create a distance between the first electrode 201 and the light emitting layer 213. Consequently, it is possible to prevent quenching of light emission due to metal contained in the first electrode 201. The hole transporting layer 212 is preferably formed using a substance having a hole transporting property. In particular, the hole transporting layer 212 is preferably formed using a substance having a hole transporting property with hole mobility of $1 \times 10^{-6}$ cm$^2$/Vs or more or a bipolar substance. Further, the substance having the hole transporting property and the bipolar substance are already described in Embodiment Mode 1, and will not be further described in this embodiment mode.

The light emitting layer 213 contains a light emitting substance. The light emitting layer 213 may be formed using only a light emitting substance. When quenching due to a concentration is caused, the light emitting layer 213 is preferably a layer in which a light emitting substance is dispersed in a substance having a larger energy gap than that of the light emitting substance. By mixing the light emitting substance in the light emitting layer 213, quenching of light emission due to a concentration can be prevented. Here, an energy gap indicates an energy gap between a LUMO level and a HOMO level. The light emitting substance and the substance used for dispersing the light emitting substance are already described in Embodiment Mode 1, and will not be further described in this embodiment mode.

The electron transporting layer 214 has a function of transporting electrons. In the light emitting element of this embodiment mode, the electron transporting layer 214 has a function of transporting electrons injected from the first mixed layer 215 to the light emitting layer 213. Providing the electron transporting layer 214 makes it possible to create a distance between the second mixed layer 216 and the light emitting layer 213. Consequently, quenching of light emission due to metal contained in the second mixed layer 216 (when metal is contained in the first mixed layer 215, quenching of light emission due to the metal) can be prevented. The electron transporting layer 214 is preferably formed using a substance having an electron transporting property. In particular, the electron transporting layer is preferably formed using a substance having an electron transporting property with electron mobility of $1 \times 10^{-6}$ cm$^2$/Vs or more (more preferably, $1 \times 10^{-6}$ to $1 \times 10^0$ cm$^2$/Vs), or a bipolar substance. Further, the substance having the electron transporting property and the bipolar substance are already described in Embodiment Mode 1, and will no be further described in this embodiment mode.

The first mixed layer 215 generates electrons. The first mixed layer 215 can be formed by using a mixture of at least one substance of one or more of a substance having an electron transporting property or a bipolar substance and a substance showing an electron donating property with respect to the substance. In this case, a substance having electron mobility of $1\times10^{-6}$ cm$^2$/Vs or more (more preferably, $1\times10^{-6}$ to $1\times10^{0}$ cm$^2$/Vs) is preferably used among the substances having the electron transporting properties and the bipolar substances. Further, the substance having the electron transporting property and the bipolar substance are already described in Embodiment Mode 1, and will not be further described in this embodiment mode. Furthermore, the substance showing the electron donating property with respect to the substance having the electron transporting property and the bipolar substance is also described in Embodiment Mode 1, and will not be further described in this embodiment mode.

The second mixed layer 216 contains an aromatic hydrocarbon and a metal oxide. The aromatic hydrocarbon is not particularly limited; however, an aromatic hydrocarbon having hole mobility of $1\times10^{-6}$ cm$^2$/Vs or more is preferably used. When the aromatic hydrocarbon has hole mobility of $1\times10^{-6}$ cm$^2$/Vs or more (more preferably, $1\times10^{-6}$ to $1\times10^{0}$ cm$^2$/Vs), holes injected from the metal oxide can efficiently be transported. As such an aromatic hydrocarbon having hole mobility of $1\times10^{-6}$ cm$^2$/Vs or more, for example, 2-tert-butyl-9,10-di(2-naphthyl)anthracene (abbreviation: t-BuDNA); anthracene; 9,10-diphenylanthracene; tetracene; rubrene; perylene; 2,5,8,11-tetra(tert-butyl)perylene; and the like can be given. In addition, pentacene, coronene, and the like can also be used. An aromatic hydrocarbon having hole mobility of $1\times10^{-6}$ cm$^2$/Vs or more and 14 to 42 carbon atoms such as listed aromatic hydrocarbons is preferably used. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. In addition, metal oxides such as titanium oxide, chromium oxide, zirconium oxide, hafnium oxide, tantalum oxide, tungsten oxide, or silver oxide can also be used. By mixing the metal oxide and the aromatic hydrocarbon as mentioned above, charge-transfer can be generated. The second mixed layer 216 containing a metal oxide and an aromatic hydrocarbon shows extremely less variations in absorbance, which is dependent on an absorption wavelength in a visible light region which is a region of 450 to 650 nm (i.e., less variations in transmittance in a visible light region), and therefore, the amount of light emission loss caused by absorption of light emission in the second mixed layer 216 is less dependent on a light emission wavelength. Therefore, providing the second mixed layer 216 makes it possible to prevent light extraction efficiency from varying for each color (i.e., for each wavelength) of light emission. The metal oxide is preferably contained in the second mixed layer 216 so that a mass ratio of the metal oxide with respect to the aromatic hydrocarbon (=metal oxide/aromatic hydrocarbon) is 0.5 to 2 or a molar ratio thereof is 1 to 4. Further, aromatic hydrocarbons have generally a property of being easily crystallized; however, when an aromatic hydrocarbon is mixed with a metal oxide like this embodiment mode, the aromatic hydrocarbon is not easily crystallized. Furthermore, molybdenum oxide is particularly crystallized easily among metal oxides; however, when molybdenum oxide is mixed with an aromatic hydrocarbon like this embodiment mode, the molybdenum oxide is not easily crystallized. By mixing the aromatic hydrocarbon and the metal oxide in this manner, the aromatic hydrocarbon and the metal oxide mutually hinder crystallization, in consequence, a layer which is not easily crystallized can be obtained.

Figure 5:
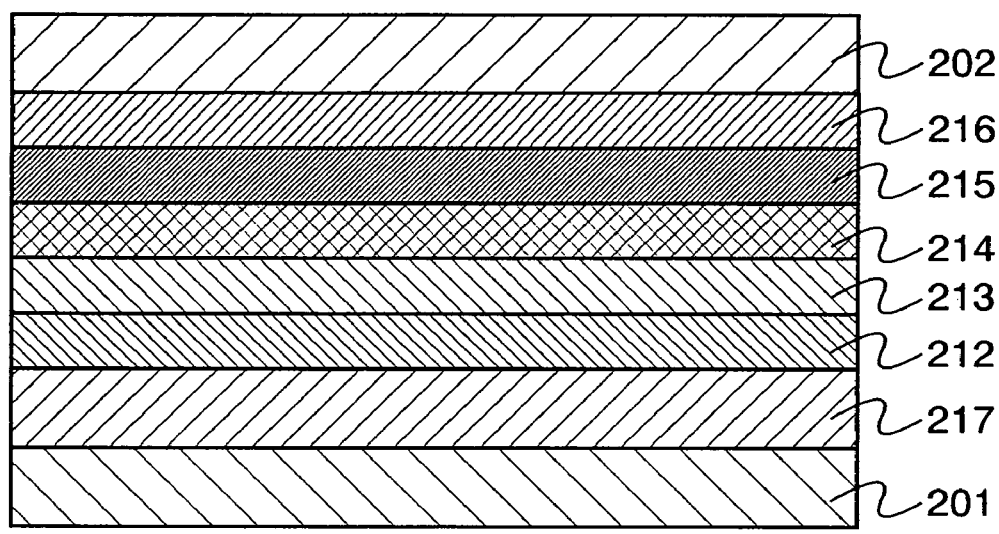
FIG. 5 is a diagram explaining one mode of a light emitting element of the present invention.
Figure 6:
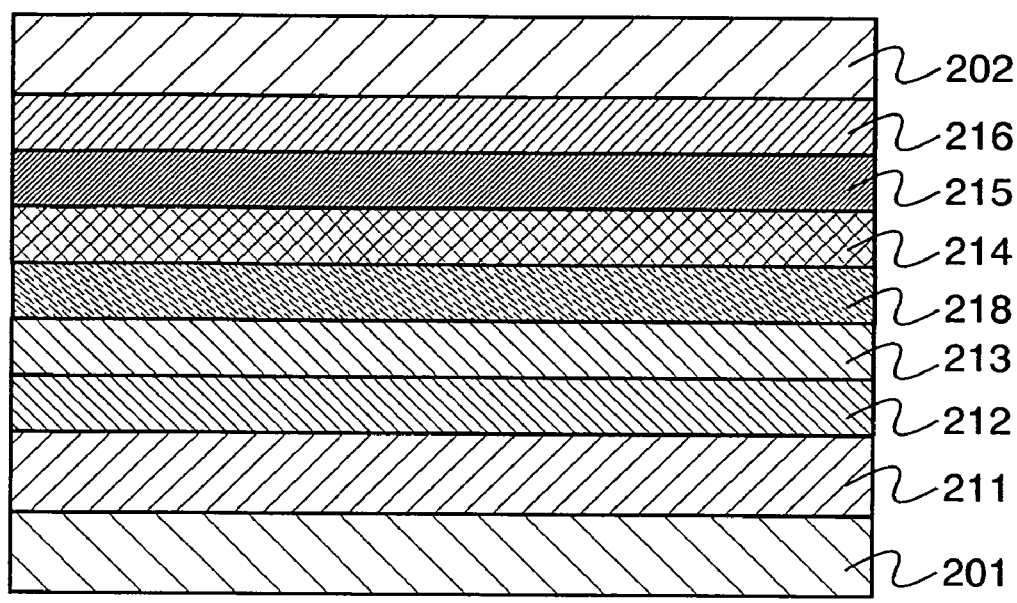
FIG. 6 is a diagram explaining one mode of a light emitting element of the present invention.

Note that the light emitting element having the hole injecting layer 211, the hole transporting layer 212, the electron transporting layer 114, and the like in addition to the light emitting layer 213, the first mixed layer 215, and the second mixed layer 216 is shown in this embodiment mode; however, a mode of the light emitting element is not necessarily limited thereto. For example, as shown in FIG. 5, a layer 217 containing an aromatic hydrocarbon and a metal oxide, which is much the same as the first mixed layer 215, or the like may be provided as substitute for the hole injecting layer 211. Providing the layer 217 containing an aromatic hydrocarbon and a metal oxide makes it possible to operate the light emitting element favorably even when the first electrode 201 is formed using a substance having a low work function such as aluminum and magnesium. Further, as shown in FIG. 6, a hole blocking layer 218 may be provided between the electron transporting layer 214 and the light emitting layer 213. The hole blocking layer 218 is the same as the hole blocking layer 117 described in Embodiment Mode 1, and will not be further described in this embodiment mode.

Note that an operator of the present invention may appropriately select whether or not the hole injecting layer 211, the hole transporting layer 212, and the electron transporting layer 214 are provided. For example, in a case where a defect such as light quenching due to metal is not caused without providing the hole transporting layer 212, the electron transporting layer 214, and the like, or in a case where injection of holes can be preferably performed from the electrode without providing the hole injecting layer 211, these layers are not necessarily required to be provided.

By forming the light emitting element having the second mixed layer 216 containing an aromatic hydrocarbon and a metal oxide, defects due to crystallization of a layer between a pair of electrodes can be reduced. More specifically, a short-circuiting which is caused as a result of generation of concavity and convexity due to the crystallization, can be reduced as compared with a light emitting element having a layer only containing an aromatic hydrocarbon or a metal oxide. Further, since the second mixed layer 216 can generate holes, by providing the second mixed layer 216 containing an aromatic hydrocarbon and a metal oxide, a light emitting element having less variations in driving voltage, which is dependent on the thickness of the second mixed layer 216, can be obtained. As a consequence, a distance between the light emitting layer 213 and the second electrode 202 can be easily adjusted by changing the thickness of the second mixed layer 216. That is, the length of a light path through which emitted light passes (light path length), can be easily adjusted so that light emission can be efficiently extracted to an external portion or color purity of light emission extracted to an external portion is improved. Further, by increasing the thickness of the second mixed layer 216, the concavity and convexity on the surface of the second electrode 202 can be reduced, thereby reducing short-circuiting between the pair of electrodes.

When the layer containing an aromatic hydrocarbon and a metal oxide is also provided at the side of the first electrode 201 in place of the hole injecting layer 211, a distance between the first electrode 201 and the light emitting layer 213 can be easily adjusted. Moreover, concavity and convexity generated on the surface of the first electrode 201 can be reduced, making it possible to reduce short-circuiting between the pair of electrodes.

The light emitting element described above may be formed by using a method by which the first electrode 201 is first formed, and after forming respective layers such as the light emitting layer 213, the second electrode 202 is formed. Alternatively, the light emitting layer may be formed by using a method by which the second electrode 202 is first formed, and after forming respective layers such as the light emitting layer 213, the first electrode 201 is formed. In each method, by forming a layer containing an aromatic hydrocarbon and a metal oxide after the formation of the light emitting layer 213, even when the electrode (either the first electrode 201 or the second electrode 202) is formed by sputtering, the layer containing an aromatic hydrocarbon and a metal oxide serves as a protection layer. Therefore, it is possible to form a favorable light emitting element, in which damage due to sputtering of a layer formed using an organic compound such as the light emitting layer 213 is not easily generated.

Embodiment Mode 3

Figure 7:
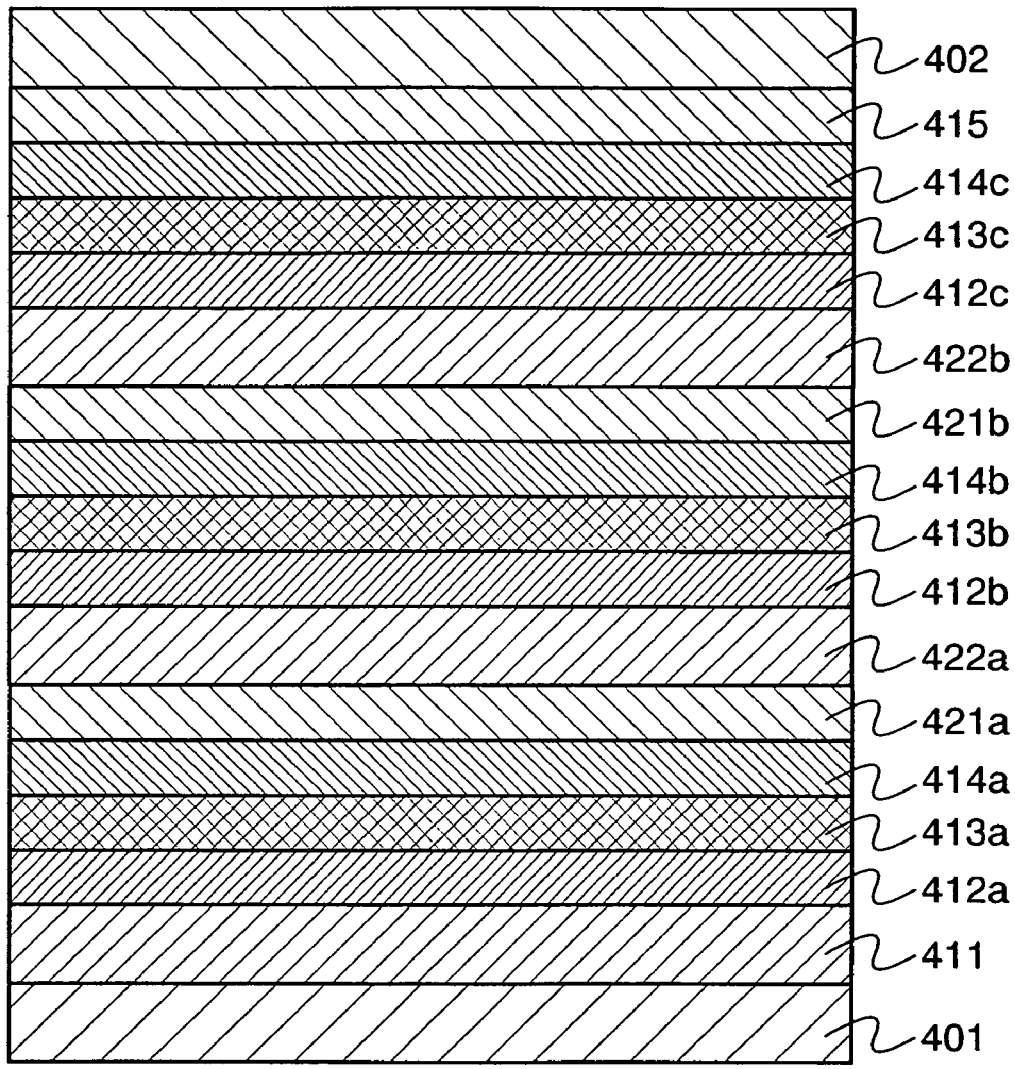
FIG. 7 is a diagram explaining one mode of a light emitting element of the present invention.

One mode of a light emitting element of the present invention will be described with reference to FIG. 7. FIG. 7 shows a light emitting element having a plurality of light emitting layers, i.e., a first light emitting layer 413a, a second light emitting layer 413b, and a third light emitting layer 413c between a first electrode 401 and a second electrode 402. This light emitting element has a first mixed layer 421a and a second mixed layer 422a between the first light emitting layer 413a and the second light emitting layer 413b, and a first mixed layer 421b and a second mixed layer 422b between the second light emitting layer 413b and the third light emitting layer 413c. Each of the first mixed layers 421a and 421b contains at least one substance selected from the group consisting of an alkali metal, an alkali earth metal, an alkali metal oxide, an alkali earth metal oxide, an alkali metal fluoride, and alkali earth metal fluoride; and a substance having an electron transporting property. The second mixed layers 422a and 422b each contain an aromatic hydrocarbon and a metal oxide. Further, the first mixed layer 421a is provided to be closer to the first electrode 401 than the second mixed layer 422a, whereas the first mixed layer 421b is provided to be closer to the first electrode 401 than the second mixed layer 422b. A hole transporting layer 412a is provided between the first electrode 401 and the first light emitting layer 413a, a hole transporting layer 412b is provided between the second mixed layer 422a and the second light emitting layer 413b, and a hole transporting layer 412c is provide between the second mixed layer 422b and the third light emitting layer 413c. Further, an electron transporting layer 414a is provided between the first light emitting layer 413a and the first mixed layer 421a, an electron transporting layer 414b is provided between the second light emitting layer 413b and the first mixed layer 421b, and an electron transporting layer 414c is provided between the third light emitting layer 413c and the second electrode 402. Furthermore, a hole injecting layer 411 is provided between the first electrode 401 and the hole transporting layer 412a, and an electron injecting layer 415 is provided between the second electrode 402 and the electron transporting layer 414c. Each of the first light emitting layer 413a, the second light emitting layer 413b, and the third light emitting layer 413c contains a light emitting substance. When voltage is applied to each of the first electrode 401 and the second electrode 402 so that potential of the first electrode 401 is higher than that of the second electrode 402, holes and electrons are recombined in each of the light emitting layers, and the light emitting substance contained in each of the light emitting layers is excited. The excited light emitting substance emits light upon returning to a ground state. Further, the light emitting substances contained in each of the light emitting layers may be the same or different from one another.

The first electrode 401 is preferably formed using a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride. Note that when a layer containing an aromatic hydrocarbon and a metal oxide is provided as substitute for the hole injecting layer 411, the first electrode 401 can be formed by using a substance having a low work function such as aluminum and magnesium.

The second electrode 402 is preferably formed using a substance having a low work function such as aluminum and magnesium. When a layer generating electrons is provided between the second electrode 402 and the third light emitting layer 413c; however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 402 may be formed by appropriately selecting either a substance having a high work function or a substance having a low work function in accordance with a characteristic of a layer provided between the second electrode 402 and the third light emitting layer 413c.

In the light emitting element of this embodiment mode, the first mixed layers 421a and 421b are much the same as the first mixed layer 215 described in Embodiment Mode 2. Further, the second mixed layers 422a and 422b are much the same as the second mixed layer 216 described in Embodiment Mode 2. Furthermore, the first light emitting layer 413a, the second light emitting layer 413b, and the third light emitting layer 413c are much the same as the light emitting layer 213 described in Embodiment Mode 2. Moreover, the hole injecting layer 411, the hole transporting layers 412a, 412b, and 412c, the electron transporting layers 414a, 414b, and 414c, and the electron injecting layer 415 are also much the same as the respective layers denoted by the same names in Embodiment Mode 1 or 2.

By forming the light emitting element having the second mixed layers 422a and 422b each containing an aromatic hydrocarbon and a metal oxide as described above, defects due to crystallization of a layer between the pair of electrodes can be reduced. More specifically, a short-circuiting which is caused as a result of generation of concavity and convexity due to the crystallization can be reduced as compared with a light emitting element having a layer only containing an aromatic hydrocarbon or a metal oxide. Further, by providing the second mixed layers 422a and 422b each containing an aromatic hydrocarbon and a metal oxide, it is possible to obtain a light emitting element in which damage due to sputtering of a layer formed using an organic compound such as a light emitting layer is not easily generated as compared with a light emitting element having a structure in which a layer formed by sputtering like a layer made from indium tin oxide is provided between respective light emitting layers.

Embodiment Mode 4

One mode of a light emitting element of the present invention will be described with reference to FIG. 8.

Figure 8:
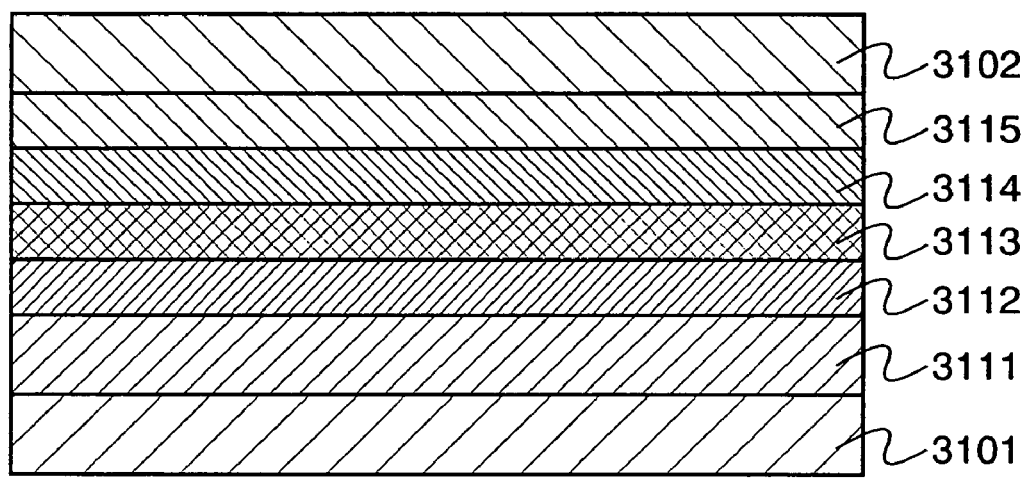
FIG. 8 is a diagram explaining one mode of a light emitting element of the present invention.

FIG. 8 shows a light emitting element having a light emitting layer 3113 between a first electrode 3101 and a second electrode 3102. In the light emitting element shown in FIG. 8, a mixed layer 3111 is provided between the light emitting layer 3113 and the first electrode 3101. Further, a hole transporting layer 3112 is provided between the light emitting layer 3113 and the mixed layer 3111, and an electron transporting layer 3114 and an electron injecting layer 3115 are provided between the light emitting layer 3113 and the second electrode 3102. In this light emitting element, when voltage is applied to both the first electrode 3101 and the second electrode 3102 so that potential of the first electrode 3101 is higher than that of the second electrode 3102, holes are injected to the light emitting layer 3113 from the first electrode 3101 side whereas electrons are injected to the light emitting layer 3113 from the second electrode 3102 side. Then, the holes and electrons injected to the light emitting layer 3113 are recombined. A light emitting substance is contained in the light emitting layer 3113, and the light emitting substance is excited by excitation energy generated by the recombination. The light emitting substance in the excited state emits light upon returning to a ground state.

The first electrode 3101, the second electrode 3102, and each layer provided between the first electrode 3101 and the second electrode 3102 will be described in detail below.

A substance used for forming the first electrode 3101 is not particularly limited. A substance having a low work function such as aluminum and magnesium can be used in addition to a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride. This is because holes are generated from the mixed layer 3111 when applying voltage to the light emitting element of the present invention.

The second electrode 3102 is preferably formed using a substance having a low work function such as aluminum and magnesium. When a layer generating electrons is provided between the second electrode 3102 and the light emitting layer 3113, however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 3102 may be formed by appropriately selecting either a substance having a high work function or a substance having a low work function in accordance with a characteristic of a layer provided between the second electrode 3102 and the light emitting layer 3113.

Note that one or both the first electrode 3101 and the second electrode 3102 is/are preferably formed so that one or both of the electrodes can transmit light.

The mixed layer 3111 contains an aromatic hydrocarbon and a metal oxide. The aromatic hydrocarbon is not particularly limited; however, an aromatic hydrocarbon having hole mobility of $1\times10^{-6}$ cm$^2$/Vs or more (more preferably, $1\times10^{-6}$ to $1\times10^{0}$ cm$^2$/Vs) is preferably used. As such an aromatic hydrocarbon having a favorable hole transporting property, which can be used for forming the mixed layer 3111, for example, aromatic hydrocarbons having 14 to 60 carbon atoms and containing an anthracene skeleton such as 2-tert-butyl-9,10-di(2-naphthyl) anthracene (abbreviation: t-Bu DNA); 9,10-di(naphthalen-1-yl)-2-tert-butylanthracene; anthracene; 9,10-diphenylanthracene (abbreviation: DPAnth); 9,10-bis(3,5-diphenylphenyl)anthracene (abbreviation: DPPA); 9,10-di(naphthalen-2-yl)anthracene (abbreviation: DNA); 2-tert-butylanthracene (abbreviation: t-BuAnth); 9,10-di(4-methylnaphthalen-1-yl)anthracene (abbreviation: DMNA); 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene bianthryl; 10,10'-di(2-phenylphenyl)-9,9'-bianthryl; 10,10'-bis[(2,3,4,5,6-pentaphenyl)phenyl]-9-9'-bianthryl; and 9,10-di(4-phenylphenyl)-2-tert-butylanthracene (abbreviation: t-BuDBA), can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. When using the aromatic hydrocarbon having 26 to 60 carbon atoms, a heat resistance property of the mixed layer is improved. In particular, when using the aromatic hydrocarbon having 34 to 60 carbon atoms, the mixed layer 3111 showing an extremely favorable heat resistance property can be obtained. Improvement of the heat resistance property of the mixed layer 3111 is extremely effective in manufacturing a light emitting element in which deterioration in electric characteristics due to Joule heat generated by current, such as increase in resistance is inhibited. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. In addition, metal oxides such as titanium oxide, chromium oxide, zirconium oxide, hafnium oxide, tantalum oxide, tungsten oxide, or silver oxide can also be used. By mixing a metal oxide and an aromatic hydrocarbon as mentioned above, charge-transfer can be generated so that a charge-transfer complex can be generated. The mixed layer 3111 in which a charge-transfer complex is generated contains unpaired electrons. The mixed layer 3111 in which a charge-transfer complex is generated contains unpaired electrons. Further, as compared with a mixed film in which divanadium pentoxide and (-NPD are mixed disclosed in a related art as described above (Japanese Patent Application Laid-Open No. 2005-123095) and a mixed film in which dirhenium heptaoxide and (-NPD are mixed, the mixed layer 3111 containing a metal oxide and an aromatic hydrocarbon shows less variations in absorbance, which is dependent on an absorption wavelength in a visible light region which is a region of 450 to 650 nm (i.e., less variations in transmittance in a visible light region), and therefore, the amount of light emission loss caused by absorption of light emission in the mixed layer 3111 is less dependent on a light emission wavelength. Therefore, providing the mixed layer 3111 makes it possible to prevent light extraction efficiency from varying for each color (i.e., for each wavelength) of light emission. The metal oxide is preferably contained in the mixed layer 3111 so that a mass ratio of the metal oxide with respect to the aromatic hydrocarbon (=metal oxide/aromatic hydrocarbon) is 0.5 to 2 or a molar ratio thereof is 1 to 4. When the mixed layer 3111 contains a metal oxide and an aromatic hydrocarbon with such a mixture ratio, the transmittance of light in a spectrum of 450 to 650 nm of the mixed layer 3111 can be set to be 80% or more, and specifically, 80 to 100%. Such the transmittance allows a light emitting element to extract light emission more efficiently. Further, aromatic hydrocarbons have generally a property of being easily crystallized; however, when an aromatic hydrocarbon is mixed with a metal oxide like this embodiment mode, the aromatic hydrocarbon is not easily crystallized. Furthermore, molybdenum oxide is particularly crystallized easily among metal oxides; however, when molybdenum oxide is mixed with an aromatic hydrocarbon like this embodiment mode, the molybdenum oxide is not easily crystallized. By mixing an aromatic hydrocarbon and a metal oxide in this manner, the aromatic hydrocarbon and the metal oxide mutually hinder crystallization, making it possible to form a layer which is not easily crystallized. Moreover, since aromatic hydrocarbons have a high glass transition temperature, when the mixed layer 3111 containing an aromatic hydrocarbon is applied as a mixed layer like this embodiment mode, a mixed layer having an excellent heat resistance property along with a function of favorably injecting holes also to the hole transporting layer 3112 can be obtained as compared with a hole injecting layer formed using 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); or the like.

The hole transporting layer 3112 has a function of transporting holes. In the light emitting element of this embodiment mode, the hole transporting layer 3112 has a function of transporting holes to the light emitting layer 3113 from the mixed layer 3111. Providing the hole transporting layer 3112 makes it possible to create a distance between the mixed layer 3111 and the light emitting layer 3113. Consequently, it is possible to prevent quenching of light emission due to metal contained in the mixed layer 3111. The hole transporting layer 3112 is preferably formed using a substance having a hole transporting property. In particular, the hole transporting layer 3112 is preferably formed using a substance having a hole transporting property with hole mobility of $1\times10^{-6}$ cm$^2$/Vs or more (more preferably, $1\times10^{-6}$ to $1\times10^{0}$ cm$^2$/Vs), or a bipolar substance. Further, the substance having the hole transporting property is a substance having higher hole mobility than electron mobility, and corresponds to a substance in which a ratio of hole mobility to electron mobility (i.e., hole mobility/electron mobility) is larger than 100. As specific examples of the substance having the hole transporting property, 4,4'-bis[N-(1-naphthyl)-N-phenylamino]biphenyl (abbreviation: NPB); 4,4'-bis[N-(3-methylphenyl)-N-phenylamino]biphenyl (abbreviation: TPD); 1,3,5-tris[N,N-di(m-tolyl)amino]benzene (abbreviation: m-MTDAB); 4,4',4''-tris(N-carbazolyl)triphenylamine (abbreviation: TCTA); and the like can be given. Further, the bipolar substance is a substance in which a ratio of mobility of one carrier to mobility of the other carrier is 100 or less, and preferably, 10 or less. As the bipolar substance, for example, 2,3-bis(4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like can be given. Among bipolar substances, in particular, a bipolar substance having mobility of holes and electrons of $1\times10^{-6}$ cm$^2$/Vs or more (more preferably, $1\times10^{-6}$ to $1\times10^{0}$ cm$^2$/Vs) is preferably used.

The light emitting layer 3113 contains a light emitting substance. The light emitting substance is a substance having favorable light emitting efficiency which can emit light with a desired wavelength. The light emitting layer 3113 may be formed using only a light emitting substance. When quenching due to a concentration is caused, the light emitting layer 3113 is preferably a layer in which a light emitting substance is dispersed in a substance having a larger energy gap than that of the light emitting substance. By mixing the light emitting substance in the light emitting layer 3113, quenching of light emission due to a concentration can be prevented. Here, an energy gap indicates an energy gap between a LUMO level and a HOMO level.

The light emitting substance is not particularly limited, and a substance with favorable light emitting efficiency, which can emit light with a desired light emission wavelength, may be used. For example, in order to obtain red light emission, for example, the following substances showing emission spectrum with peaks in a spectrum of 600 to 680 nm can be employed: 4-dicyanomethylene-2-isopropyl-6-[2-(1,1,7,7-tetramethyl-9-julolidyl)ethenyl]-4H-pyran (abbreviation: DCJTI) 4-dicyanomethylen-2-isopropyl-6-[2-(1,1,7,7-tetramethyl-9-julolidyl)ethenyl]-4H-pyran (abbreviation: DCJTI); 4-dicyanomethylene-2-methyl-6-[2-(1,1,7,7-tetramethyl-9-julolidyl)ethenyl]-4H-pyran (abbreviation: DCJT); 4-dicyanomethylene-2-tert-butyl-6-[2-(1,1,7,7-tetramethyl-9-julolidyl)ethenyl]-4H-pyran (abbreviation: DCJTB); periflanthene; 2,5-dicyano-1,4-bis[2-(10-methoxy-1,1,7,7-tetramethyl-9-julolidyl)ethenyl]benzene; and the like. In order to obtain green light emission, substances showing emission spectrum with peaks in a spectrum of 500 to 550 nm such as N,N'-dimethylquinacridon (abbreviation: DMQd), coumarin 6, coumarin 545T, and tris(8-quinolinolato)aluminum (abbreviation: Alq$_3$) can be employed. In order to obtain blue light emission, the following substances showing emission spectrum with peaks in a spectrum of 420 to 500 nm can be employed: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolato)-4-phenylphenolato-gallium (abbreviation: BGaq); bis(2-methyl-8-quinolinolato)-4-phenylphenolato-aluminum (abbreviation: BAlq); and the like. In addition to the above mentioned substances, which emit fluorescence, the following substances, which emit phosphorescence, can be used as the light emitting substance: bis[2-(3,5-bis(trifluoromethyl)phenyl)pyridinato-N,C$^{2'}$]iridium(III)picolinato (abbreviation: Ir(CF$_3$ppy)$_2$(pic)); bis[2-(4,6-difluorophenyl)pyridinato-N, C$^{2'}$]iridium(III)acetylacetonato (abbreviation: Flr(acac)); bis[2-(4,6-difluorophenyl)pyridinato-N,C$^{2'}$)iridium(III)picolinato (abbreviation: Flr(pic)); tris(2-phenylpyridinato-N,C$^{2'}$]iridium (abbreviation: Ir(ppy)$_3$); and the like.

A substance used for dispersing a light emitting substance, which is contained in the light emitting layer 3113 along with the light emitting substance (also referred to as a host) is not particularly limited, and may be appropriately selected in consideration for an energy gap and the like of a substance used for the light emitting substance. For example, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a quinoxaline derivative such as 2,3-bis(4-diphenylaminophenyl)quinoxaline (abbreviation: TPAQn), and 2,3-bis{4-[N-(1-naphthyl)-N-phenylamino]phenyl}-dibenzo[f,h]quinoxaline (abbreviation: NPADiBzQn); a metal complex such as bis[2-(2-hydroxyphenyl)pyridinato]zinc (abbreviation: Znpp$_2$), and bis[2-(2-hydroxyphenyl)benzoxazolato]zinc (abbreviation: ZnBOX); and the like can be used. Note that a light emitting substance is generally referred to as a guest with respect to the host.

The electron transporting layer 3114 has a function of transporting electrons. In the light emitting element of this embodiment mode, the electron transporting layer 3114 has a function of transporting electrons injected from the second electrode 3102 side to the light emitting layer 3113. Providing the electron transporting layer 3114 makes it possible to create a distance between the second electrode 3102 and the light emitting layer 3113. Consequently, quenching of light emission due to metal contained in the second electrode 3102 can be prevented. The electron transporting layer is preferably formed using a substance having an electron transporting property. In particular, the electron transporting layer is preferably formed using a substance having an electron transporting property with electron mobility of $1\times10^{-6}$ cm$^2$/Vs or more (more preferably, $1\times10^{-6}$ to $1\times10^{0}$ cm$^2$/Vs), or a bipolar substance. Further, the substance having the electron transporting property is a substance having higher electron mobility than hole mobility, and corresponds to a substance in which a ratio of electron mobility to hole mobility (i.e., electron mobility/hole mobility) is larger than 100. As specific examples of the substance having the electron transporting property, a metal complex such as tris(8-quinolinolato)aluminum (abbreviation: Alq$_3$), tris(4-methyl-8-quinolinolato) aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)benzoxazolato]zinc (abbreviation: Zn(BOX)$_2$), and bis[2-(2-hydroxyphenyl)benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); TAZ; p-EtTAZ; BPhen; BCP; 4,4'-bis(5-methylbenzoxazolyl-2-yl)stilbene (abbreviation: BzOS); and the like can be given. Further, the bipolar substance is the same as described above. Note that the electron transporting layer 3114 and the hole transporting layer 3112 may be formed using the same bipolar substance.

The electron injecting layer 3115 has a function of helping injection of electrons to the electron transporting layer 3114 from the second electrode 3102. By providing the electron injecting layer 3115, difference in electron affinity between the second electrode 3102 and the electron transporting layer 3114 can be reduced, thereby injecting electrons easily. The electron injecting layer 3115 is preferably formed using a substance whose electron affinity is larger than that of a substance of the electron transporting layer 3114 and smaller than that of a substance of the second electrode 3102, or a substance whose energy band is curved when it is provided as a thin film with a thickness of about 1 to 2 nm between the electron transporting layer 3114 and the second electrode 3102. As specific examples of substances, which can be used for forming the electron injecting layer 3115, the following inorganic materials can be given: alkali metals such as lithium (Li), and the like; alkali earth metals such as magnesium (Mg), and the like; alkali metal fluorides such as cesium fluoride (CsF), and the like; alkali earth metal fluorides such as calcium fluoride (CaF$_2$), and the like; alkali metal oxides such as lithium oxide (Li$_2$O), sodium oxide (Na$_2$O), potassium oxide (K$_2$O), and the like; alkali earth metal oxides such as calcium oxide (CaO), magnesium oxide (MgO), and the like. When these substances are formed as thin films, their energy bands can be curved and the injection of electrons can be carried out easily, and therefore, these substances are preferable. In addition to the inorganic materials, organic materials, which can be used for forming the electron transporting layer 3114 such as bathophenanthroline (abbreviation: BPhen), bathocuproin (abbreviation: BCP), 3-(4-tert-butylphenyl)-4-(4-ethylphenyl)-5-(4-biphenylyl)-1,2,4-triazole (abbreviation: p-EtTAZ), and 3-(4-tert-butylphenyl)-4-phenyl-5-(4-biphenylyl)-1,2,4-triazole (abbreviation: TAZ), can be used to form the electron injecting layer 3115 by selecting a substance having higher electron affinity than that of a substance used for forming the electron transporting layer 3114 from among them. That is, the electron injecting layer 3115 can be formed by selecting a substance having electron affinity which is relatively higher than that of the electron transporting layer 3114 from substances having electron transporting properties. Further, in a case of providing the electron injecting layer 3115, the second electrode 3102 is preferably formed using a substance having a low work function such as aluminum.

In the light emitting element as described above, a substance having an electron transporting property used for the electron transporting layer 3114 and an aromatic hydrocarbon contained in the mixed layer 3111 are respectively selected so that when mobility of the substance having the electron transporting property used for the electron transporting layer 3114 is compared with mobility of the aromatic hydrocarbon contained in the mixed layer 3111, a mobility ratio of one of the substance having the electron transporting property and the aromatic hydrocarbon to the other is preferably set to be 1,000 or less. By selecting the respective substances, recombination efficiency in the light emitting layer can be improved.

Figure 9:
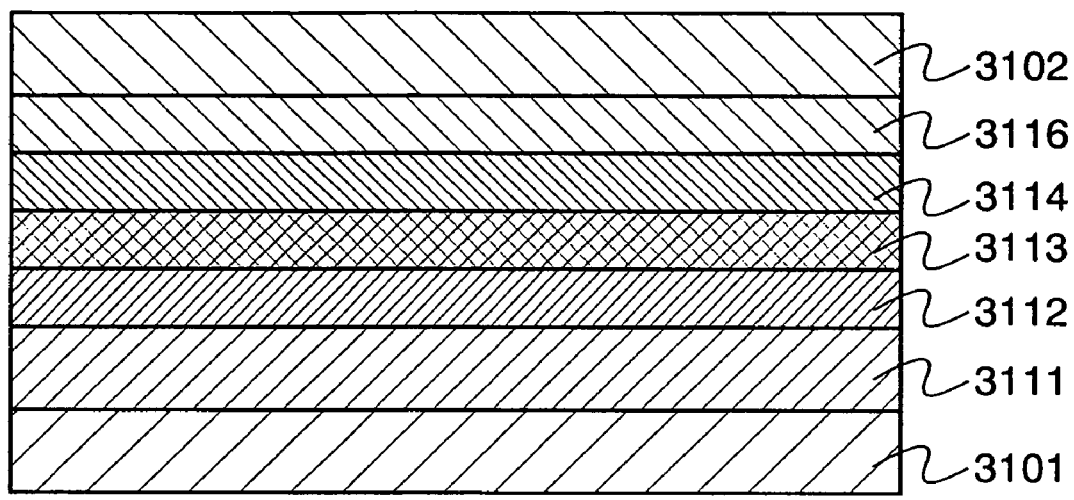
FIG. 9 is a diagram explaining one mode of a light emitting element of the present invention.

Note that the light emitting element having the hole transporting layer 3112, the electron transporting layer 3114, the electron injecting layer 3115, and the like in addition to the mixed layer 3111 and the light emitting layer 3113 is shown in this embodiment mode; however, a mode of the light emitting element is not necessarily limited thereto. For example, as shown in FIG. 9, an electron generating layer 3116 and the like may be provided as substitute for the electron injecting layer 3115. The electron generating layer 3116 generates electrons, and can be formed by mixing at least one substance of one or more of a substance having an electron transporting property or a bipolar substance and a substance showing an electron donating property with respect to the above substance. In this case, a substance having electron mobility of 1×10$^{-6}$ cm$^2$/Vs or more (more preferably, 1×10$^{-6}$ to 1×10$^0$ cm$^2$/Vs) is preferably used among the substances having the electron transporting properties and the bipolar substances. As the substance having the electron transporting property and the bipolar substance, the above mentioned substances can be used, respectively. Further, as the substance showing the electron donating property, at least one substance of selected from the group consisting of alkali metals and alkali earth metals, such as lithium (Li), calcium (Ca), sodium (Na), potassium (K), magnesium (Mg), and the like can be used. Furthermore, at least one substance selected from the group consisting of alkali metal oxides, alkali earth metal oxides, alkali metal fluorides, alkali earth metal fluorides, and the like such as lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), and the like can be used as the substance showing the electron donating property.

Figure 10:
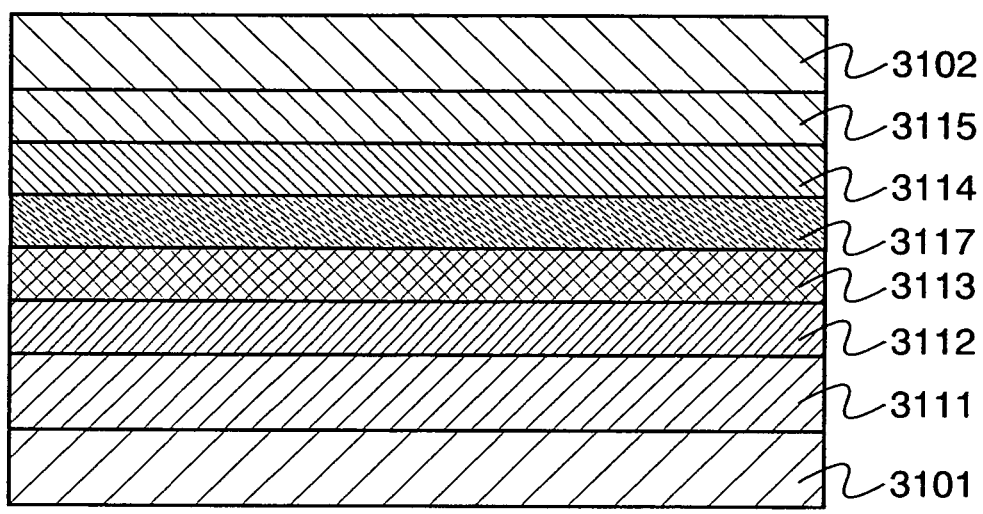
FIG. 10 is a diagram explaining one mode of a light emitting element of the present invention.

Further, as shown in FIG. 10, a hole blocking layer 3117 may be provided between the light emitting layer 3113 and the electron transporting layer 3114. Providing the hole blocking layer 3117 makes it possible to prevent holes from flowing toward the second electrode 3102 through the light emitting layer 3113, thereby improving recombination efficiency of carriers. In addition, excitation energy generated in the light emitting layer 3113 can be prevented from transferring to other layer such as the electron transporting layer 3114. The hole blocking layer 3117 can be formed by selecting, in particular, a substance having larger ionization potential and larger excitation energy than those of a substance used for forming the light emitting layer 3113 from among substances, which can be used for forming the electron transporting layer 3114, such as BAlq, OXD-7, TAZ, or BPhen. That is, the hole blocking layer 3117 may be formed by selecting a substance so that ionization potential of the hole blocking layer 3117 is relatively larger than that of the electron transporting layer 3114. Similarly, a layer for blocking electrons from flowing toward the second electrode 3102 through the light emitting layer 3113 may be provided between the light emitting layer 3113 and the hole transporting layer 3112.

Note that an operator of the present invention may appropriately select whether or not the electron injecting layer 3115, the electron transporting layer 3114, and the hole transporting layer 3112 are provided. For example, in a case where a defect such as an optical quenching due to metal is not caused without providing the hole transporting layer 3112, the electron transporting layer 3114, and the like, or in a case where injection of electrons can be preferably performed from the electrode without providing the electron injecting layer 3115, these layers are not necessarily required to be provided.

By forming the light emitting layer having the mixed layer 3111 containing an aromatic hydrocarbon and a metal oxide, a defect due to crystallization of a layer between a pair of electrodes can be reduced. More specifically, a short-circuiting which is caused as a result of generation of concavity and convexity due to the crystallization, can be reduced as compared with a light emitting element having a layer only containing an aromatic hydrocarbon or a metal oxide. Further, since the mixed layer 3111 can generate holes, by providing the mixed layer 3111 containing an aromatic hydrocarbon and a metal oxide, a light emitting element having less variations in driving voltage, which is dependent on the thickness of the mixed layer 3111, can be obtained. As a consequence, a distance between the light emitting layer 3113 and the first electrode 3101 can be easily adjusted by changing the thickness of the mixed layer 3111. That is, the length of a light path through which emitted light passes (light path length), can be easily adjusted so that light emission can be efficiently extracted to an external portion or color purity of light extracted to an external portion is improved. Further, by increasing the thickness of the mixed layer 3111, the concavity and convexity over the surface of the first electrode 3101 can be reduced, thereby reducing short-circuiting between the pair of electrodes.

The light emitting element described above may be formed by using a method by which the mixed layer 3111, the hole transporting layer 3112, the light emitting layer 3113, the electron transporting layer 3114, the electron injecting layer 3115, and the like are stacked over the first electrode 3101 in this order. Alternatively, the light emitting layer may be formed by using a method by which the electron injecting layer 3115, the electron transporting layer 3114, the light emitting layer 3113, the hole transporting layer 3112, and the mixed layer 3111 are stacked over the second electrode 3102 in this order. In a case where the mixed layer 3111 is formed after the formation of the light emitting layer 3113 like the latter method, even when the first electrode 3101 is formed by sputtering, the mixed layer 3111 serves as a protection layer, and hence, it is possible to form a favorable light emitting element in which damage due to sputtering of a layer formed using an organic compound such as the light emitting layer 3113 is not easily generated.

Embodiment Mode 5

One mode of a light emitting element of the present invention will be described with reference to FIG. 11

Figure 11:
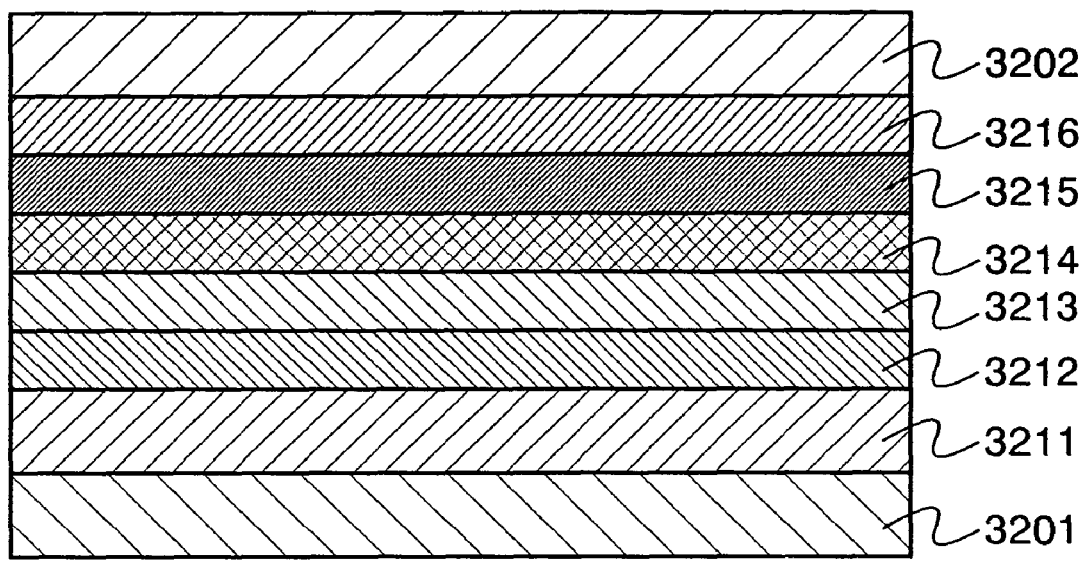
FIG. 11 is a diagram explaining one mode of a light emitting element of the present invention.

FIG. 11 shows a light emitting element having a light emitting layer 3213, a first mixed layer 3215, and a second mixed layer 3216 between a first electrode 3201 and a second electrode 3202, in which the light emitting layer 3213 is provided to be closer to the second electrode 3201 than the first mixed layer 3215 and the second mixed layer 3216 is provided to be closer to the second electrode 3202 than the first mixed layer 3215. In this light emitting element, a hole injecting layer 3211 and a hole transporting layer 3212 are provided between the light emitting layer 3213 and the first electrode 3201, and an electron transporting layer 3214 is provided between the light emitting layer 3213 and the first mixed layer 3215. The first mixed layer 3215 contains at least one substance selected from the group consisting of an alkali metal, an alkali earth metal, an alkali metal oxide, an alkali earth metal oxide, an alkali metal fluoride, and an alkali earth metal fluoride, and a substance having an electron transporting property. The second mixed layer 3216 contains an aromatic hydrocarbon and a metal oxide. The light emitting layer 3213 contains a light emitting substance. When voltage is applied to each of the first electrode 3201 and the second electrode 3202 so that potential of the first electrode 3201 is higher than that of the second electrode 3202, electrons are injected to the electron transporting layer 3214 from the first mixed layer 3215, holes are injected to the second electrode 3202 from the second mixed layer 3216, and holes are injected to the hole injecting layer 3211 from the first electrode 3201. Further, holes injected to the light emitting layer 3213 from the first electrode 3201 side and electrons injected to the light emitting layer 3213 from the second electrode 3202 side are recombined. The light emitting substance contained in the light emitting layer 3213 is excited by excitation energy generated by the recombination. The excited light emitting substance emits light upon returning to a ground state.

The first electrode 3201, the second electrode 3202, and each layer provided between the first electrode 3201 and the second electrode 3202 will be described in detail below.

The first electrode 3201 is preferably formed using a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride.

The second electrode 3202 is preferably formed using a substance having a low work function such as aluminum and magnesium. When a layer generating electrons is provided between the second electrode 3202 and the light emitting layer 3213, however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 3202 may be formed by appropriately selecting either a substance having a high work function or a substance having a low work function in accordance with a characteristic of a layer provided between the second electrode 3202 and the light emitting layer 3213.

Note that one or both the first electrode 3201 and the second electrode 3202 is/are preferably formed so that one or both of the electrodes can transmit light.

The hole injecting layer 3211 of this embodiment mode has a function of helping injection of holes to the hole transporting layer 3212 from the first electrode 3201. Providing the hole injecting layer 3211 makes it possible to reduce difference in ionization potential between the first electrode 3201 and the hole transporting layer 3212 so that holes are easily injected. The hole injecting layer 3211 is preferably formed using a substance whose ionization potential is smaller than that of a substance used for forming the hole transporting layer 3223 and larger than that of a substance used for forming the first electrode 3201. As specific examples of substances which can be used for forming the hole injecting layer 3211, a low molecular material such as phthalocyanine (abbreviation: H$_2$Pc) or copper phthalocyanine (abbreviation: CuPc), a high molecular material such as a poly(ethylenedioxythiophene)/poly(styrene sulfonate) solution (PEDOT/PSS), and the like can be given.

The hole transporting layer 3212 has a function of transporting holes. In the light emitting element of this embodiment mode, the hole transporting layer 3212 has a function of transporting holes to the light emitting layer 3213 from the hole injecting layer 3211. Providing the hole transporting layer 3212 makes it possible to create a distance between the first electrode 3201 and the light emitting layer 3213. Consequently, it is possible to prevent quenching of light emission due to metal contained in the first electrode 3201. The hole transporting layer 3212 is preferably formed using a substance having a hole transporting property. In particular, the hole transporting layer 3212 is preferably formed using a substance having a hole transporting property with hole mobility of $1\times10^{-6}$ cm$^2$/Vs or more or a bipolar substance. Further, the substance having the hole transporting property and the bipolar substance are already described in Embodiment Mode 4, and will not be further described in this embodiment mode.

The light emitting layer 3213 contains a light emitting substance. The light emitting layer 3213 may be formed using only a light emitting substance. When quenching due to a concentration is caused, the light emitting layer 3213 is preferably a layer in which a light emitting substance is dispersed in a substance having a larger energy gap than that of the light emitting substance. By mixing the light emitting substance in the light emitting layer 3213, quenching of light emission due to a concentration can be prevented. Here, an energy gap indicates an energy gap between a LUMO level and a HOMO level. The light emitting substance and the substance used for dispersing the light emitting substance are already described in Embodiment Mode 4, and will not be further described in this embodiment mode.

The electron transporting layer 3214 has a function of transporting electrons. In the light emitting element of this embodiment mode, the electron transporting layer 3214 has a function of transporting electrons injected from the first mixed layer 3215 to the light emitting layer 3213. Providing the electron transporting layer 3214 makes it possible to create a distance between the second mixed layer 3216 and the light emitting layer 3213. Consequently, quenching of light emission due to metal contained in the second mixed layer 3216 (when metal is contained in the first mixed layer 3215, quenching of light emission due to the metal) can be prevented. The electron transporting layer 3214 is preferably formed using a substance having an electron transporting property. In particular, the electron transporting layer is preferably formed using a substance having an electron transporting property with electron mobility of $1\times10^{-6}$ cm$^2$/Vs or more (more preferably, $1\times10^{-6}$ to $1\times10^{0}$ cm$^2$/Vs), or a bipolar substance. Further, the substance having the electron transporting property and the bipolar substance are already described in Embodiment Mode 4, and will no be further described in this embodiment mode.

The first mixed layer 3215 generates electrons. The first mixed layer 3215 can be formed by using a mixture of at least one substance of one or more of a substance having an electron transporting property or a bipolar substance and a substance showing an electron donating property with respect to the substance. In this case, a substance having electron mobility of $1\times10^{-6}$ cm$^2$/Vs or more is preferably used among the substance having the electron transporting property and the bipolar substance. Further, the substance having the electron transporting property and the bipolar substance are already described in Embodiment Mode 4, and will not be further described in this embodiment mode. Furthermore, the substance showing the electron donating property with respect to the substance having the electron transporting property and the bipolar substance is also described in Embodiment Mode 4, and will not be further described in this embodiment mode.

The second mixed layer 3216 contains an aromatic hydrocarbon and a metal oxide. The aromatic hydrocarbon is not particularly limited; however, an aromatic hydrocarbon having hole mobility of $1\times10^{-6}$ cm$^2$/Vs or more (more preferably, $1\times10^{-6}$ cm$^2$/Vs to $1\times10^{0}$ cm$^2$/Vs) is preferably used. As the aromatic hydrocarbon having a favorable hole transporting property, which can be used for forming the second mixed layer 3216, for example, aromatic hydrocarbons having 14 to 60 carbon atoms and containing an anthracene skeleton such as 2-tert-butyl-9,10-di(2-naphthyl)anthracene; 9,10-di(naphthalen-1-yl)-2-tert-butyl anthracene; anthracene; 9,10-diphenylanthracene; 9,10-bis(3,5-diphenylphenyl)anthracene; 9,10-di(naphthalen-2-yl)anthracene; 2-tert-butylanthracene; 9,10-di(4-methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene bianthryl; 10,10'-di(2-phenylphenyl)-9,9'-bianthryl; 10,10(-bis[(2,3,4,5,6-pentaphenyl)phenyl]-9,9(-bianthryl; 9,10-di(4-phenylphenyl)-2-tert-butylanthracene; and the like can be given. Among aromatic hydrocarbons having 14 to 60 carbon atoms, in particular, an aromatic hydrocarbon having 26 to 60 carbon atoms is preferably used. More preferably, an aromatic hydrocarbon having 34 to 60 carbon atoms is used. When using the aromatic hydrocarbon having 26 to 60 carbon atoms, a heat resistance property of the mixed layer is improved. In particular, when using the aromatic hydrocarbon showing 34 to 60 carbon atoms, the second mixed layer 3216 having an extremely favorable heat resistance property can be obtained. Improvement of the heat resistance property of the second mixed layer 3216 is extremely effective in manufacturing a light emitting element in which deterioration in electric characteristics due to Joule heat generated by current such as increase in resistance is inhibited. As the metal oxide, a metal oxide showing an electron accepting property to an aromatic hydrocarbon is preferable. As such a metal oxide, for example, molybdenum oxide, vanadium oxide, ruthenium oxide, rhenium oxide, and the like can be given. In addition, metal oxides such as titanium oxide, chromium oxide, zirconium oxide, hafnium oxide, tantalum oxide, tungsten oxide, or silver oxide can also be used. By mixing a metal oxide and an aromatic hydrocarbon as mentioned above, charge-transfer can be generated. The second mixed layer 3216 containing a metal oxide and an aromatic hydrocarbon shows extremely less variations in absorbance, which is dependent on an absorption wavelength in a visible light region which is a region of 450 to 650 nm (i.e., less variations in transmittance in a visible light region), and therefore, the amount of light emission loss caused by absorption of light emission in the second mixed layer 3216 is less dependent on a light emission wavelength. Accordingly, providing the second mixed layer 3216 makes it possible to prevent light extraction efficiency from varying for each color (i.e., for each wavelength) of light emission. The metal oxide is preferably contained in the second mixed layer 3216 so that a mass ratio of the metal oxide with respect to the aromatic hydrocarbon (=metal oxide/aromatic hydrocarbon) is 0.5 to 2 or a molar ratio thereof is 1 to 4. Further, aromatic hydrocarbons generally have a property of being easily crystallized; however, when an aromatic hydrocarbon is mixed with a metal oxide, the aromatic hydrocarbon is not easily crystallized. Furthermore, molybdenum oxide is particularly crystallized easily among metal oxide; however, when molybdenum oxide is mixed with an aromatic hydrocarbon like this embodiment mode, the molybdenum oxide is not easily crystallized. By mixing a aromatic hydrocarbon and a metal oxide in this manner, the aromatic hydrocarbon and the metal oxide mutually hinder crystallization, making it possible to form a layer which is not easily crystallized.

Figure 12:
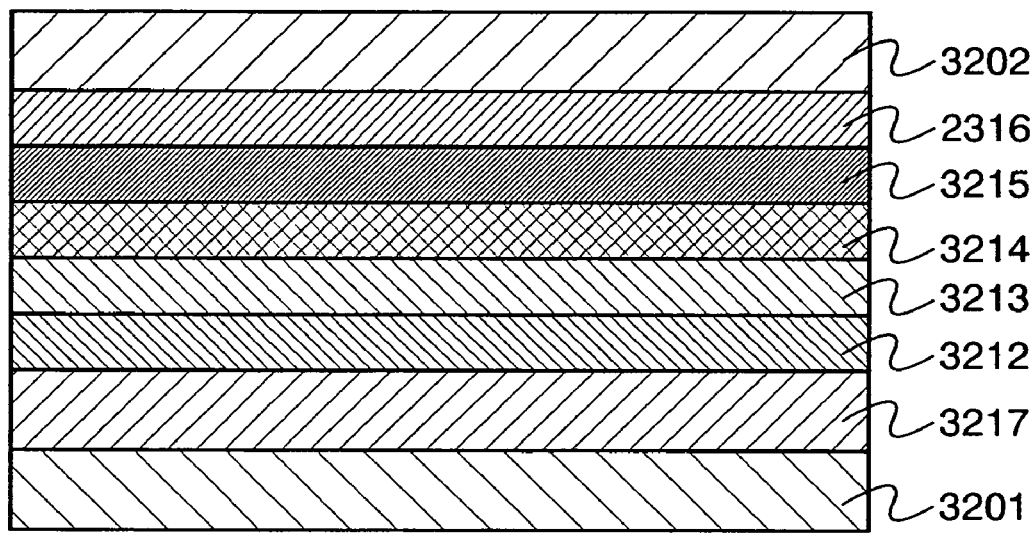
FIG. 12 is a diagram explaining one mode of a light emitting element of the present invention.
Figure 13:
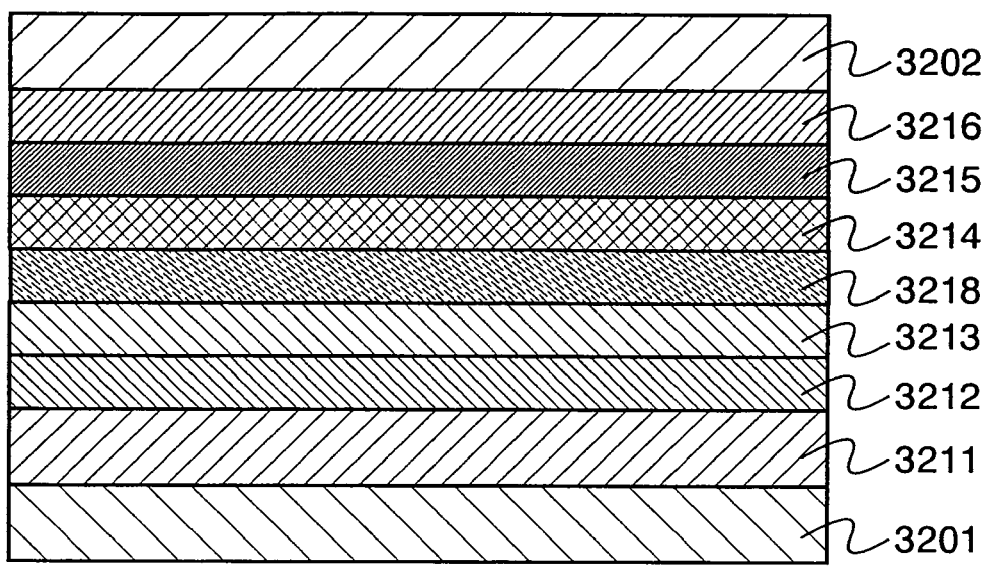
FIG. 13 is a diagram explaining one mode of a light emitting element of the present invention.

Note that the light emitting element having the hole injecting layer 3211, the hole transporting layer 3212, the electron transporting layer 3214, and the like in addition to the light emitting layer 3213, the first mixed layer 3215, and the second mixed layer 3216 is shown in this embodiment mode; however, a mode of the light emitting element is not necessarily limited thereto. For example, as shown in FIG. 12, a layer 3217 containing an aromatic hydrocarbon and a metal oxide, or the like may be provided as substitute for the hole injecting layer 3211. Providing the layer 3217 containing an aromatic hydrocarbon and a metal oxide makes it possible to operate the light emitting element favorably even when the first electrode 3201 is formed using a substance having a low work function such as aluminum and magnesium. Further, as shown in FIG. 13, a hole blocking layer 3218 may be provided between the electron transporting layer 3214 and the light emitting layer 3213. The hole blocking layer 3218 is the same as the hole blocking layer 3117 described in Embodiment Mode 4, and will not be further described in this embodiment mode.

Note that an operator of the present invention may appropriately select whether or not the hole injecting layer 3211, the hole transporting layer 3212, and the electron transporting layer 3214 are provided. For example, in a case where a defect such as light quenching due to metal is not caused without providing the hole transporting layer 3212, the electron transporting layer 3214, and the like, or in a case where injection of holes can be preferably performed from the electrode without providing the hole injecting layer 3211, these layers are not necessarily required to be provided.

By forming the light emitting element having the second mixed layer 3216 containing an aromatic hydrocarbon and a metal oxide, defects due to crystallization of a layer between a pair of electrodes can be reduced. More specifically, a short-circuiting which is caused as a result of generation of concavity and convexity due to the crystallization, can be reduced as compared with a light emitting element having a layer only containing an aromatic hydrocarbon or a metal oxide. Further, since the second mixed layer 3216 can generate holes, by providing the second mixed layer 3216 containing an aromatic hydrocarbon and a metal oxide, a light emitting element having less variations in driving voltage, which is dependent on the thickness of the second mixed layer 3216, can be obtained. As a consequence, a distance between the light emitting layer 3213 and the second electrode 3202 can be easily adjusted by changing the thickness of the second mixed layer 3216. That is, the length of a light path through which emitted light passes (light path length), can be easily adjusted so that light emission can be efficiently extracted to an external portion or color purity of light extracted to an external portion is improved. Further, by increasing the thickness of the second mixed layer 3216, the concavity and convexity on the surface of the second electrode 3202 can be reduced, thereby reducing short-circuiting between the pair of electrodes.

When the layer containing an aromatic hydrocarbon and a metal oxide is also provided at the side of the first electrode 3201 in place of the hole injecting layer 3211, a distance between the first electrode 3201 and the light emitting layer 3213 can be easily adjusted. Moreover, concavity and convexity generated over the surface of the first electrode 3201 can be reduced, making it possible to reduce short-circuiting between the pair of electrodes.

The light emitting element described above may be formed by using a method by which the first electrode 3201 is first formed and after forming respective layers such as the light emitting layer 3213, the second electrode 3202 is formed. Alternatively, the light emitting layer may be formed by using a method by which the second electrode 3202 is first formed, and after forming respective layers such as the light emitting layer 3213, the first electrode 3201 is formed. In each method, by forming a layer containing an aromatic hydrocarbon and a metal oxide is formed after the formation of the light emitting layer 3213, even when the electrode (either the first electrode 3201 or the second electrode 3202) is formed by sputtering, the layer containing an aromatic hydrocarbon and a metal oxide serves as a protection layer. Therefore, it is possible to form a favorable light emitting element in which damage due to sputtering of a layer formed using an organic compound such as the light emitting layer 3213 is not easily generated.

Embodiment Mode 6

Figure 14:
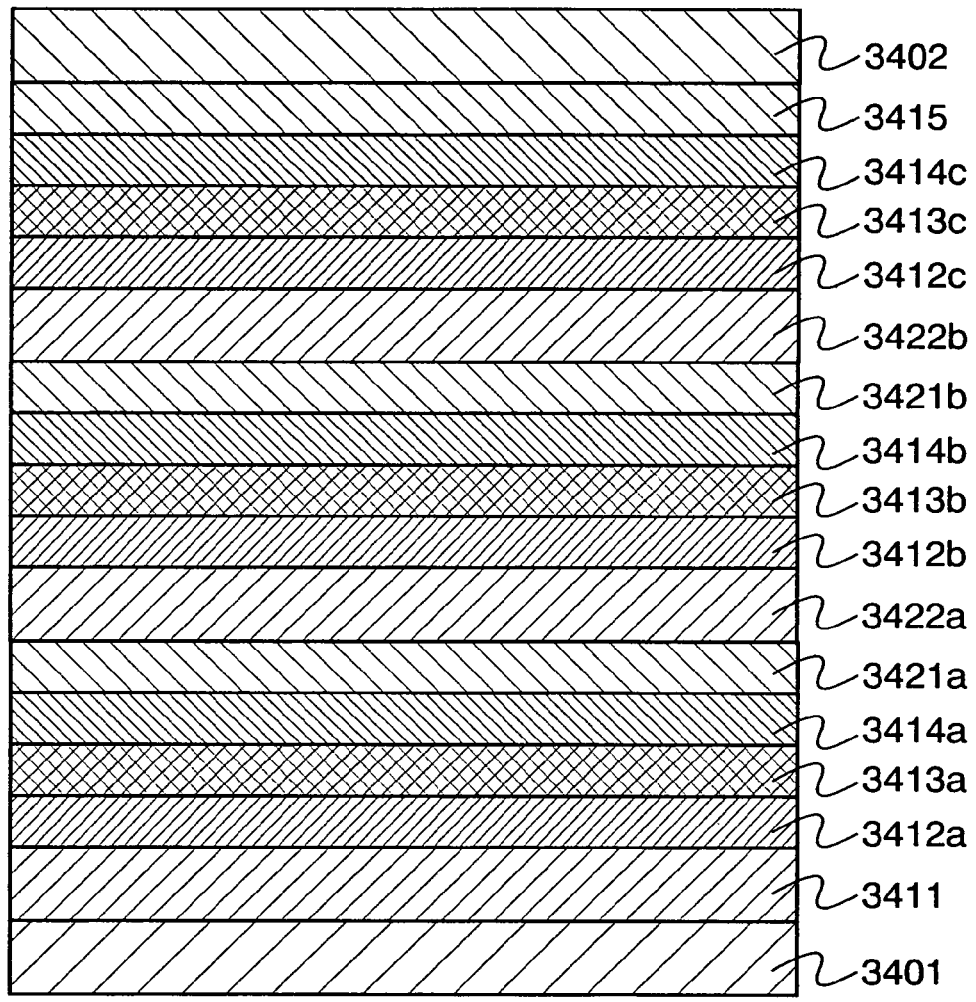
FIG. 14 is a diagram explaining one mode of a light emitting element of the present invention.

One mode of a light emitting element of the present invention will be described with reference to FIG. 14. FIG. 14 shows a light emitting element having a plurality of light emitting layers, i.e., a first light emitting layer 3413a, a second light emitting layer 3413b, and a third light emitting layer 3413c between a first electrode 3401 and a second electrode 3402. This light emitting element has a first mixed layer 3421a and a second mixed layer 3422a between the first light emitting layer 3413a and the second light emitting layer 3413b and a first mixed layer 3421b and a second mixed layer 3422b between the second light emitting layer 3413b and the third light emitting layer 3413c. Each of the first mixed layers 3421a and 3421b contains at least one substance selected from the group consisting of an alkali metal, an alkali earth metal, an alkali metal oxide, an alkali earth metal oxide, an alkali metal fluoride, and an alkali earth metal fluoride; and a substance having an electron transporting property. The second mixed layers 3422a and 3422b each contain an aromatic hydrocarbon and a metal oxide. Further, the first mixed layer 3421a is provided to be closer to the first electrode 3401 than the second mixed layer 3422a, whereas the first mixed layer 3421b is provided to be closer to the first electrode 3401 than the second mixed layer 3422b. A hole transporting layer 3412a is provided between the first electrode 3401 and the first light emitting layer 3413a, a hole transporting layer 3412b is provided between the second mixed layer 3422a and the second light emitting layer 3413b, and a hole transporting layer 3412c is provide between the second mixed layer 3422b and the third light emitting layer 3413c. Further, an electron transporting layer 3414a is provided between the first light emitting layer 3413a and the first mixed layer 3421a, an electron transporting layer 3414b is provided between the second light emitting layer 3413b and the first mixed layer 3421b, and an electron transporting layer 3414c is provided between the third light emitting layer 3413c and the second electrode 3402. Furthermore, a hole injecting layer 3411 is provided between the first electrode 3401 and the hole transporting layer 3412a, and an electron injecting layer 3415 is provided between the second electrode 3402 and the electron transporting layer 3414c. Each of the first light emitting layer 3413a, the second light emitting layer 3413b, and the third light emitting layer 3413c contains a light emitting substance. When voltage is applied to each of the first electrode 3401 and the second electrode 3402 so that potential of the first electrode 3401 is higher than that of the second electrode 3402, holes and electrons are recombined in each of the light emitting layers, and the light emitting substance contained in each of the light emitting layers is excited by excitation energy generated by the recombination. The excited light emitting substance emits light upon returning to a ground state. Note that the light emitting substances contained in each of the light emitting layers may be the same or different from one another.

The first electrode 3401 is preferably formed using a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride. Note that, when a layer containing an aromatic hydrocarbon and a metal oxide is provided as substitute for the hole injecting layer 3411, the first electrode 3401 can be formed by using a substance having a low work function such as aluminum and magnesium.

The second electrode 3402 is preferably formed using a substance having a low work function such as aluminum and magnesium. When a layer generating electrons is provided between the second electrode 3402 and the third light emitting layer 3413c, however, a substance having a high work function such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride; and the like can also be used. Therefore, the second electrode 3402 may be formed by appropriately selecting either a substance having a high work function or a substance having a low work function in accordance with a characteristic of a layer provided between the second electrode 3402 and the third light emitting layer 3413c.

In the light emitting element of this embodiment mode, the first mixed layers 3421a and 3421b are much the same as the first mixed layer 3215 described in Embodiment Mode 5. Further, the second mixed layers 3422a and 3422b are much the same as the second mixed layer 3216 described in Embodiment Mode 5. Furthermore, the first light emitting layer 3413a, the second light emitting layer 3413b, and the third light emitting layer 3413c are much the same as the light emitting layer 3213 described in Embodiment Mode 5. Moreover, the hole injecting layer 3411, the hole transporting layers 3412a, 3412b, and 3412c, the electron transporting layers 3414a, 3414b, and 3414c, and the electron injecting layer 3415 are also much the same as the respective layers denoted by the same names in Embodiment Mode 4 or 5.

By forming the light emitting element having the second mixed layers 3422a and 3422b each containing an aromatic hydrocarbon and a metal oxide as described above, defects due to crystallization of a layer between the pair of electrodes can be reduced. More specifically, a short-circuiting which is caused as a result of generation of concavity and convexity due to the crystallization can be reduced as compared with a light emitting element having a layer only containing an aromatic hydrocarbon or a metal oxide. Further, by providing the second mixed layers 3422a and 3422b each containing an aromatic hydrocarbon and a metal oxide, a favorable light emitting element can be obtained where damage due to sputtering of a layer formed using an organic compound such as the light emitting layer is not easily generated as compared with a light emitting element having a structure in which layers formed by sputtering like a layer made from indium tin oxide are provided between each light emitting layers.

Embodiment Mode 7

A light emitting element of the present invention can reduce an operational defect due to crystallization of a layer provided between a pair of electrodes. Further, by increasing the thickness of a mixed layer containing an aromatic hydrocarbon and a metal oxide, which is provided between a pair of electrodes, a short-circuiting between the pair of electrodes can be prevented. Furthermore, by changing the thickness of the mixed layer, a light path length can be adjusted or light extraction efficiency to an external portion can be improved, and light emission with fine color purity can be obtained. Therefore, by using the light emitting element of the present invention as a pixel, a favorable light emitting device with less display defects due to operational defects of the light emitting element can be obtained. Moreover, by using the light emitting element of the present invention as a pixel, a light emitting device being capable of providing images with favorable colors can be obtained. By using the light emitting element of the present invention as a light source, a light emitting device capable of illuminating favorably with less defects due to an operational defect of the light emitting element can be obtained.

In this embodiment mode, a circuit structure of a light emitting device having a display function and a method for driving thereof will be described with reference to FIGS. 15 to 18.

Figure 15:
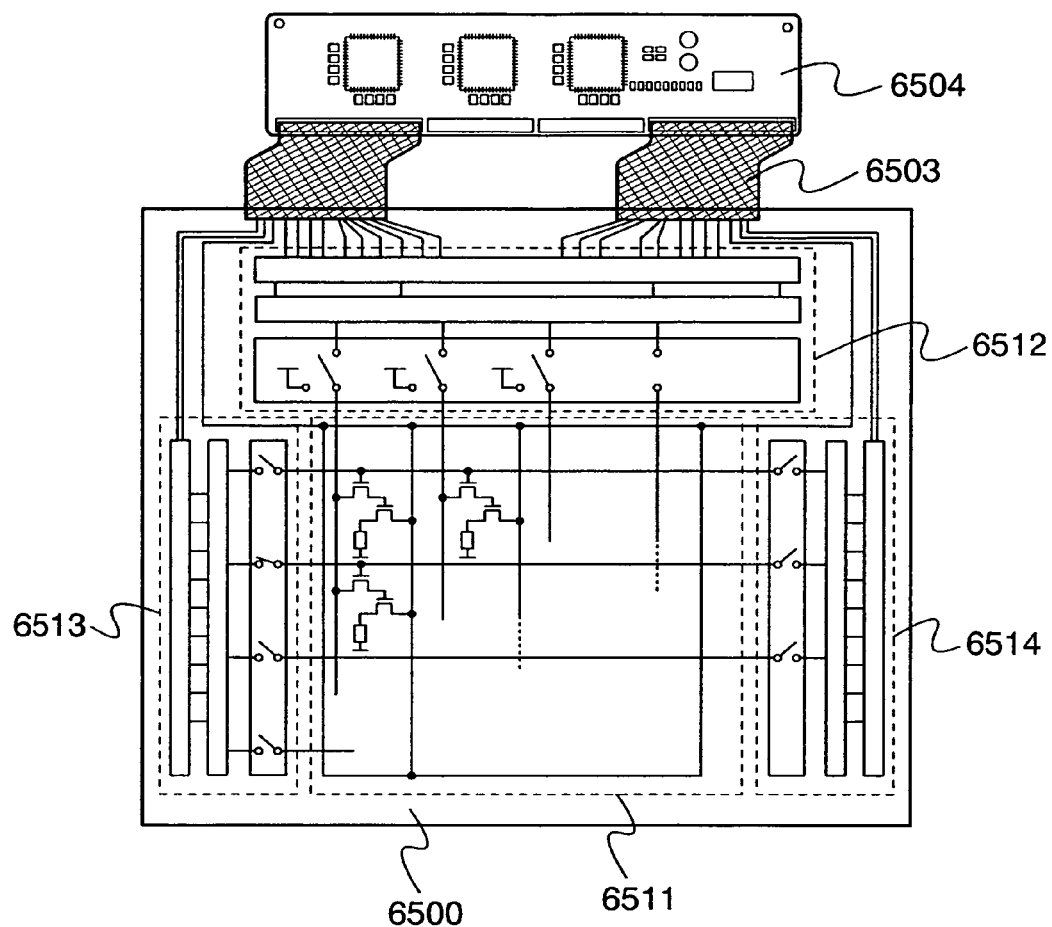
FIG. 15 is a top view explaining one mode of a light emitting element of the present invention.

FIG. 15 is a view showing a schematic block diagram seen from a top surface of a light emitting device to which the present invention is applied. In FIG. 15, a pixel portion 6511, a source signal line driver circuit 6512, a wiring gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 are respectively connected to FPCs (flexible printed circuits) 6503, which are external input terminals, through wiring groups. The source signal line driver circuit 6512, the writing gate signal line driver circuit 6513, and the erasing gate signal line driver circuit 6514 receive video signals, clock signals, start signals, reset signals and the like from the FPCs 6503, respectively. The FPCs 6503 are attached with printed wiring boards (PWBs) 6504. Further, a driver circuit portion is not necessary to be formed over the same substrate as the pixel portion 6511 as described above. For example, the driver circuit portion may be provided outside of the substrate by utilizing a TCP in which an IC chip is mounted over an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuits each including a light emitting element are aligned in the pixel portion 6511.

Figure 16:
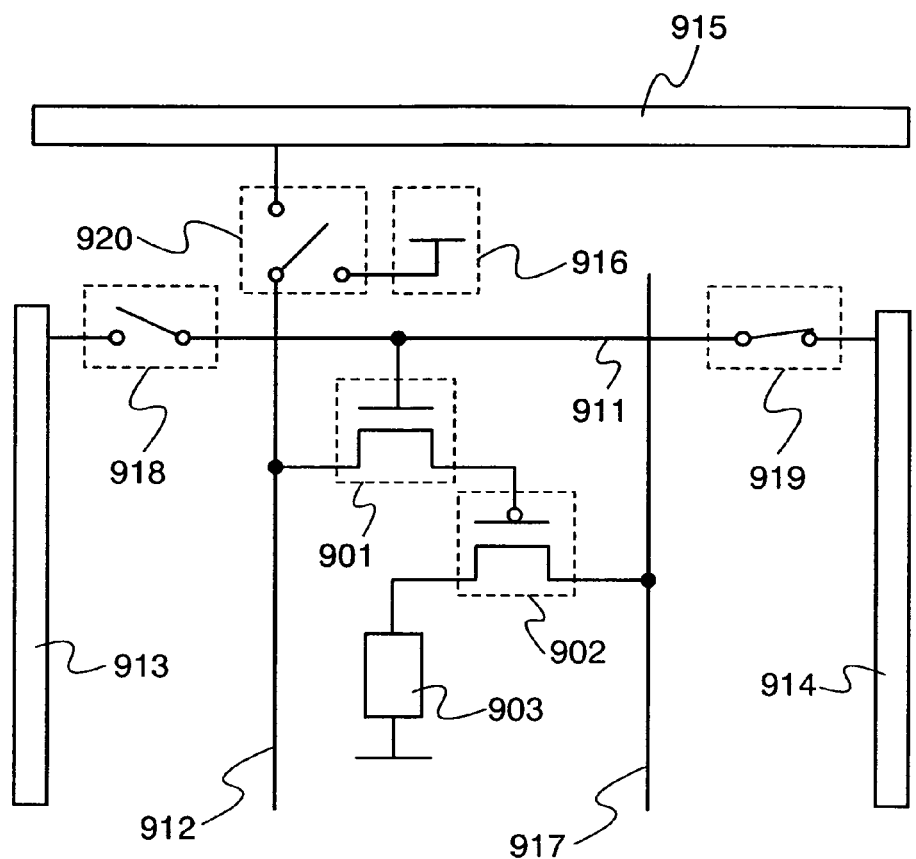
FIG. 16 is a diagram explaining one mode of a circuit for driving a pixel provided in a light emitting device of the present invention.

FIG. 16 is a diagram showing a circuit for operating one pixel. The circuit as shown in FIG. 16 comprises a first transistor 901, a second transistor 902, and a light emitting element 903.

Each of the first and second transistors 901 and 902 is a three terminal element including a gate electrode, a drain region, and a source region. A channel region is interposed between the drain region and the source region. Since a region serving as the source region and a region serving as the drain region are changed depending on a structure of a transistor, an operational condition, and the like, it is difficult to determine which region serves as the source region or the drain region. Therefore, regions serving as the source or the drain are denoted as a first electrode of a transistor and a second electrode of a transistor in this embodiment mode, respectively.

A gate signal line 911 and a writing gate signal line driver circuit 913 are provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor is electrically connected to the source signal line 912 while the second electrode of the first transistor is electrically connected to a gate electrode of the second transistor 902. The first electrode of the second transistor 902 is electrically connected to a current supply line 917 while the second electrode of the second transistor is electrically connected to one electrode included in the light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 17:
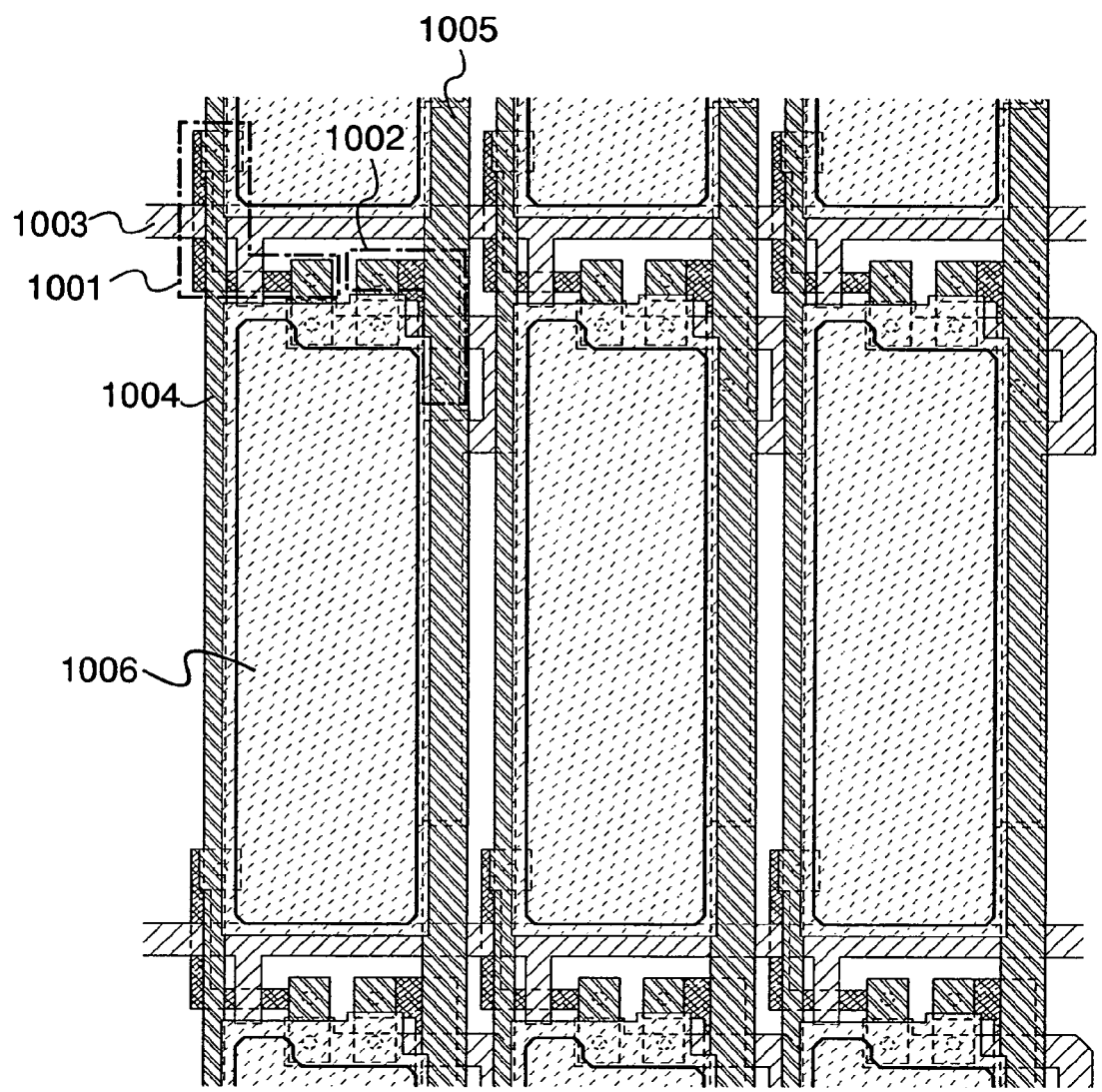
FIG. 17 is a diagram explaining one mode of a pixel portion included in a light emitting device of the present invention.

The arrangement of transistors, light emitting elements and the like in the pixel portion is not particularly limited. For example, the arrangement as shown in a top view of FIG. 17 can be employed. In FIG. 17, a first electrode of a first transistor 1001 is connected to a source signal line 1004 while a second electrode of the first transistor is connected to a gate electrode of a second transistor 1002. A first electrode of the second transistor is connected to a current supply line 1005 and a second electrode of the second transistor is connected to an electrode 1006 of a light emitting element. A part of the gate signal line 1003 functions as a gate electrode of the first transistor 1001.

Figure 18:
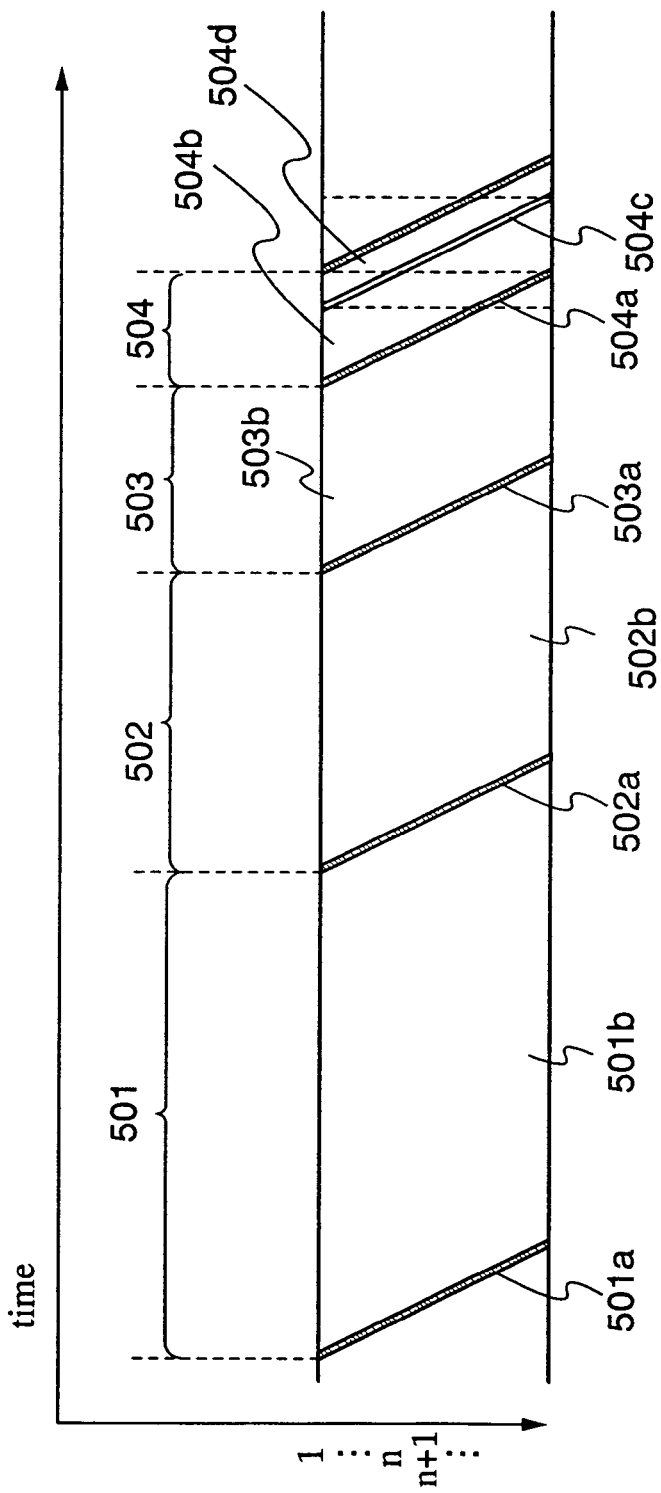
FIG. 18 is a frame diagram explaining a method for driving a pixel included in a light emitting device of the present invention.

Next, the method for driving the light emitting device will be described below. FIG. 18 is a diagram explaining an operation of one frame with time. In FIG. 18, a horizontal direction indicates time passage while a longitudinal direction indicates the number of scanning stages of a gate signal line.

When an image is displayed on the light emitting device of the present invention, a rewriting operation and a displaying operation are carried out alternately during a displaying period. The number of the rewriting operations is not particularly limited. However, the rewriting operation is preferably performed about 60 times a second so that a person who watches a displayed image does not detect flicker in the image. A period of operating the rewriting operation and the displaying operation of one image (one frame) is, herein, referred to as one frame period.

As shown in FIG. 18, one frame is divided into four sub-frames 501, 502, 503 and 504 including writing periods 501$a$, 502$a$, 503$a$ and 504$a$ and holding periods 501$b$, 502$b$, 503$b$ and 504$b$. The light emitting element applied with a signal for emitting light, emits light during the holding periods. The length ratio of the holding periods in the first sub-frame 501, the second sub-frame 502, the third sub-frame 503 and the fourth sub-frame 504 satisfies $2^3:2^2:2^1:2^0=8:4:2:1$. This allows the light emitting device to exhibit 4-bit gray scale. Further, the number of bits and the number of gray scales are not limited to those as shown in this embodiment mode. For instance, one frame may be divided into eight sub-frames so as to achieve 8-bit gray scale.

The operation in one frame will be described. In the sub-frame 501, the writing operation is first performed in a $1^{st}$ row to a last row, sequentially. Therefore, the starting time of the writing periods is varied for each row. The holding period 501$b$ sequentially starts in the rows in which the writing period 501$a$ has been terminated. In the holding period 501$b$, a light emitting element applied with a signal for emitting light, remains in a light emitting state. Upon terminating the holding period 501$b$, the sub-frame 501 is changed to the next sub-frame 502 sequentially in the rows. In the sub-frame 502, a writing operation is sequentially performed in the $1^{st}$ row to the last row in the same manner as the sub-frame 501. The above-mentioned operations are carried out repeatedly up to the holding period 504$b$ of the sub-frame 504 and then terminated. After terminating the operation in the sub-frame 504, an operation in the next frame starts. Accordingly, the sum of the light-emitting time in respective sub-frames corresponds to the light emitting time of each light emitting element in one frame. By changing the light emitting time for each light emitting element and combining such the light emitting elements variously within a pixel portion, various display colors with different brightness and different chromaticity can be obtained.

When the holding period is intended to be forcibly terminated in the row in which the writing period has already been terminated and the holding period has started prior to terminating the writing operation up to the last row as shown in the sub-frame 504, an erasing period 504$c$ is preferably provided after the holding period 504$b$ so as to stop light emission forcibly. The row where light emission is forcibly stopped, does not emit light for a certain period (this period is referred to as a non light emitting period 504$d$). Upon terminating the writing period in the last row, a writing period of a next sub-frame (or, a next frame) immediately starts from a first row, sequentially. This can prevent the writing period in the sub-frame 504 from overlapping with the writing period in the next sub-frame.

Although the sub-frames 501 to 504 are arranged in order of descending the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate signal lines may be performed at several times during a period of supplying same video signals.

The operations in the wiring period and the erasing period of the circuits as shown in FIG. 16 will be described below.

First, the operation in the writing period will be described. In the writing period, the gate signal line 911 in the n-th row (n is a natural number) is electrically connected to the writing gate signal line driver circuit 913 via the switch 918. The gate signal line 911 in the n-th row is electrically disconnected to the erasing gate signal line driver circuit 914. The source signal line 912 is electrically connected to the source signal line driver circuit 915 via the switch 920. In this case, a signal is input in a gate of the first transistor 901 connected to the gate signal line 911 in the n-th row (n is a natural number), thereby turning the first transistor 901 on. At this moment, video signals are simultaneously input in the source signal lines in the first to last columns. Further, the video signals input from the source signal line 912 in each column are independent from one another. The video signals input from the source signal line 912 are input in a gate electrode of the second transistor 902 via the first transistor 901 connected to the respective source signal lines. It is decided whether the light emitting element 903 emits light or emits no light depending on a signal input in the second transistor 902. For instance, when the second transistor 902 is of a P-channel type, the light emitting element 903 emits light by inputting a low level signal in the gate electrode of the second transistor 902. On the other hand, when the second transistor 902 is of an N-channel type, the light emitting element 903 emits light by inputting a high level signal in the gate electrode of the second transistor 902.

Next, the operation in the erasing period will be described. In the erasing period, the gate signal line 911 in the n-th row (n is a natural number) is electrically connected to the erasing gate signal line driver circuit 914 via the switch 919. The gate signal line 911 in the n-th row is electrically disconnected to the writing gate signal line deriver circuit 913. The source signal line 912 is electrically connected to the power source 916 via the switch 920. In this case, upon inputting a signal in the gate of the first transistor 901, which is connected to the gate signal line 911 in the n-th row, the first transistor 901 is turned on. At this time, erasing signals are simultaneously input in the first to last columns of the source signal lines. The erasing signals input from the source signal line 912 are input in the gate electrode of the second transistor 902 via the first transistor 901, which is connected to each source signal line. At this time, the current supply line 917 and the light emitting element 903 becomes an electrically non-conductive state by a signal input in the second transistor 902. This makes the light emitting element 903 emit no light forcibly. For example, when the second transistor 902 is of a P-channel type, the light emitting element 903 emits no light by inputting a high level signal in the gate electrode of the second transistor 902. On the other hand, when the second transistor 902 is of an N-channel type, the light emitting element 903 emits no light by inputting a low level signal in the gate electrode of the second transistor 902.

Further, in the erasing period, a signal for erasing is input in the n-th row (n is a natural number) by the above-mentioned operation. However, as mentioned above, the n-th row sometimes remains in the erasing period while another row (e.g., an m-th row (m is a natural number)) remains in the writing period. In this case, since a signal for erasing is necessary to be input in the n-th row and a signal for writing is necessary to be input in the m-th row by utilizing the source signal line in the same column, the after-mentioned operation will be preferably carried out.

After the light emitting element 903 in the n-th row becomes a non-light emitting state by the above-described operation in the erasing period, the gate signal line 911 and the erasing gate signal line driver circuit 914 are immediately disconnected to each other and the source signal line 912 is connected to the source signal line driver circuit 915 by turning the switch 920 on/off. The gate signal line 911 and the writing gate signal line driver circuit 913 are connected to each other while the source signal line and the source signal line driver circuit 915 are connected to each other. A signal is selectively input in the signal line in the m-th row from the writing gate signal line driver circuit 913 and the first transistor is turned on while signals for writing are input in the source signal lines in the first to last columns from the source signal line driver circuit 915. By inputting these signals, the light emitting element in the m-th row emits light or no light.

After terminating the writing period in the m-th row as mentioned above, the erasing period immediately starts in the n+1-th row. Therefore, the gate signal line 911 and the writing gate signal line driver circuit 913 are disconnected to each other while the source signal line is connected to the power source 916 by turning the switch 920 on/off. Also, the gate signal line 911 and the writing gate signal line driver circuit 913 are disconnected to each other while the gate signal line 911 is connected to the erasing gate signal line driver circuit 914. A signal is selectively input in the gate signal line in the n+1-th row from the erasing gate signal line driver circuit 914 to input a signal for turning on the first transistor in the first transistor while an erasing signal is input therein from the power source 916. Upon terminating the erasing period in the n+1-th row in this manner, the writing period immediately starts in the m+1-th row. The erasing period and the writing period may be repeated alternately until the erasing period of the last row in the same manner.

Although the writing period in the m-th row is provided between the erasing period in the n-th row and the erasing period of the n+1-th row in this embodiment mode, the present invention is not limited thereto. The writing period of the m-th row may be provided between the erasing period in the n−1-th row and the erasing period in the n-th row.

Furthermore, in this embodiment mode, when the non-light emitting period 504*d* is provided like the sub-frame 504, the operation of disconnecting the erasing gate signal line driver circuit 914 from one gate signal line while connecting the writing gate signal line driver circuit 913 to other gate signal line, is carried out repeatedly. This operation may be performed in a frame in which a non-light emitting period is not particularly provided.

Embodiment Mode 8

One mode of a light emitting device including a light emitting element of the present invention will be described with reference to cross sectional views of FIGS. 19A to 19C.

In each of FIGS. 19A to 19C, a transistor 11 that is provided for driving a light emitting element 12 of the present invention is surrounded by a dashed line. The light emitting element 12 is a light emitting element of the present invention as described in Embodiment Mode 1 through 6, which includes a layer 15 in which a light emitting layer and a mixed layer containing an aromatic hydrocarbon and a metal oxide are laminated, between a first electrode 13 and a second electrode 14. A drain of the transistor 11 and the first electrode 13 are electrically connected to each other via a wiring 17 that passes through a first interlayer insulating film 16 (16*a*, 16*b* and 16*c*). The light emitting element 12 is isolated from other adjacent light emitting element by a partition wall layer 18. A light emitting device having such a structure is provided over a substrate 10 in this embodiment mode.

The transistor 11 shown in each of FIGS. 19A to 19C is of a top-gate type in which a gate electrode is provided on a semiconductor layer at a side opposite to the substrate. Further, the structure of the transistor 11 is not particularly limited thereto, and for example, a bottom-gate type structure may be employed. In the case of the bottom-gate type, either a structure in which a protection film is formed over a semiconductor layer forming a channel (a channel protection type) or a structure in which a semiconductor layer forming a channel is partly etched (a channel-etched type) may be used.

Furthermore, a semiconductor layer included in the transistor 11 may be formed using any one of a crystalline semiconductor, an amorphous semiconductor, a semiamorphous semiconductor, and the like.

Specifically, the semiamorphous semiconductor has an intermediate structure between an amorphous structure and a crystalline structure (including a single crystal structure and a polycrystalline structure), and a third condition that is stable in terms of free energy. The semiamorphous semiconductor further includes a crystalline region having a short range order along with lattice distortion. A crystal grain with a size of 0.5 to 20 nm is included in at least a part of a semiamorphous semiconductor film. Raman spectrum is shifted toward lower wave numbers than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of at least 1 atom % or more so as to terminate dangling bonds. The semiamorphous semiconductor is also referred to as a so-called microcrystalline semiconductor. The semiamorphous semiconductor is formed by glow discharge decomposition (plasma CVD) with a gas such as $SiH_4$, $Si_2H_6$, $SiH_2Cl_2$, $SiHCl_3$, $SiCl_4$, or $SiF_4$. The gas containing silicon may also be diluted with $H_2$, or a mixture of $H_2$ and one or more of rare gas elements of one or more of He, Ar, Kr, and Ne. The dilution ratio is set to be in the range of 1:2 to 1:1,000. The pressure is set to be approximately in the range of 0.1 to 133 Pa. The power supply frequency is set to be 1 to 120 MHz, and preferably, 13 to 60 MHz. A substrate heating temperature may be set to be 300° C. or less, and preferably, 100 to 250° C. With respect to impurity elements contained in the film, each concentration of impurities for atmospheric constituents such as oxygen, nitrogen and carbon, is preferably set to be $1\times10^{20}/cm^3$ or less. In particular, the oxygen concentration is set to be $5\times10^{19}/cm^3$ or less, and preferably, $1\times10^{19}/cm^3$ or less.

As a specific example of a crystalline semiconductor layer, a semiconductor layer made from single crystal silicon, polycrystalline silicon, silicon germanium, or the like can be given. The crystalline semiconductor layer may be formed by laser crystallization. For example, the crystalline semiconductor layer may be formed by crystallization with use of a solid phase growth method using nickel or the like.

When a semiconductor layer is formed using an amorphous substance, e.g., amorphous silicon, it is preferable to use a light emitting device comprising a circuit which includes only N-channel transistors as the transistor 11 and other transistor (a transistor included in a circuit for driving a light emitting element). Alternatively, a light emitting device comprising a circuit which includes either N-channel transistors or P-channel transistors, may be employed. Also, a light emitting device comprising a circuit which includes both an N-channel transistor and a P-channel transistor, may be used.

The first interlayer insulating film 16 may include either plural layers as shown in FIGS. 19A to 19C or a single layer. Specifically, an interlayer insulating film 16a is formed using an inorganic material such as silicon oxide and silicon nitride. An interlayer insulating layer 16b is formed using acrylic, siloxane (which is a substance that has a skeleton structure formed by a silicon (Si)-oxygen (O) bond and includes at least hydrogen in a substituent), or a substance that can be formed by applying a liquid such as silicon oxide. An interlayer insulating film 16c is formed using a silicon nitride film containing argon (Ar). Further, the substances constituting the respective layers are not particularly limited thereto. Therefore, substances other than the above-mentioned substances may also be employed. Alternatively, a layer formed using a substance other than the above mentioned substances may also be provided in combination with the above described layers. Accordingly, the first interlayer insulating film 16 may be formed by using both an inorganic material and an organic material or by using either an inorganic material or an organic material.

The edge portion of the partition wall layer 18 preferably has a shape in which the radius of curvature is continuously varied. This partition wall layer 18 is formed by using acrylic, siloxane, resist, silicon oxide, or the like. Further, the partition wall layer 18 may be formed using any one or both an inorganic film and an organic film.

Each of FIGS. 19A and 19C shows the structure in which only the first interlayer insulating film 16 is provided between the transistors 11 and the light emitting elements 12. Alternatively, as shown in FIG. 19B, the first interlayer insulating film 16 (first interlayer insulating layers 16a and 16b) and a second interlayer insulting film 19 (second interlayer insulting layers 19a and 19b) may be provided between the transistor 11 and the light emitting element 12. In the light emitting device as shown in FIG. 19B, the first electrode 13 passes through the second interlayer insulating film 19 to be connected to the wiring 17.

The second interlayer insulating film 19 may include either plural layers or a single layer as well as the first interlayer insulating film 16. A second interlayer insulating film 19a is formed using acrylic, siloxane, or a substance, which can be formed by applying a liquid such as silicon oxide. A second interlayer insulating film 19b is formed using a silicon nitride film containing argon (Ar). The substances constituting the respective layers of the second interlayer insulating film are not particularly limited thereto. Therefore, substances other than the above-mentioned substances may be employed. Alternatively, a layer made from a substance other than the above-mentioned substances may be provided in combination with the films 19a and 19b. Accordingly, the second interlayer insulating film 19 may be formed by using both an inorganic material and an organic material or by using either an inorganic material or an inorganic material.

When the first electrode and the second electrode are both formed using a substance with a light transmitting property in the light emitting element 12, light generated in the light emitting element can be emitted through both the first electrode 13 and the second electrode 14 as shown in arrows in FIG. 19A. When only the second electrode 14 is formed using a substance with a light transmitting property, light generated in the light emitting element 12 can be emitted only through the second electrode 14 as shown in an arrow of FIG. 19B. In this case, the first electrode 13 is preferably formed using a material with high reflectance. Alternatively, a film (reflection film) formed using a material with high reflectance is preferably provided underneath the first electrode 13. When only the first electrode 13 is formed using a substance with a light transmitting property, light generated in the light emitting element 12 can be emitted only through the first electrode 13 as shown in an arrow of FIG. 19C. In this case, the second electrode 14 is preferably formed using a material with high reflectance or a reflection film is preferably provided over the second electrode 14.

Moreover, the layer 15 in which the layer containing a light emitting substance and a layer having low activation energy of electrical conductivity are laminated, may be stacked in the light emitting element 12 so as to operate the light emitting element when applying voltage thereto so that a potential of a first electrode 13 is higher than that of a second electrode 14. Alternatively, the layer 15 in which the layer containing a light emitting substance and a layer having low activation energy of electrical conductivity are laminated, may be stacked in the light emitting element 12 so as to operate the light emitting element when applying voltage to the light emitting element so that a potential of a second electrode 14 is lower than that of a first electrode 13. In the former case, a transistor 11 is an N-channel transistor. In the latter case, a transistor 11 is a P-channel transistor.

Figure 20:
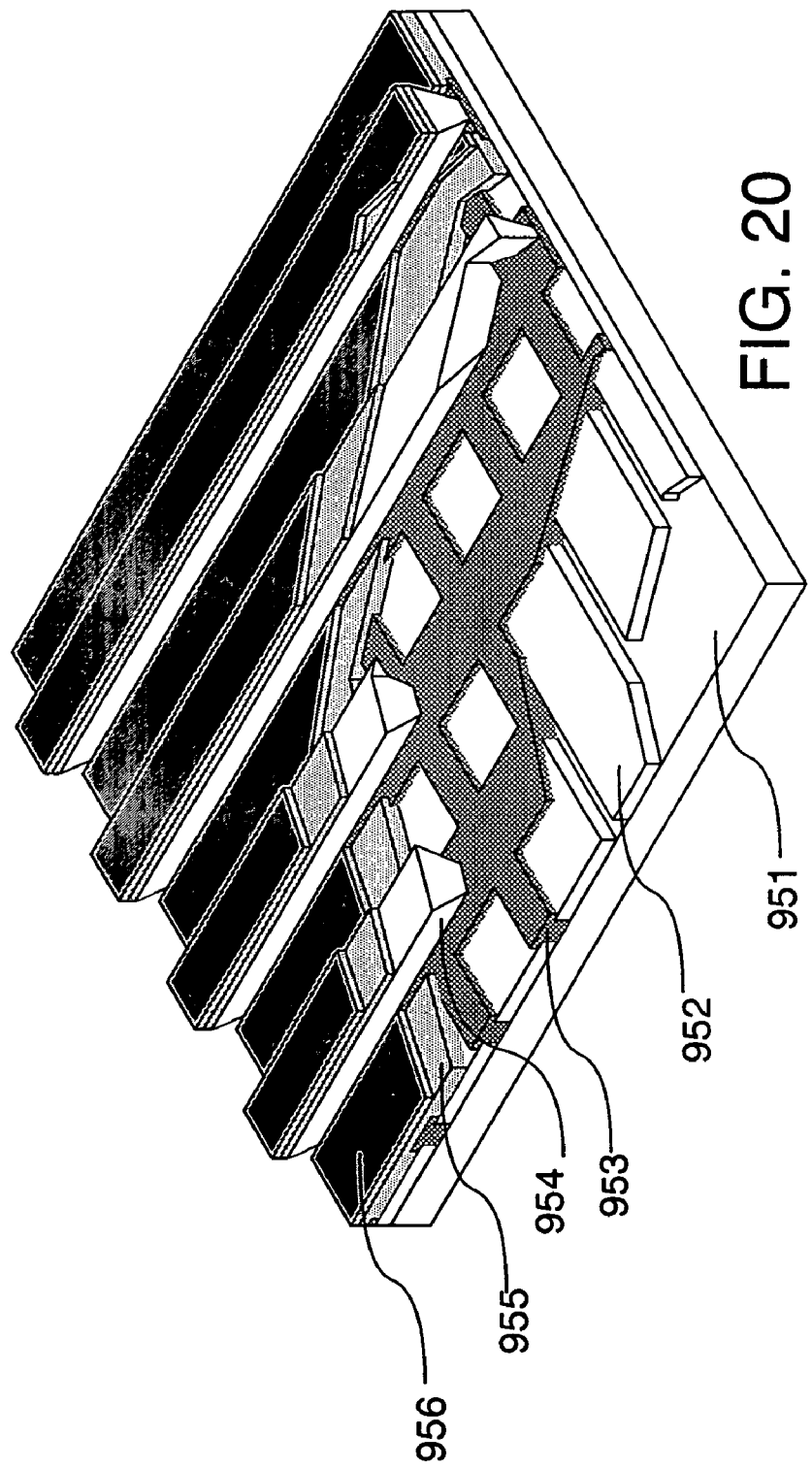
FIG. 20 is a diagram explaining one mode of a light emitting device of the present invention.

As set forth above, an active matrix light emitting device, which controls a light emitting element by using a transistor, is described in this embodiment mode. Alternatively, a passive light emitting device, which drives a light emitting element without providing a driving element such as a transistor, may also be employed. FIG. 20 shows a perspective view of a passive light emitting device manufactured in accordance with the present invention. In FIG. 20, a layer 955 having a multilayer structure, which includes a layer containing an aromatic hydrocarbon and a metal oxide, a light emitting layer, and the like, is provided between an electrode 952 and an electrode 953. An edge portion of the electrode 952 is covered with an insulating layer 953. A partition wall layer 954 is provided over the insulating layer 953. Sidewalls of the partition wall layer 954 are inclined so that a gap between one sidewall and the other sidewall is narrowed toward a surface of a substrate. That is, a cross section of the partition wall layer 954 in a short side direction has a trapezoidal shape in which a lower side (a side facing the same direction as a surface of the insulating layer 953 and being in contact with the insulating layer 953) is shorter than an upper side (a side facing the same direction as the surface of the insulating film 953 and being not contact with the insulating layer 953). Accordingly, by providing the partition wall layer 954, defects of the light emitting element due to static electricity can be prevented. In the passive light emitting device, utilizing a light emitting element of the present invention, which is driven at low driving voltage, makes it possible to drive the light emitting element at low power consumption.

Embodiment Mode 9

In a light emitting element including a layer containing an aromatic hydrocarbon and a metal oxide, which is provided between a pair of electrodes, concavity and convexity formed by crystallization of a layer provided between a pair of electrodes or operational defects caused by short-circuiting between the pair of electrodes due to concavity and convexity, which is formed on surfaces of the electrodes, can be reduced. Therefore, a light emitting device using such a light emitting element as a pixel is favorably operated with less display defects. Accordingly, by applying such a light emitting device to a display portion, an electronic appliance with less false recognition and the like of a display image due to display defects can be obtained. Moreover, a light emitting device using a light emitting element of the present invention as a light source can favorably emit light with less defects, which are caused by an operational defect of the light emitting element. Therefore, by using such a light emitting device of the present invention as a lighting portion such as a backlight, operational defects such as dark spots, which are locally formed due to defects of the light emitting element, can be reduced, thereby displaying images preferably. Furthermore, since a light emitting element in which a distance between a light emitting layer and each electrode is controlled by changing a thickness of a layer containing an aromatic hydrocarbon and a metal oxide has less variations in driving voltage due to the thickness of the layer containing an aromatic hydrocarbon and a metal oxide, and therefore, a light emitting device, which is driven at low driving voltage and emits light with good color purity, can be obtained. Therefore, by using such a light emitting device for a display portion, an electronic appliance requiring less power and being capable of providing images with good colors can be obtained.

Examples of electronic appliances mounted with light emitting devices of the present invention will be described in FIGS. 21A to 21C.

Figure 22:
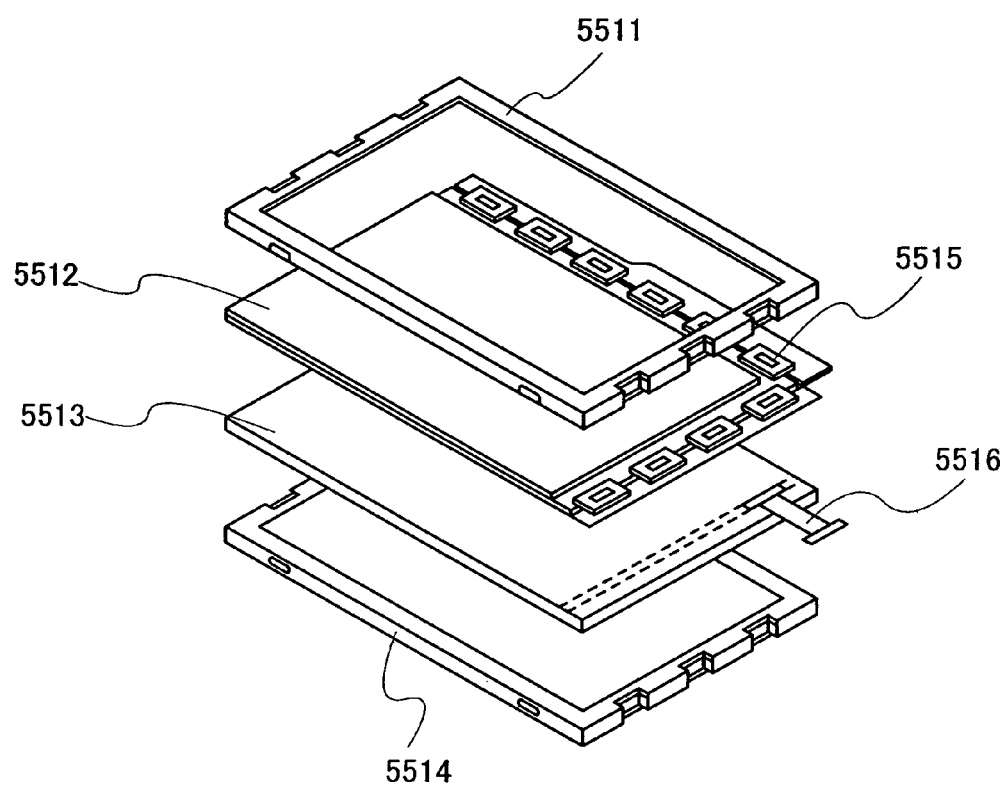
FIG. 22 is a diagram explaining a lighting device to which the present invention is applied.

FIG. 21A shows a personal computer manufactured according to the present invention, including a main body 5521, a housing 5522, a display portion 5523, a keyboard 5524, and the like. By incorporating a light emitting device using a light emitting element of the present invention as described in Embodiment Mode 1 or 2 (e.g., a light emitting device including the structure as described in Embodiment Mode 3 or 4) in a display portion, a personal computer having the display portion, which can provide display images with excellent colors along with less defects and less false recognition of display images, can be completed. Further, when a light emitting device using a light emitting element of the present invention as a light source is incorporated as a backlight, a personal computer can be completed. Specifically, as shown in FIG. 22, a lighting device in which a liquid crystal device 5512 and a light emitting device 5513 are built in a housing 5511 and a housing 5514 respectively may be incorporated as a display portion. As shown in FIG. 22, an external input terminal 5515 is mounted on the liquid crystal device 5512, whereas an external input terminal 5516 is mounted on the light emitting device 5513.

FIG. 21B shows a telephone manufactured according to the present invention, including a main body 5552, a display portion 5551, an audio output portion 5554, an audio input portion 5555, operation switches 5556 and 5557, an antenna 5553, and the like. By incorporating a light emitting device including a light emitting element of the present invention as a display portion, a telephone having the display portion, which can provide display images with excellent colors along with less defects and less false recognition of display images, can be completed.

FIG. 21C shows a television receiver manufactured according to the present invention, including a display portion 5531, a housing 5532, speakers 5533, and the like. By incorporating a light emitting device having a light emitting element of the present invention as a display portion, a television receiver having the display portion, which can provide display images with excellent colors along with less defects and less false recognition of display images, can be completed.

As set forth above, a light emitting device of the present invention is extremely suitable as being used as a display portion for various kinds of electronic appliances. Further, electronic appliances are not limited to the appliances described in this embodiment mode, and may be a picture recorder, a navigation device, and the like.

Embodiment 1

A method for manufacturing a light emitting element having a layer containing an aromatic hydrocarbon and a metal oxide between a pair of electrodes and operation characteristics thereof will be described below. In this embodiment, two light emitting elements (a light emitting element 1 and a light emitting element 2) having the same structure with the exception that molar ratios between the aromatic hydrocarbon and the metal oxide were different from each other were manufactured. Note that in this embodiment, t-BuDNA was used as the aromatic hydrocarbon and molybdenum oxide was used as the metal oxide.

Figure 23:
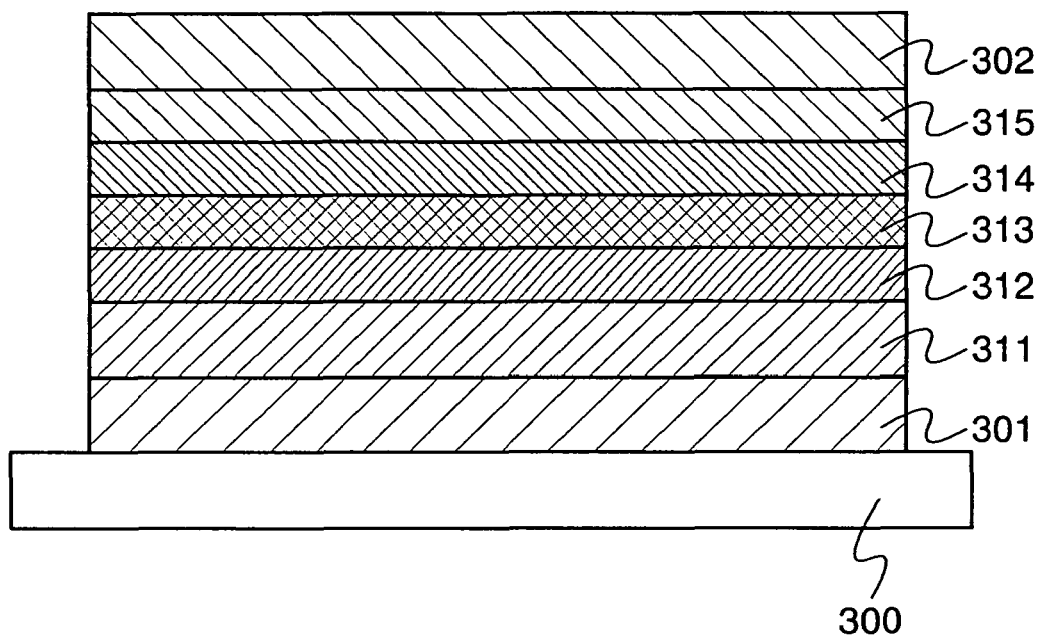
FIG. 23 is a diagram explaining a method for manufacturing a light emitting device of Embodiment 1.

As shown in FIG. 23, a first electrode 301 was formed over a substrate 300 using indium tin oxide containing silicon oxide to have a thickness of 110 nm. The first electrode was formed by sputtering.

Next, a first layer 311 containing t-BuDNA and molybdenum oxide was formed over the first electrode 301 by co-evaporation. Note that in this embodiment, the first layer 311 was formed by using molybdenum trioxide among molybdenum oxide as an evaporation material. The thickness of the first layer 311 was set to be 120 nm. Further, a weight ratio between t-BuDNA and molybdenum oxide contained in the light emitting element 1 was set to be 1:0.5=t-BuDNA:molybdenum oxide (a molar ratio was 1:1.7=t-BuDNA:molybdenum oxide). A weight ratio between t-BuDNA and molybdenum oxide contained in the light emitting element 2 was set to be 1:0.75=t-BuDNA: molybdenum oxide (a molar ratio was 1:2.5=t-BuDNA:molybdenum oxide). Note that, co-evaporation indicates an evaporation method by which materials are evaporated from a plurality of evaporation sources provided in one processing chamber, and the evaporated materials are deposited over an object to form a layer in which a plurality of substances are mixed.

Next, a second layer 312 was formed over the first layer 311 using NPB by evaporation. The thickness of the second layer 312 was set to be 10 nm. The second layer 312 served as a hole transporting layer when each of the light emitting elements was driven.

Subsequently, a third layer 313 containing $Alq_3$ and coumarin 6 was formed over the second layer 312 by co-evaporation. The thickness of the third layer 313 was set to be 37.5 nm. Further, a weight ratio between $Alq_3$ and coumarin 6 was set to be 1:0.01=$Alq_3$:coumarin 6 (a molar ratio was 1:0.013=$Alq_3$:coumarin 6). Accordingly, coumarin 6 was dispersed in a layer formed of $Alq_3$. When each of the light emitting elements was driven, the third layer 313 served as a light emitting layer.

Next, a fourth layer 314 was formed over the third layer 313 using $Alq_3$ by evaporation. The thickness of the fourth layer 314 was set to be 37.5 nm. When each of the light emitting elements was driven, the fourth layer 314 served as an electron transporting layer.

Then, a fifth layer 315 was formed over the fourth layer 314 using lithium fluoride by evaporation. The thickness of the fifth layer 315 was set to be 1 nm. When each of the light emitting elements was driven, the fifth layer 315 served as an electron injecting layer.

Next, a second electrode 302 was formed using aluminum over the fifth layer 315 by evaporation to have a thickness of 200 nm.

Figure 24:
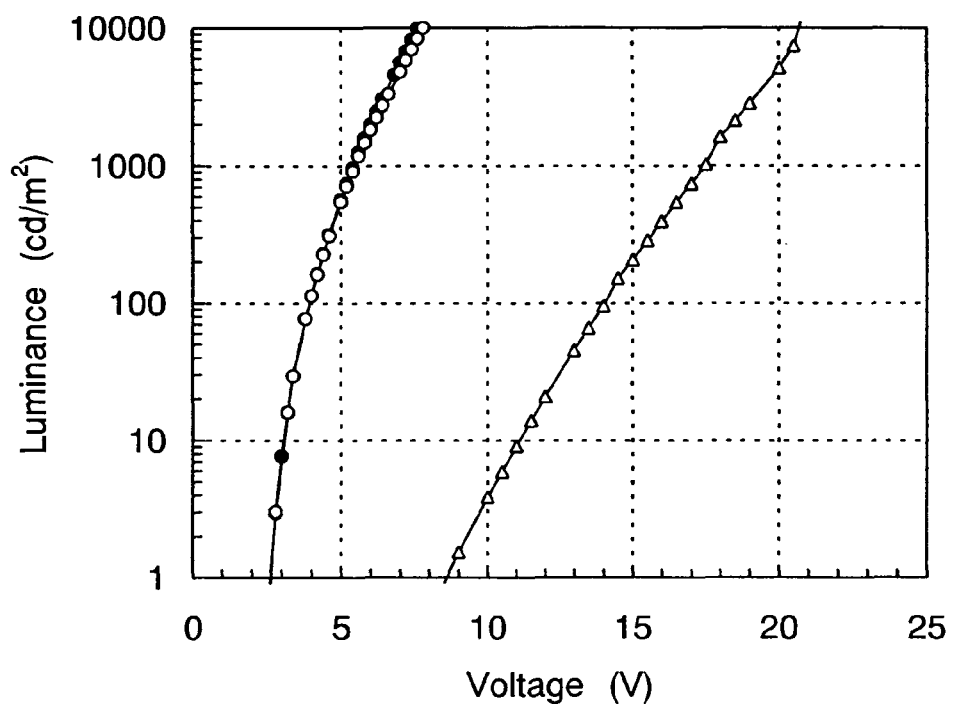
FIG. 24 is a graph showing voltage-luminance characteristics of a light emitting element of Embodiment 1.
Figure 25:
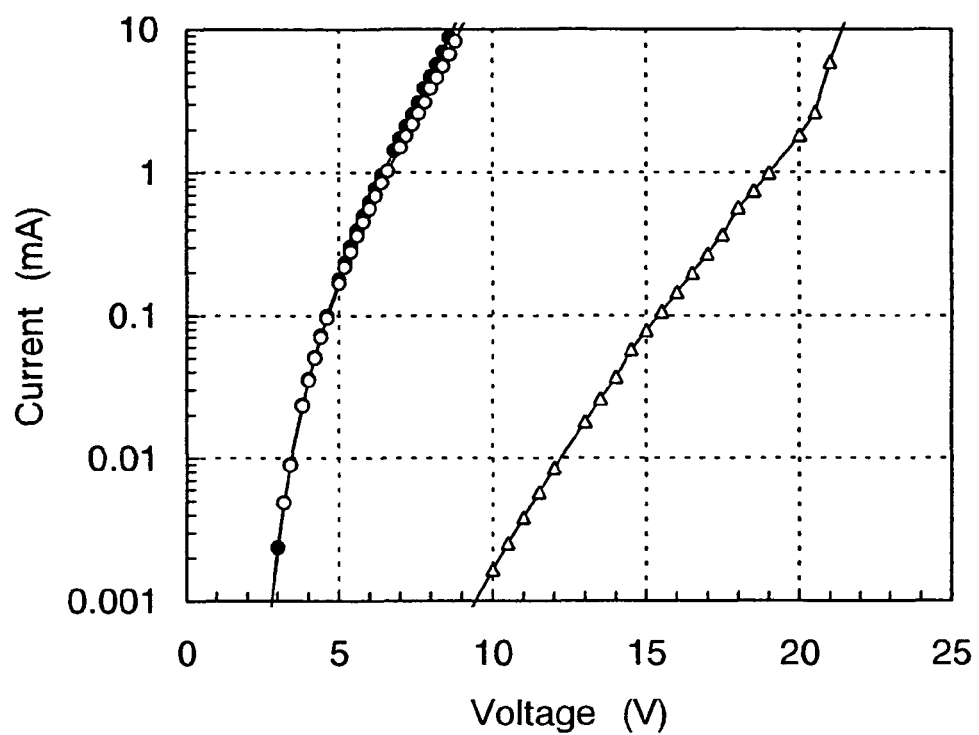
FIG. 25 is a graph showing voltage-current characteristics of a light emitting element of Embodiment 1.
Figure 26:
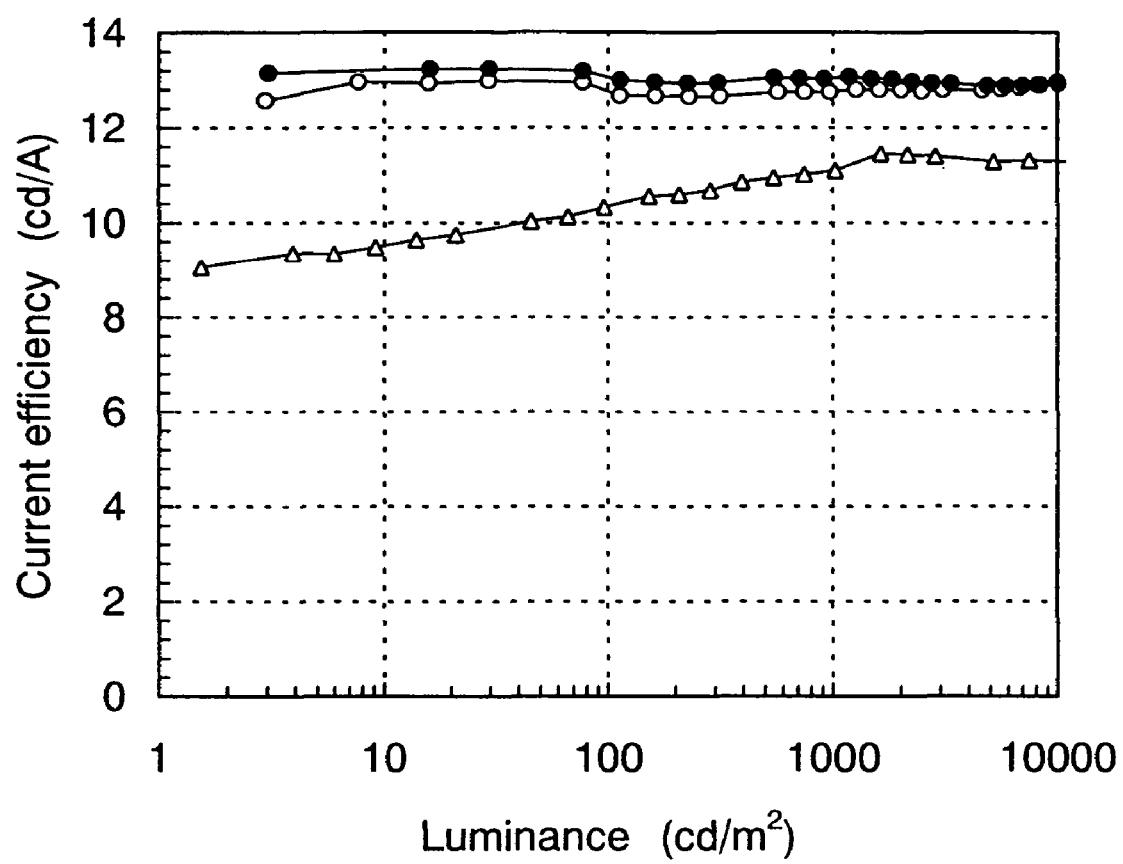
FIG. 26 is a graph showing luminance-current efficiency characteristics of a light emitting element of Embodiment 1.

Measurement results of operation characteristics of the light emitting elements manufactured above are shown in FIGS. 24 to 26. The operation characteristics thereof were measured by applying voltage to each of the light emitting elements so that potential of the first electrode 301 was higher than that of the second electrode 302. FIG. 24 is a graph showing voltage-luminance characteristics of the light emitting elements, wherein a horizontal axis indicates voltage (V) and a vertical axis indicates luminance ($cd/m^2$). FIG. 25 is a graph showing voltage-current characteristics of the light emitting elements, wherein a horizontal axis indicates voltage (V) and a vertical axis indicates current (mA). FIG. 26 is a graph showing luminance-current efficiency characteristics of the light emitting elements, wherein a horizontal axis indicates luminance ($cd/m^2$) and a vertical axis indicates current efficiency (cd/A). In FIGS. 24 to 26, plots represented by black circles represent characteristics of the light emitting element 1 whereas plots represented by white circles represent characteristics of the light emitting element 2.

Comparative Example

As a comparative example with respect to the light emitting elements manufactured in Embodiment 1, a light emitting element in which a layer only including t-BuDNA is provided between a pair of electrodes will be described. Note that, differing from the light emitting elements 1 and 2 described in Embodiment 1, in the light emitting element of the comparative example, the layer only including t-BuDNA is provided instead of the first layer 311 containing t-BuDNA and molybdenum oxide; however, other structure of the light emitting element of the comparative example is the same as that of the light emitting elements 1 and 2 described in Embodiment 1. A method for manufacturing the light emitting element of the comparative example is not described here. When the light emitting element of the comparative example was driven, results of plots represented by white triangles can be obtained.

When comparing Embodiment 1 with the comparative example, it is known that a favorable light emitting element being driven at low driving voltage, in which by providing the layer containing an aromatic hydrocarbon and a metal oxide between the pair of electrodes, light emission start voltage (time of starting light emission at luminance of 1 $cd/m^2$ is referred to as light emission start, and voltage applied in this time is referred to as light emission start voltage) is low and applied voltage required for making the light emitting element emit light at predetermined luminance is also low, can be obtained. Further, it is known that by providing the layer containing an aromatic hydrocarbon and a metal oxide between the pair of electrodes, a favorable light emitting element with high current efficiency when making the light emitting element emit light at predetermined luminance, can be obtained.

Embodiment 2

Voltage-current characteristics of three samples 1 to 3 each having a layer containing an aromatic hydrocarbon and a metal oxide between a pair of electrodes and a sample 4 having a layer only including an aromatic hydrocarbon between a pair of electrodes were measured. As a result, it is known that carriers were more easily injected from the electrodes and electric conductivity was higher in the layer containing an aromatic hydrocarbon and a metal oxide than the layer only including an aromatic hydrocarbon.

Figure 27:
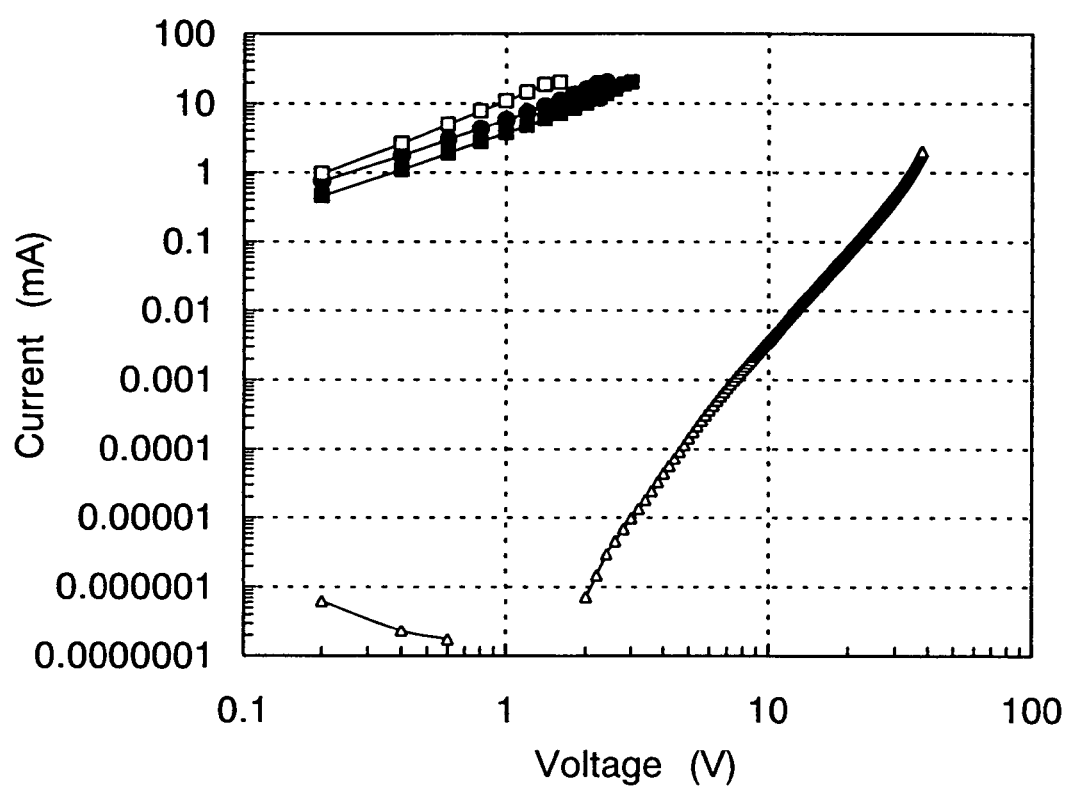
FIG. 27 is a graph showing voltage-current characteristics of a light emitting element of Embodiment 2.

Measurement results of voltage-current characteristics are shown in FIG. 27. In FIG. 27, a horizontal axis represents voltage (V) whereas a vertical axis represents current (mA). Further, in FIG. 27, plots represented by black circles represent characteristics of the sample 1, plots represented by black squares represent characteristics of the sample 2, plots represented by white squares represent characteristics of the sample 3, and plots represented by white triangles represent characteristics of the sample 4.

Each of the samples 1 to 3 used in the measurement had a structure in which a mixed layer (200 nm in thickness) containing both an aromatic hydrocarbon and a metal oxide was provided between an electrode (110 nm in thickness) made from indium tin oxide containing silicon oxide and an electrode (200 nm in thickness) made from aluminum. The sample 4 had a structure in which a layer (200 nm in thickness) made from an aromatic hydrocarbon (t-BuDNA was used as an aromatic hydrocarbon in this embodiment) was provided between an electrode (110 nm in thickness) made from indium tin oxide containing silicon oxide and an electrode (200 nm in thickness) made from aluminum. Weight ratios between the aromatic hydrocarbon and the metal oxide contained in each layer provided between the pair of electrodes were differed in the samples 1 to 3. In the sample 1, the weight ratio between the aromatic hydrocarbon and the metal oxide was set to be 1:0.5=t-BuDNA:molybdenum oxide. In the sample 2, the weight ratio between the aromatic hydrocarbon and the metal oxide was set to be 2:0.75=t-BuDNA:molybdenum oxide. In the sample 3, the weight ratio between the aromatic hydrocarbon and the metal oxide was set to be 1:1=t-BuDNA:molybdenum oxide. Note that in this embodiment, each mixed layer was formed by using t-BuDNA as an aromatic hydrocarbon and molybdenum trioxide as a metal oxide.

Embodiment 3

Figure 28:
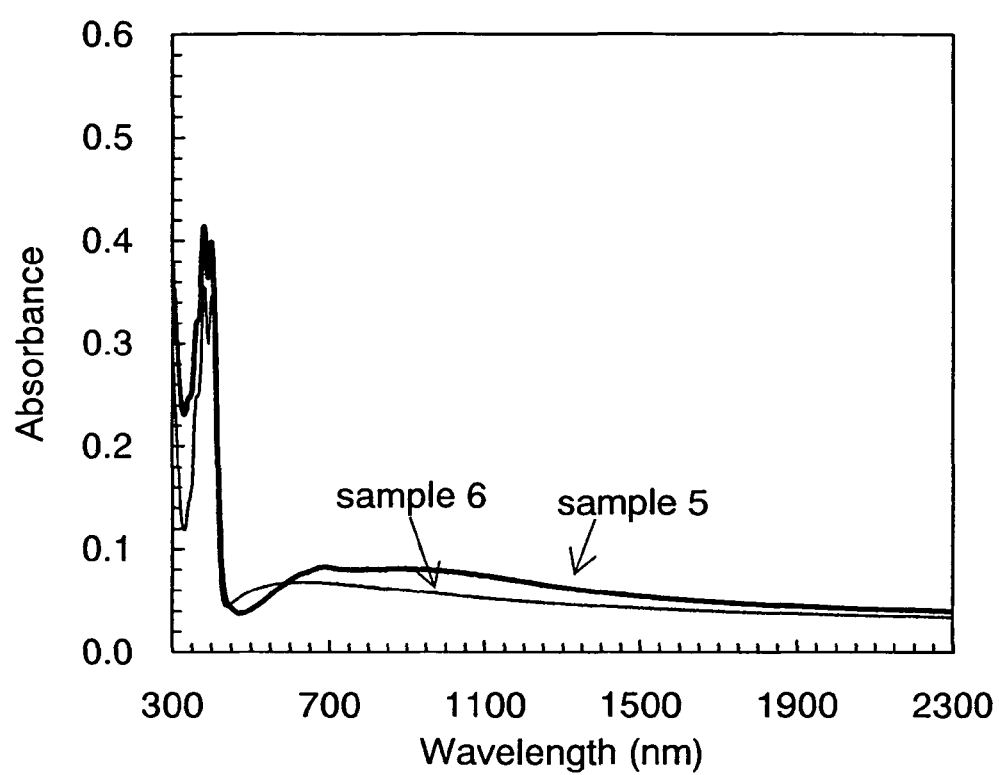
FIG. 28 is a graph showing an absorption spectrum of an element of Embodiment 3.
Figure 29:
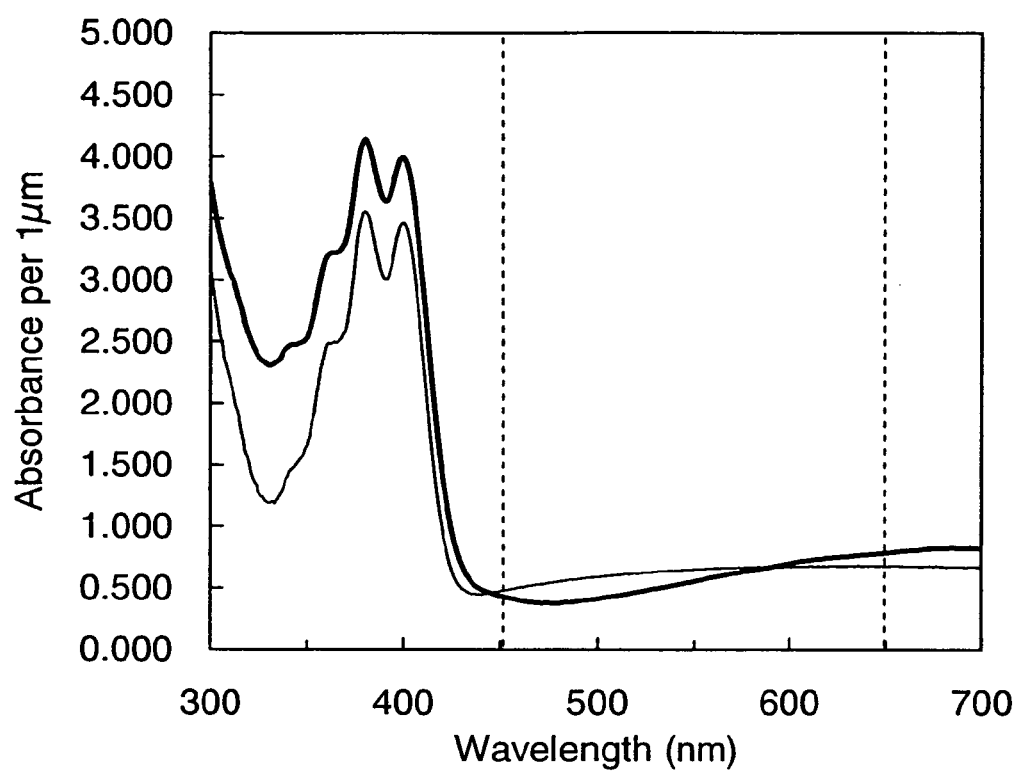
FIG. 29 is a graph showing absorbance per 1 μm of an element of Embodiment 3.
Figure 30:
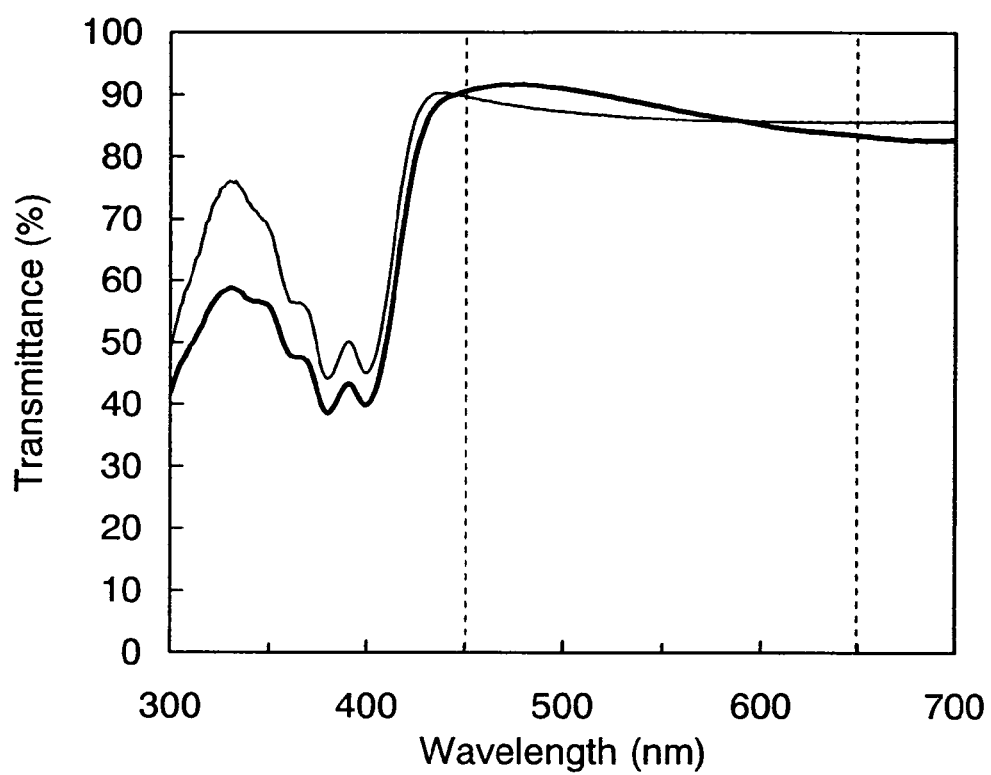
FIG. 30 is a graph showing transmittance of an element of Embodiment 3.

An absorption spectrum of a sample 5 in which a mixed layer containing an aromatic hydrocarbon and a metal oxide was formed over a glass substrate by co-evaporation and an absorption spectrum of a sample 6 in which a layer only including an aromatic hydrocarbon was formed over a glass substrate by evaporation were measured. As a result of the measurement, it was known that the samples 5 and 6 showed absorption derived from charge transfer in a spectrum of 600 to 1,200 nm. Further, in this embodiment, the mixed layer of the sample 5 was formed using t-BuDNA as the aromatic hydrocarbon and molybdenum trioxide as the metal oxide so that a weight ratio between t-BuDNA and molybdenum trioxide was set to be 4:2=t-BuDNA:molybdenum trioxide=and the thickness of the mixed layer was set to be 100 nm. Further, the layer only including the same aromatic hydrocarbon as the sample 6 was formed by using t-BuDNA as the aromatic hydrocarbon to have a thickness of 100 nm. Measurement results of absorption spectrums of each sample are shown in FIG. 28. In FIG. 28, a horizontal axis indicates a wavelength (nm) whereas a vertical axis indicates absorbance (with no unit). Further, a heavy curved line indicates absorption spectrums of the sample 5 whereas a thin curved line indicates absorption spectrums of the sample 6. FIG. 29 is a graph showing absorbance (with no unit) per 1 μm in thickness of the mixed layer based on data of FIG. 28. In FIG. 29, a horizontal axis indicates a wavelength (nm) whereas a vertical axis indicates absorbance (with no unit) per 1 μm in thickness. According to FIG. 29, it is known that absorbance per 1 μm in thickness in a wavelength region of 450 to 650 nm is 0.3 to 0.8. Further, FIG. 30 is a graph showing wavelength dependence of transmittance, which is obtained based on measurement results of the absorption spectrums. In FIG. 29, a horizontal axis represents a wavelength (nm) whereas a vertical axis represents transmittance (%). According to FIG. 30, it is known that transmittance with respect to light in the spectrum of 450 to 650 nm is 83 to 93% and difference between the two extreme values is 10% or less, that is, changes in transmittance, which are dependent on the wavelengths of transmitted light, are extremely small.

Embodiment 4

Figure 31:
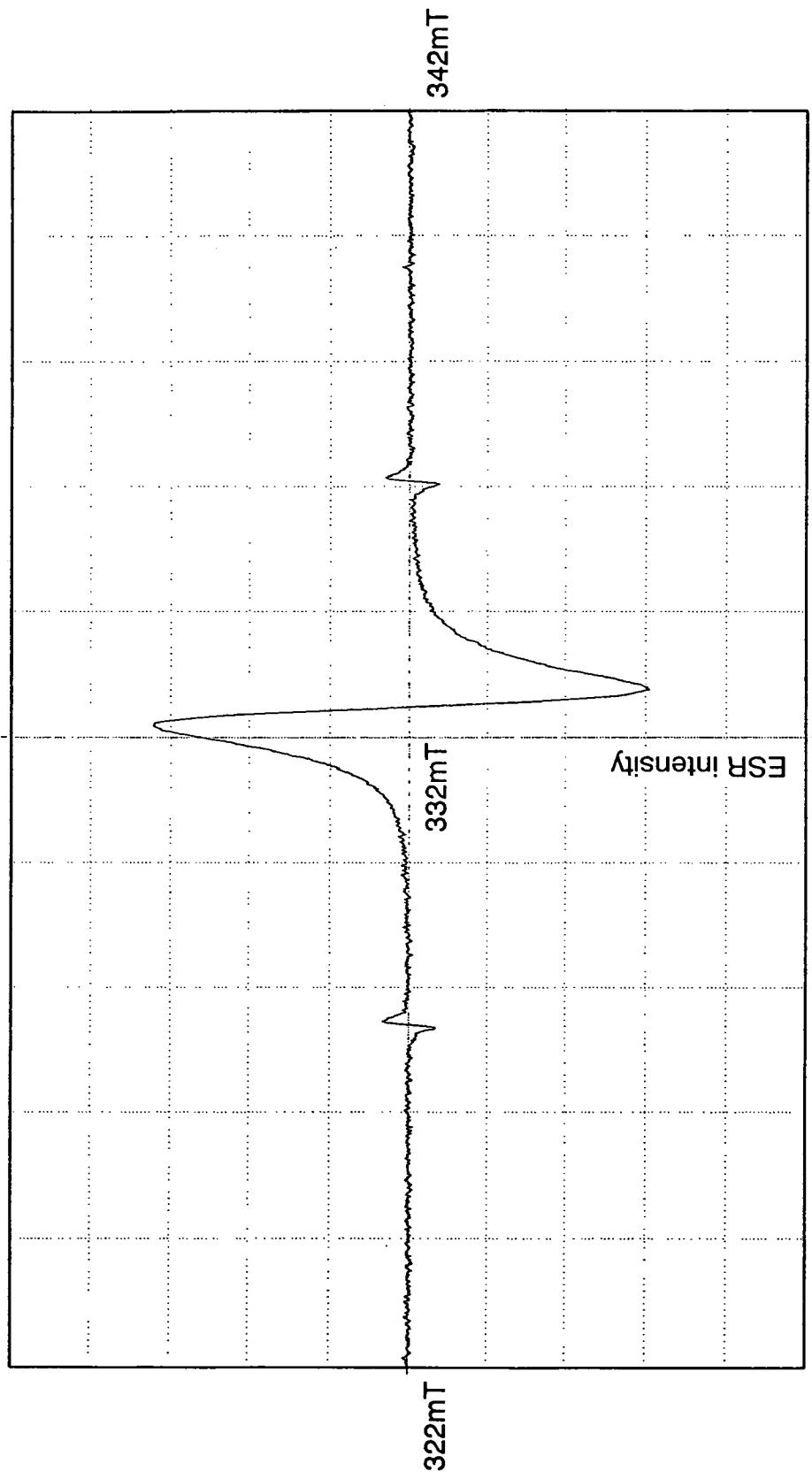
FIG. 31 is a graph showing an ESR spectrum of a sample 7.
Figure 32:
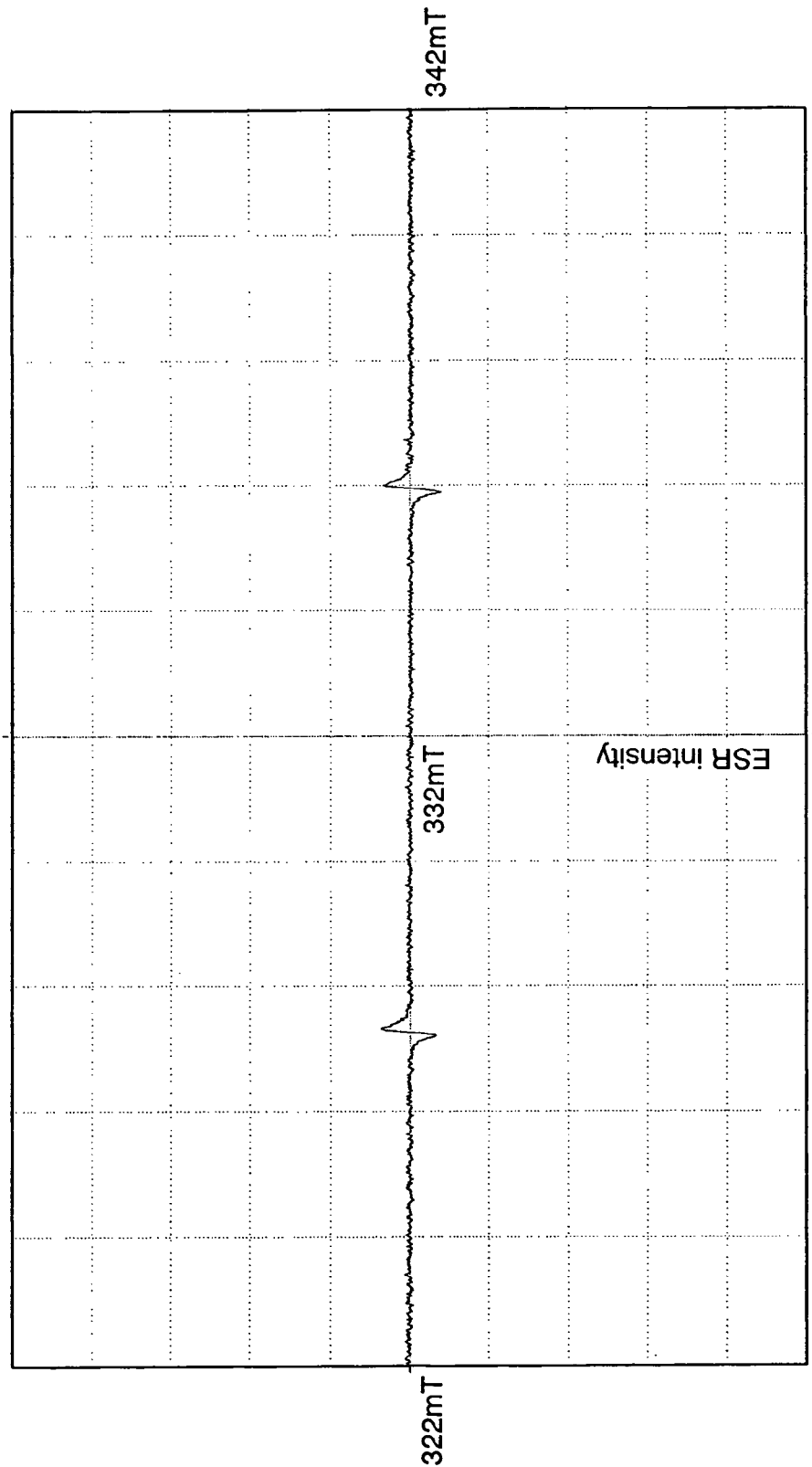
FIG. 32 is a graph showing an ESR spectrum of a sample 8.
Figure 33:
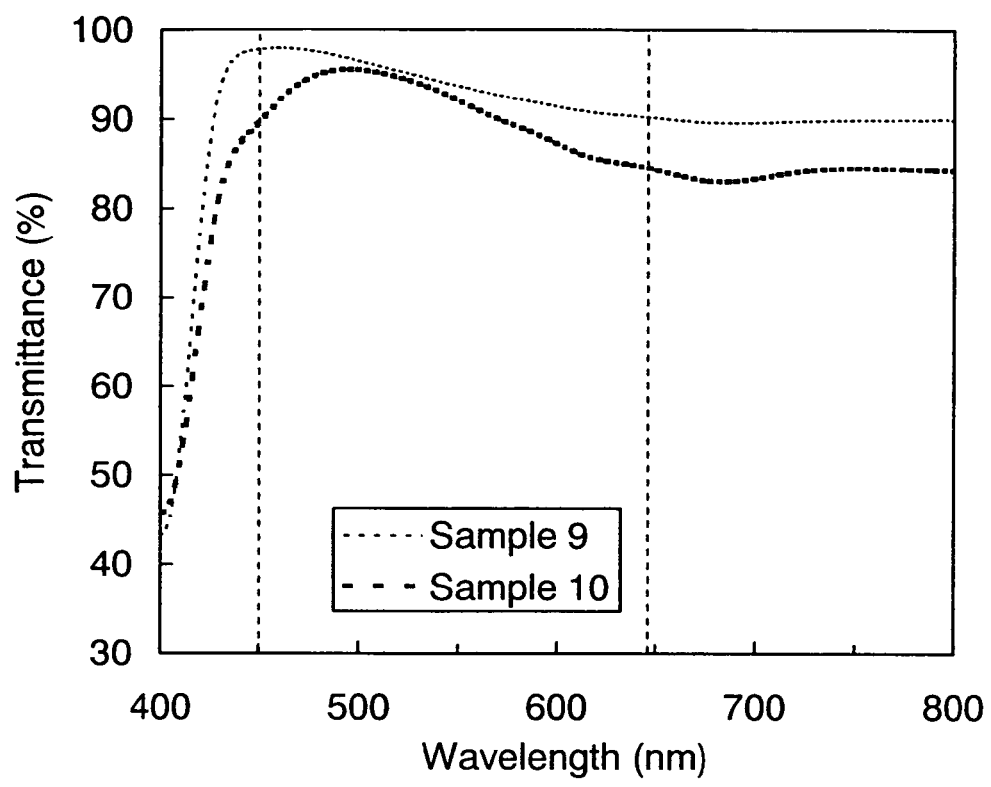
FIG. 33 is a graph showing wavelength dependence of transmittance of samples 9 and 10.
Figure 34:
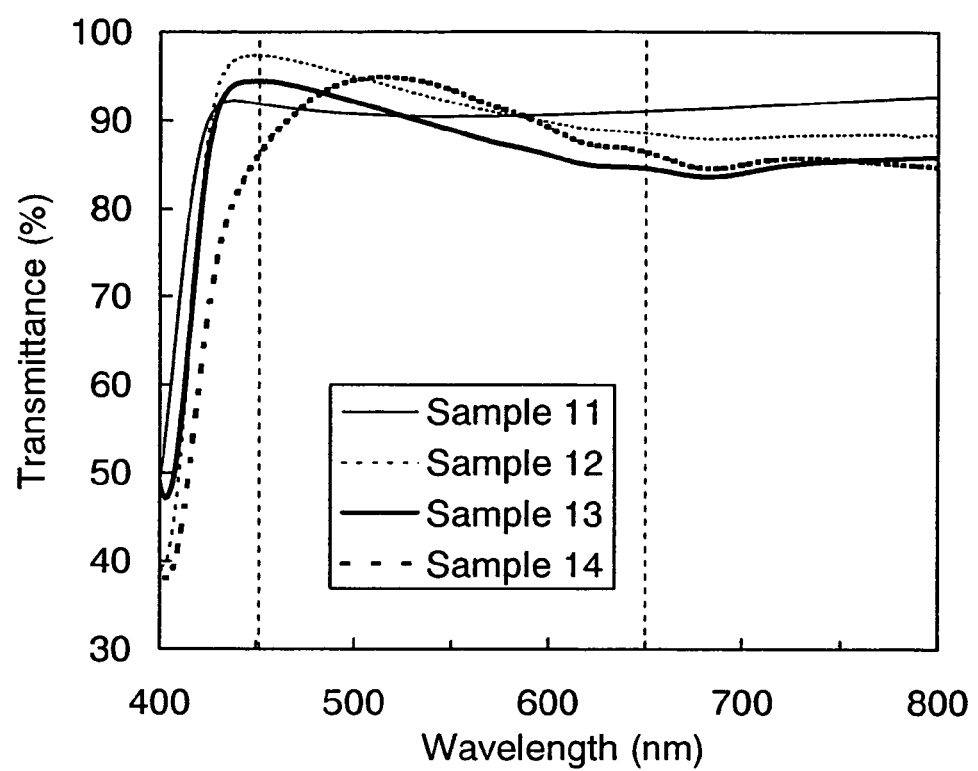
FIG. 34 is a graph showing wavelength dependence of transmittance of samples 11 to 14.
Figure 35:
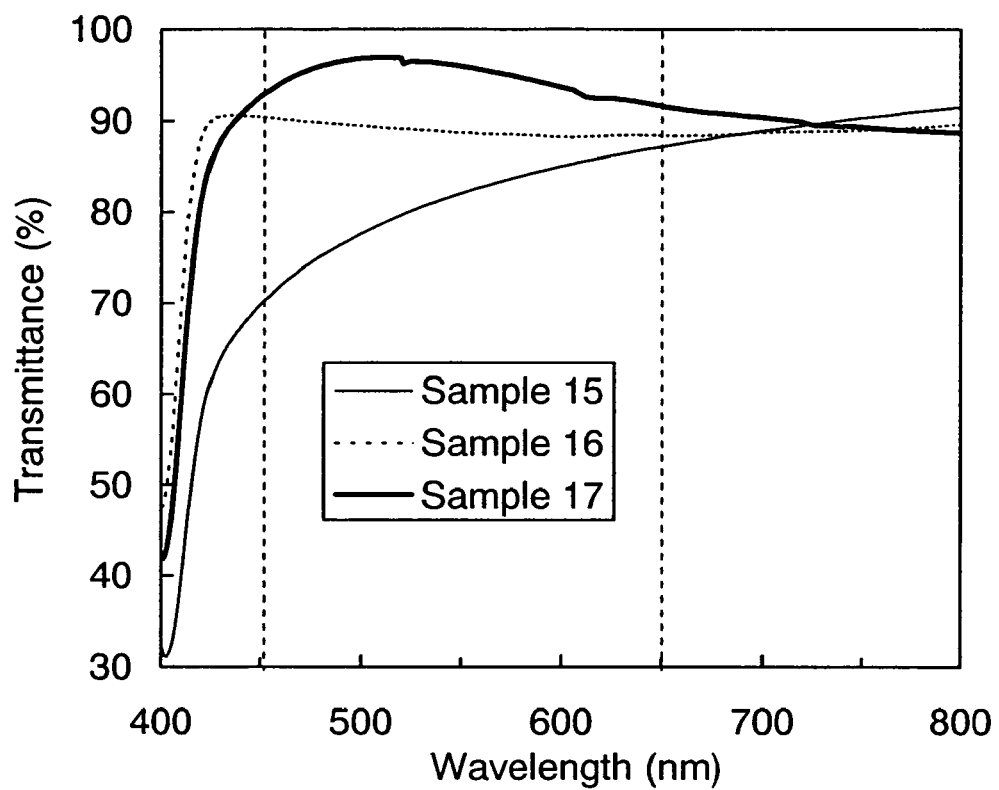
FIG. 35 is a graph showing wavelength dependence of transmittance of samples 15 to 17.
Figure 36:
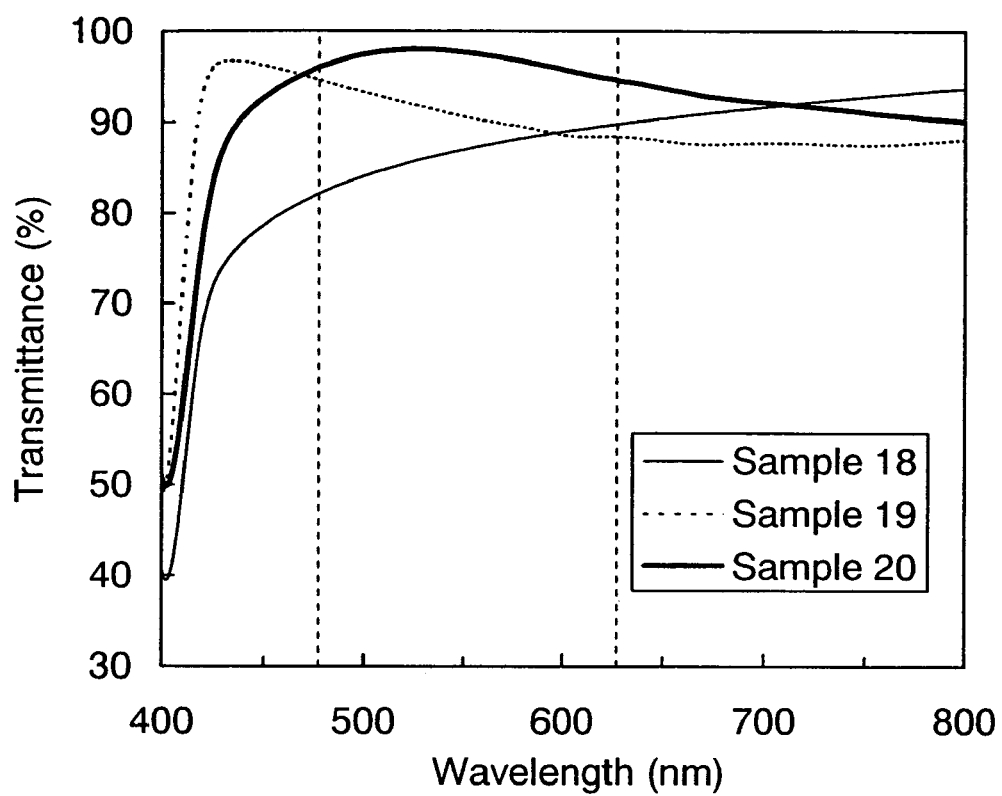
FIG. 36 is a graph showing wavelength dependence of transmittance of samples 18 to 20.

A sample 7 in which a mixed layer containing both an aromatic hydrocarbon and metal oxide was formed over a quartz substrate by co-evaporation and a sample 8 in which a layer only including an aromatic hydrocarbon was formed over a quartz substrate by evaporation were measured by an electron spin resonance (ESR) technique at a room temperature. As a result, it was known that unpaired electrons existed in the mixed layer containing both an aromatic hydrocarbon and a metal oxide, that is, charge transfer complexes were generated therein. Note that in this embodiment mode, the mixed layer of the sample 7 was formed with a thickness of 200 nm by using t-BuDNA as the aromatic hydrocarbon and molybdenum trioxide as the metal oxide so that a weight ratio between t-BuDNA and molybdenum trioxide was set to be 4:2=t-BuDNA:molybdenum trioxide. Further, the layer only including the same aromatic hydrocarbon as the sample 8 was formed using t-BuDNA as the aromatic hydrocarbon to have a thickness of 200 nm. Measurement results of the respective samples are shown in FIG. 31 and FIG. 32. FIG. 31 shows ESR spectrums of the sample 7 whereas FIG. 32 shows ESR spectrums of the sample 8. According to FIG. 31 and FIG. 32, it is known that ESR spectrum showing existence of unpaired electrons was detected. Further, according to the ESR measurement, it was known that, in the sample 7, a g-value was 2.0027, a line width ($\Delta H$) was 0.58 mT, and a spin concentration was $1.7 \times 10^{20}$ spin/cm$^3$. Note that the spin concentration is a value obtained by a calculation in a case where the thickness of the mixed layer was set to be 200 nm.

Embodiment 5

After manufacturing samples 9 to 20 in each of which a mixed layer or a layer only including an aromatic hydrocarbon was formed over a glass substrate, absorption spectrums of the respective samples were measured to obtain wavelength dependence of transmittance based on the measurement results. In each of the samples 9,10, 12, 13, 14, 16, 17, 19, and 20, a mixed layer containing both an aromatic hydrocarbon and a metal oxide was formed over a glass substrate by co-evaporation to have a thickness of 100 nm. Each of the samples 11, 15, and 18 was a sample in which a layer only including an aromatic hydrocarbon was formed to have a thickness of 10 nm over a glass substrate by evaporation. In each of the samples 9 to 20, substances used as an aromatic hydrocarbon, substances used as a metal oxide, and mixture ratios of these substances are shown in Table 1. Note that in this embodiment, molybdenum trioxide ($MoO_3$) was used among molybdenum oxide as a metal oxide.

TABLE 1

| Sample | Aromatic hydrocarbon | Metal oxide | Mixture ratio (weight ratio) Aromatic hydrocarbon:Metal oxide |
|---|---|---|---|
| 9 | t-BuDNA | molybdenum oxide | 4:1 |
| 10 | t-BuDNA | molybdenum oxide | 4:4 |
| 11 | DNA | Non | 4:0 |
| 12 | DNA | molybdenum oxide | 4:1 |
| 13 | DNA | molybdenum oxide | 4:2 |
| 14 | DNA | molybdenum oxide | 4:4 |
| 15 | DPPA | Non | 4:0 |
| 16 | DPPA | molybdenum oxide | 4:2 |
| 17 | DPPA | molybdenum oxide | 4:4 |
| 18 | DPAnth | Non | 4:0 |
| 19 | DPAnth | molybdenum oxide | 4:2 |
| 20 | DPAnth | molybdenum oxide | 4:4 |

Note that each of t-BuDNA, DNA, DPPA, and DPAnth is an aromatic hydrocarbon having 26 to 60 carbon atoms including a structure as shown below.

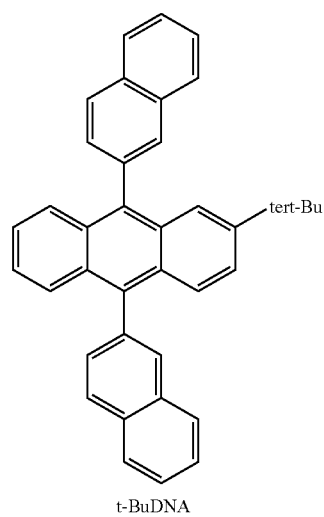

t-BuDNA

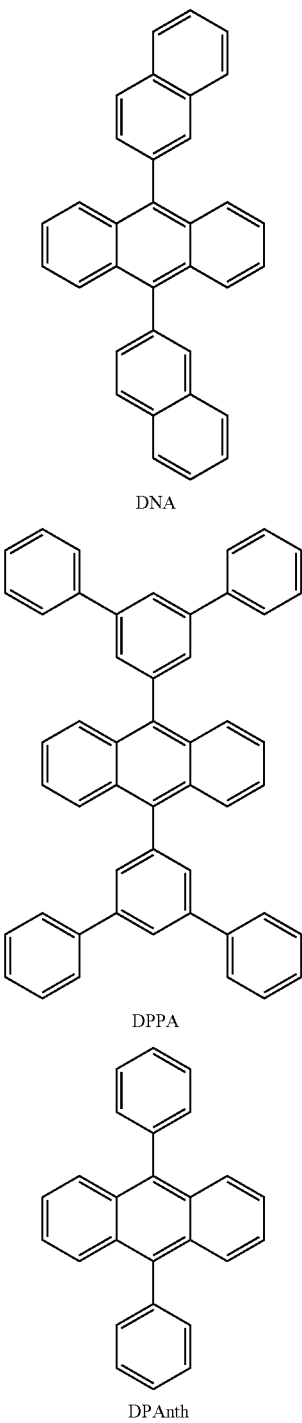

DNA

DPPA

DPAnth

Graphs showing wavelength dependence of transmittance are shown in FIGS. 33 to 36. In each of FIGS. 33 to 36, a horizontal axis represents a wavelength (nm) whereas a vertical axis represents transmittance (%). According to FIGS. 33 to 36, it is known that in a case of forming a mixed layer by combining any one of aromatic hydrocarbons having 26 to 60 carbon atoms with a metal oxide, transmittance with respect to light in a spectrum of 450 to 650 nm is within a range of 83 to 98%, and therefore, such transmittance is extremely favorable. Further, it is also known that change in transmittance, which is dependent on the wavelength of transmitted light, is extremely small, and therefore, light with any wavelength can be favorably transmitted.

Embodiment 6

Voltage-current characteristics of a sample 21 having a mixed layer containing both an aromatic hydrocarbon and a metal oxide between a pair of electrodes were measured. As a result, it was known that the mixed layer containing both an aromatic hydrocarbon and a metal oxide showed favorable conductivity.

Figure 37:
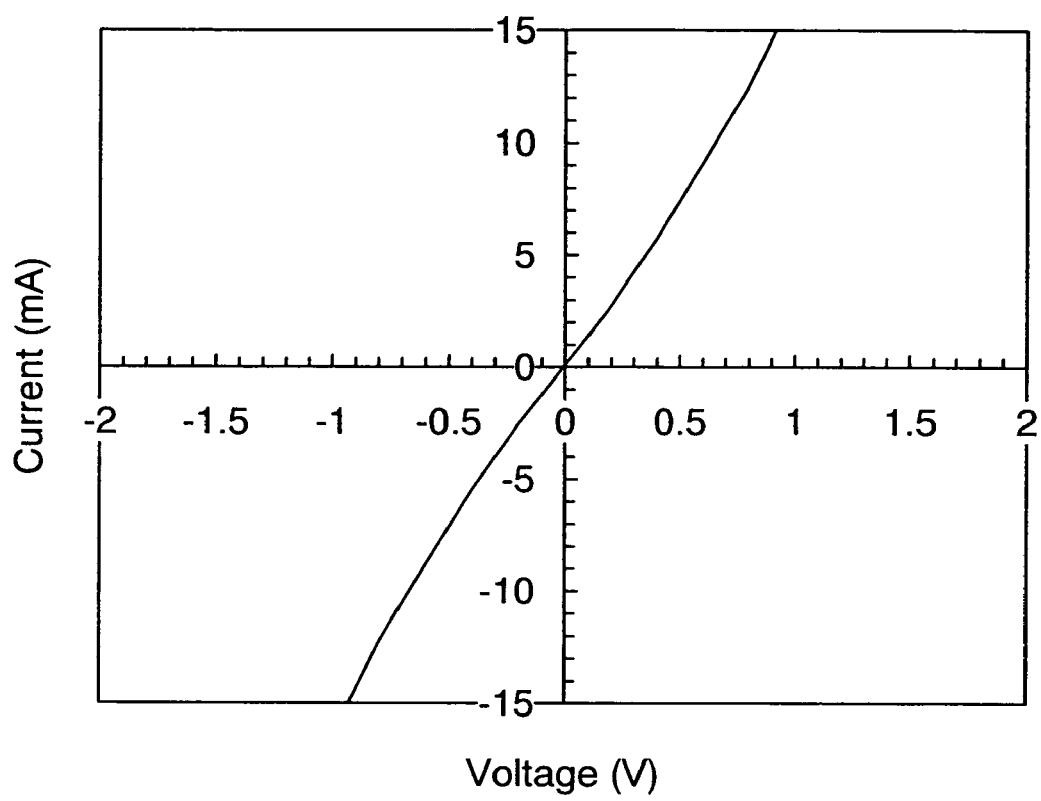
FIG. 37 is a graph showing voltage-current characteristics of a sample 21.

FIG. 37 shows measurement results of the voltage-current characteristics. In FIG. 37, a horizontal axis represents voltage (V) whereas a vertical axis represents current (mA).

In the sample 21 used in the measurement, an element having a structure in which a mixed layer (200 nm in thickness) containing both an aromatic hydrocarbon and a metal oxide was interposed between an electrode (110 nm in thickness) made from indium tin oxide containing silicon oxide and an electrode (200 nm in thickness) made from aluminum, was formed over a glass substrate. A weight ratio of the substances contained in the mixed layer was set to be 1:0.5=DNA:molybdenum oxide. Note that DNA was used as the aromatic hydrocarbon in this embodiment. Further, as a metal oxide, molybdenum trioxide ($MoO_3$) was used among molybdenum oxide.

Embodiment 7

A method for manufacturing a light emitting element having a layer containing an aromatic hydrocarbon and a metal oxide between a pair of electrodes and operation characteristics thereof will be described below. Note that in this embodiment, three light emitting elements (light emitting elements 3 to 5) having a similar structure with the exception that thicknesses of mixed layers are different from one another were manufactured. Further, t-BuDNA was used as the aromatic hydrocarbon whereas molybdenum oxide was used as the metal oxide in this embodiment.

Further, each of the light emitting elements of this embodiment is similar to the light emitting element described in Embodiment 1 since each of the light emitting elements had a structure in which a mixed layer, a hole transporting layer, a light emitting layer, an electron transporting layer, and an electron injecting layer are provided between a pair of electrodes. Accordingly, the light emitting elements of this embodiment will be described with reference to FIG. 23, which was used in explanation of Embodiment 1.

As shown in FIG. 23, a first electrode 301 was formed over a substrate 300 using indium tin oxide containing silicon oxide to have a thickness of 110 nm. Note that the first electrode was formed by sputtering.

Next, a first layer 311 containing t-BuDNA and molybdenum oxide was formed over the first electrode 301 by co-evaporation. Note that in this embodiment, the first layer 311 was formed by using molybdenum trioxide among molybdenum oxide as an evaporation material. The thicknesses of the first layers 311 of the light emitting elements were different from one another. In the light emitting element 3, the first layer 311 was formed to have a thickness of 20. In the light emitting element 4, the first layer 311 was formed to have a thickness of 50 nm. In the light emitting element 5, the first layer 311 was formed to have a thickness of 150 nm. Further, in the first layer 311 of each of the light emitting elements 3 to 5, a concentration of molybdenum oxide was set to be 10 volume %. Preferably, prior to being evaporated, molybdenum oxide was heated at 450 to 550° C. under an atmosphere containing nitrogen gas or inert gas so as to remove moisture contained in an evaporation material. This can prevent reduction in degree of vacuum so that evaporation can be performed in more stable state.

Next, a second layer 312 was formed over the first layer 311 using NPB by evaporation. The thickness of the second layer 312 was set to be 10 nm. The second layer 312 served as a hole transporting layer when each of the light emitting elements was driven.

Subsequently, a third layer 313 containing $Alq_3$ and N,N'-diphenylquinacridone (abbreviation: DPQd) was formed over the second layer 312 by co-evaporation. The thickness of the third layer 313 was set to be 40 nm. Further, a weight ratio between $Alq_3$ and DPQd was set to be 1:0.005=$Alq_3$:DPQd. Accordingly, DPQd was dispersed in a layer made from $Alq_3$. When each of the light emitting elements was driven, the third layer 313 served as a light emitting layer.

Next, a fourth layer 314 was formed over the third layer 313 using $Alq_3$ by evaporation. The thickness of the fourth layer 314 was set to be 30 nm. When each of the light emitting elements was driven, the fourth layer 314 served as an electron transporting layer.

Then, a fifth layer 315 was formed over the fourth layer 314 using lithium fluoride by evaporation. The thickness of the fifth layer 315 was set to be 1 nm. When each of the light emitting elements was driven, the fifth layer 315 served as an electron injecting layer.

Next, a second electrode 302 was formed using aluminum over the fifth layer 315 by evaporation to have a thickness of 200 nm.

Figure 38:
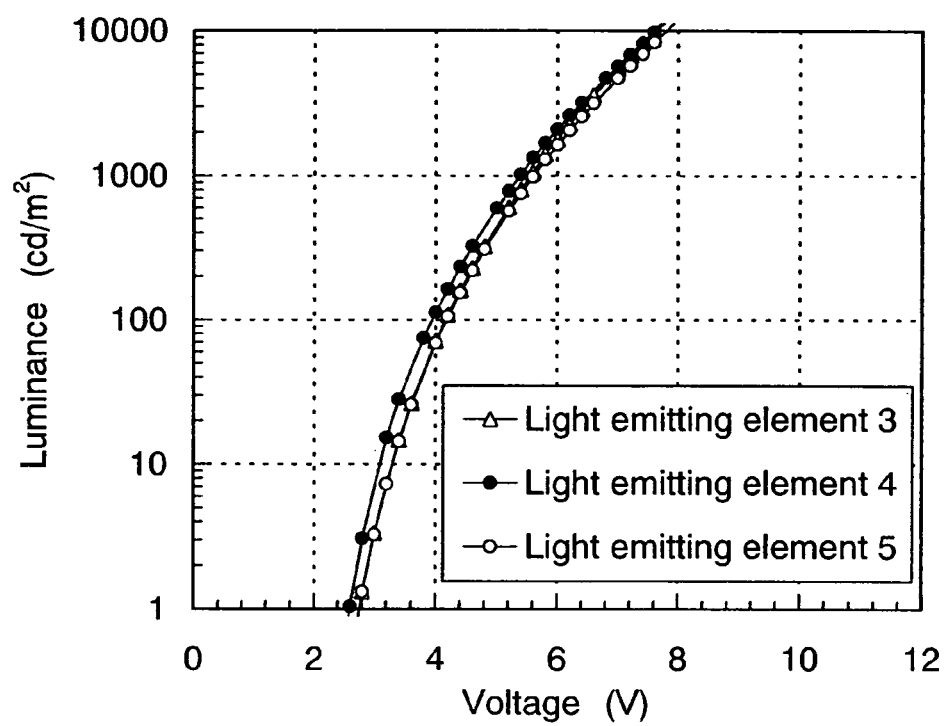
FIG. 38 is a graph showing voltage-luminance characteristics of light emitting elements 3 to 5.
Figure 39:
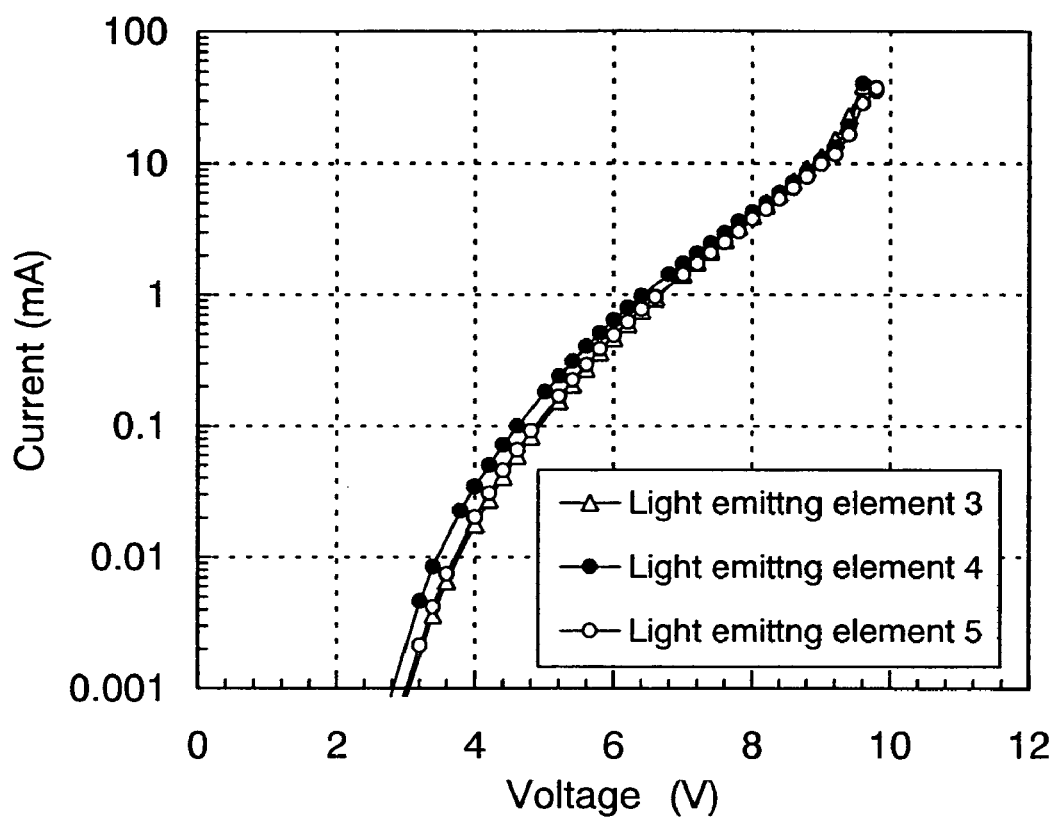
FIG. 39 is a graph showing voltage-current characteristics of the light emitting elements 3 to 5.
Figure 40:
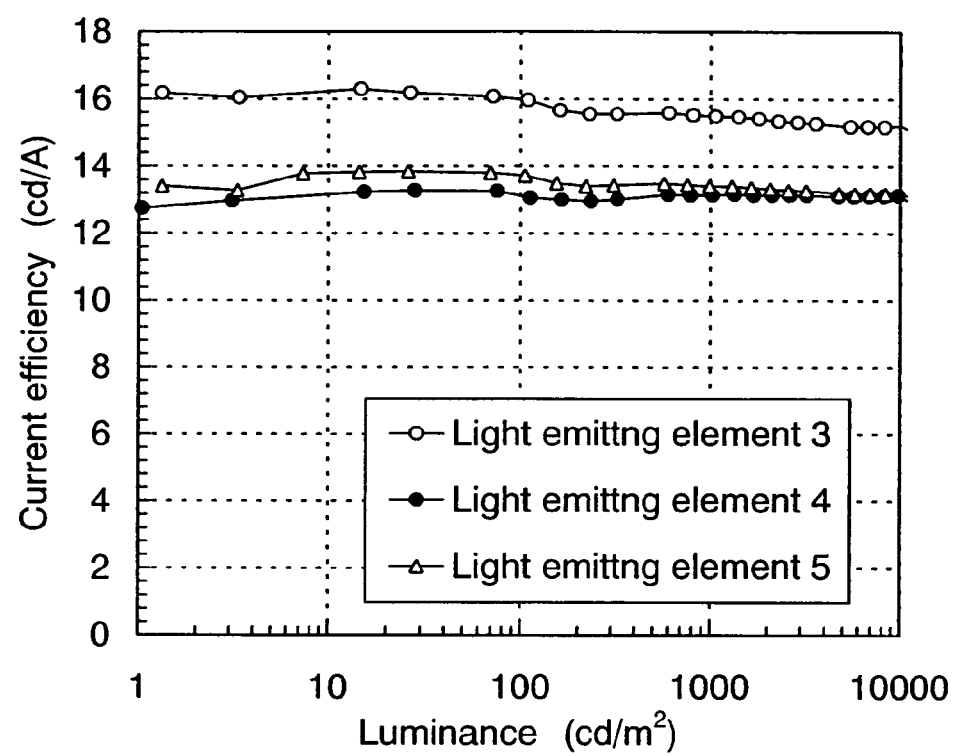
FIG. 40 is a graph showing luminance-current efficiency characteristics of the light emitting elements 3 to 5.
Figure 41:
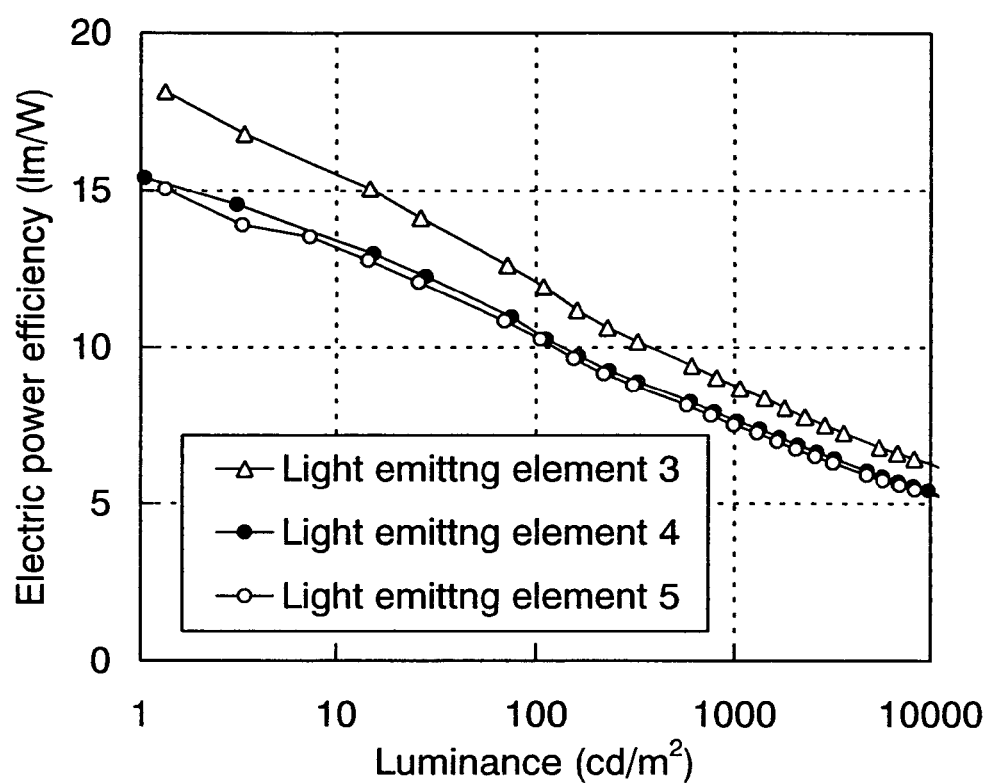
FIG. 41 is a graph showing luminance-electric power efficiency characteristics of the light emitting elements 3 to 5.

Measurement results of operation characteristics of the light emitting elements 3 to 5 manufactured above are shown in FIGS. 38 to 41. The operation characteristics thereof were measured by applying voltage to each of the light emitting elements so that potential of the first electrode 301 was higher than that of the second electrode 302. FIG. 38 is a graph showing voltage-luminance characteristics of the light emitting elements, wherein a horizontal axis indicates voltage (V) and a vertical axis indicates luminance ($cd/m^2$). FIG. 39 is a graph showing voltage-current characteristics of the light emitting elements, wherein a horizontal axis indicates voltage (V) and a vertical axis indicates current (mA). FIG. 40 is a graph showing luminance-current efficiency characteristics of the light emitting elements, wherein a horizontal axis indicates luminance ($cd/m^2$) and a vertical axis indicates current efficiency (cd/A). FIG. 41 is a graph showing luminance-electric power efficiency characteristics of the light emitting elements, wherein a horizontal axis indicates luminance ($cd/m^2$) and a vertical axis indicates electric power efficiency (lm/W).

According to the above described results, it is known that both of the voltage-luminance characteristics and the voltage-current characteristics of the light emitting elements 3 to 5 were equal to each other, and driving voltage of each the light emitting elements according to the present invention is not increased with increasing the thickness of the mixed layer.

Embodiment 8

A method for manufacturing a light emitting element having a layer containing an aromatic hydrocarbon and a metal oxide between a pair of electrodes and operation characteristics thereof will be described below. Note that in this embodiment, two light emitting elements (light emitting elements 6 and 7) having a similar structure with the exception that substances used as the aromatic hydrocarbon were different from each other were manufactured. Further, DPPA or t-BuDBA was used as the aromatic hydrocarbon whereas molybdenum oxide was used as the metal oxide in this embodiment.

Further, each of the light emitting elements of this embodiment is similar to the light emitting element described in Embodiment 1 since each of the light emitting elements has a structure in which a mixed layer, a hole transporting layer, a light emitting layer, an electron transporting layer, and an electron injecting layer are provided between a pair of electrodes. Accordingly, the light emitting elements of this embodiment will be described with reference to FIG. 23, which was used in explanation of Embodiment 1.

As shown in FIG. 23, a first electrode 301 was formed over a substrate 300 using indium tin oxide containing silicon oxide to have a thickness of 110 nm. Note that the first electrode was formed by sputtering.

Next, a first layer 311 containing an aromatic hydrocarbon and molybdenum oxide was formed over the first electrode 301 by co-evaporation. In the sample 6, DPPA was used as the aromatic hydrocarbon. In the sample 7, t-BuDBA was used as the aromatic hydrocarbon. Note that t-BuDBA is a substance represented by a structural formula as follows. Note that in this embodiment, the first layer 311 was formed by using molybdenum trioxide among molybdenum oxide as an evaporation material. The thickness of the first layer 311 of each of the samples was set to be 50 nm. Further, in the first layer 311 of each of the light emitting elements 6 and 7, a concentration of molybdenum oxide contained in the mixed layer was set to be 10 volume %.

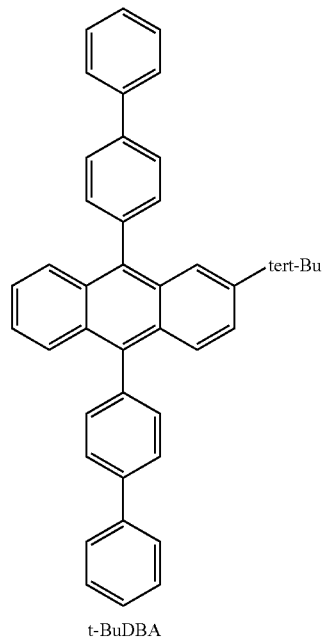

t-BuDBA

Next, a second layer 312 was formed over the first layer 311 using NPB by evaporation. The thickness of the second layer 312 was set to be 10 nm. The second layer 312 served as a hole transporting layer when each of the light emitting elements was driven.

Subsequently, a third layer 313 containing $Alq_3$ and N,N'-diphenylquinacridone (abbreviation: DPQd) was formed over the second layer 312 by co-evaporation. The thickness of the third layer 313 was set to be 40 nm. Further, a weight ratio between Alq$_3$ and DPQd was set to be 1:0.005=Alq$_3$:DPQd. Accordingly, DPQd was dispersed in a layer made from Alq$_3$. When each of the light emitting elements was driven, the third layer 313 served as a light emitting layer.

Next, a fourth layer 314 was formed using Alq$_3$ over the third layer 313 by evaporation. The thickness of the fourth layer 314 was set to be 30 nm. When each of the light emitting elements was driven, the fourth layer 314 served as an electron transporting layer.

Then, a fifth layer 315 was formed using lithium fluoride over the fourth layer 314 by evaporation. The thickness of the fifth layer 315 was set to be 1 nm. When each of the light emitting elements was driven, the fifth layer 315 served as an electron injecting layer.

Next, a second electrode 302 was formed using aluminum over the fifth layer 315 by evaporation to have a thickness of 200 nm.

Figure 42:
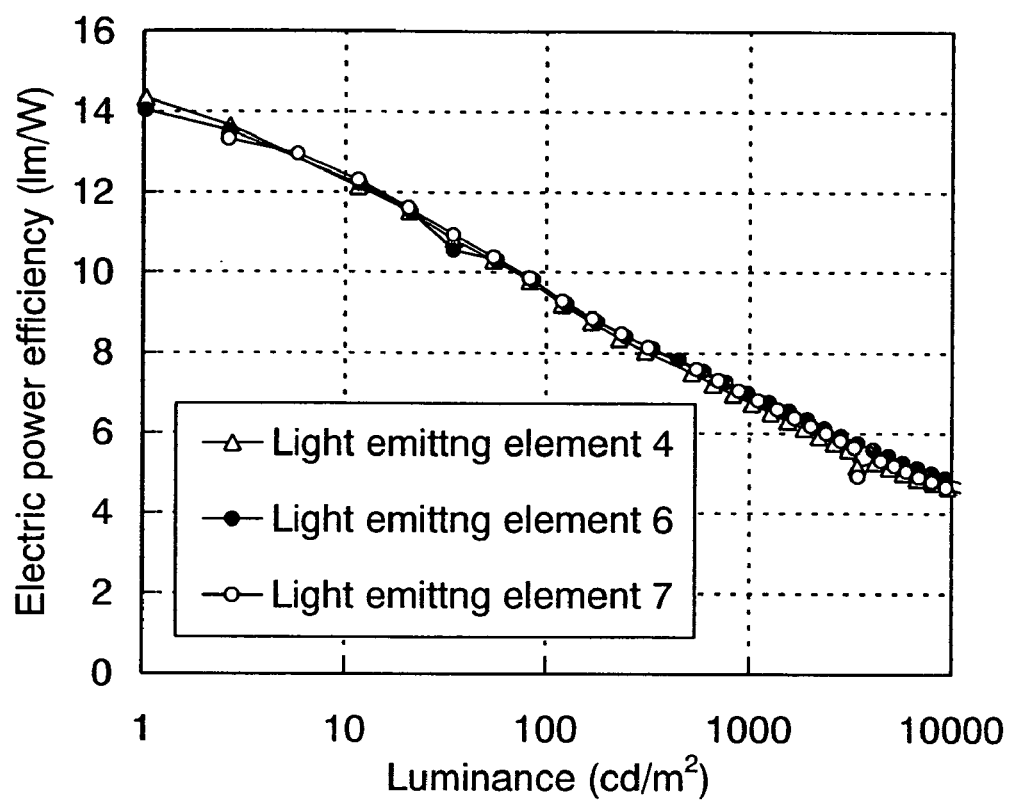
FIG. 42 is a graph showing luminance-electric power efficiency characteristics of light emitting elements 4, 6, and 7.

Measurement results of operation characteristics of the light emitting elements 6 and 7 manufactured above are shown in FIG. 42. The operation characteristics thereof were measured by applying voltage to each of the light emitting elements so that potential of the first electrode 301 was higher than that of the second electrode 302. FIG. 42 is a graph showing luminance-electric power efficiency characteristics of the light emitting elements, wherein a horizontal axis indicates luminance (cd/m$^2$) and a vertical axis indicates electric power efficiency (lm/W). Note that characteristics of the light emitting element 4 is also shown in FIG. 42.

According to FIG. 42, it is known that the light emitting element according to the present invention operates favorably in a case of using any combination of an aromatic hydrocarbon and a metal oxide.

Embodiment 9

Changes in luminance with accumulation of light emitting time and changes in driving voltage with accumulation of light emitting time of the light emitting elements 4, 6, and 7 were measured. The measurement was performed as follows. The manufactured light emitting elements were moved in a glove box under a nitrogen atmosphere, and the light emitting elements are sealed by using a seal material in the glove box. Thereafter, current density required for making the light emitting elements emit light at luminance of 3,000 cd/m2 in an initial state was measured first. Then, current with current density required for making the light emitting elements emit light at luminance of 3,000 cd/m$^2$ in an initial state was fed for a given time to make the light emitting elements emit light continuously. Thus, light emission luminance and applied voltage for elapsed time were plotted. Note that in this embodiment, current density required for making the light emitting elements emit light at a luminance of 3,000 cd/m$^2$ was 24 mA/cm$^2$ for each of the light emitting elements 4, 6, and 7. Further, the measurement was performed under a room temperature (about 25° C.).

Figure 43A:
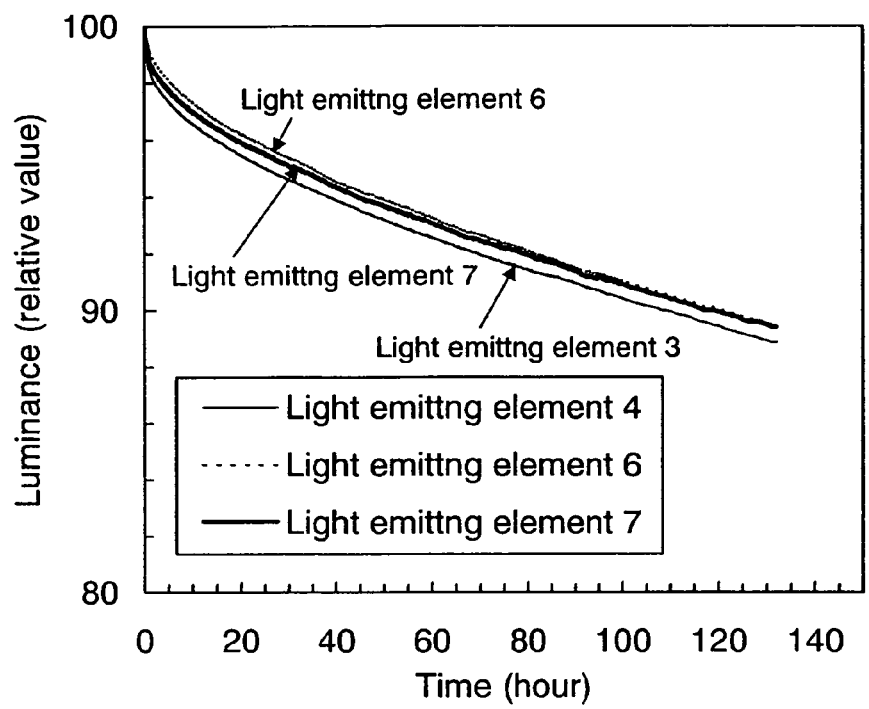
FIGS. 43A and 43B are graphs showing changes in luminance with accumulation of light emitting time and changes in driving voltage with accumulation of light emitting time of the light emitting elements 4, 6, and 7.
Figure 43B:
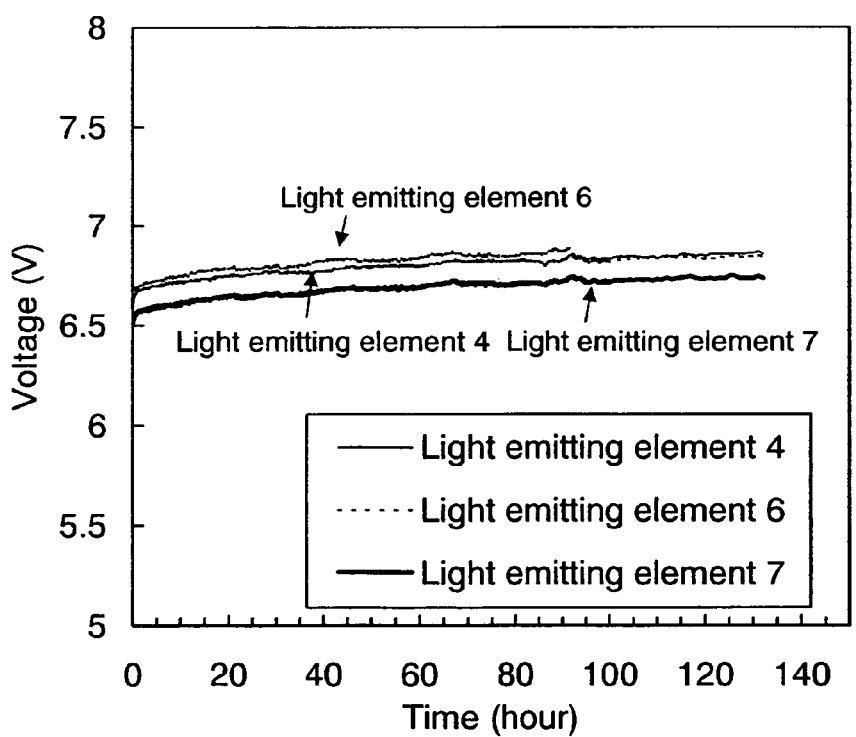

Measurement results are shown in FIGS. 43A and 43B. FIG. 43A is a graph showing changes in luminance with accumulation of light emitting time, wherein a horizontal axis indicates light emitting time (hour) and a vertical axis indicates luminance (a value relative to initial luminance when setting the initial luminance to 100). Further, FIG. 43B is a graph showing changes in driving voltage with accumulation of light emitting time, wherein a horizontal axis indicate light emitting time (hour) and a vertical axis indicates voltage (V) applied to the light emitting elements so as to feed current with current density required for making the light emitting elements emit light at luminance of 3,000 cd/m$^2$. According to FIG. 43A, it is known that each of the light emitting elements 4, 6, and 7 had less reduction in luminance with accumulation of the light emitting time and favorable life. Moreover, according to FIG. 43B, it is known that each of the light emitting elements 4, 6, and 7 had less increase in voltage with accumulation of the light emitting time, i.e., less increase in resistance with accumulation of the light emitting time.

Embodiment 10

In this embodiment, a light emitting element of the present invention having a layer containing an aromatic hydrocarbon and a metal oxide between a pair of electrodes (a light emitting element 8) and a light emitting element of the comparative example having a layer only containing an aromatic hydrocarbon (a light emitting element 9) were manufactured. Measurement results of changes in luminance and voltage with accumulation of light emitting time of each of the light emitting elements will be described.

First, a method for manufacturing the light emitting element 8 will be described. Further, the light emitting element 8 is similar to the light emitting element shown in FIG. 23 since five layers are provided between a pair of electrodes in the light emitting element 8. Accordingly, the light emitting element 8 will also be described with reference to FIG. 23.

As shown in FIG. 23, a first electrode 301 was formed using indium tin oxide containing silicon oxide over a substrate 300 to have a thickness of 110 nm. Note that the first electrode was formed by sputtering.

Next, a first layer 311 containing t-BuDNA and molybdenum oxide was formed over the first electrode 301 by co-evaporation. Note that in this embodiment, the first layer 311 was formed by using molybdenum trioxide among molybdenum oxide as an evaporation material. The thickness of the first layer 311 was set to be 120 nm. Further, a weight ratio between t-BuDNA and molybdenum oxide was set to be 1:0.5=t-BuDNA: molybdenum oxide (t-BuDNA:molybdenum oxide=1:1.7 in a molar ratio).

Next, a second layer 312 was formed using NPB over the first layer 311 by evaporation. The thickness of the second layer 312 was set to be 10 nm. The second layer 312 served as a hole transporting layer when the light emitting element was driven.

Subsequently, a third layer 313 containing Alq$_3$ and coumarin 6 was formed over the second layer 312 by co-evaporation. The thickness of the third layer 313 was set to be 37.5 nm. Further, a weight ratio between Alq$_3$ and coumarin 6 was set to be 1:0.01=Alq$_3$:coumarin 6. Accordingly, coumarin 6 was dispersed in a layer made from Alq$_3$. When the light emitting element was driven, the third layer 313 served as a light emitting layer.

Next, a fourth layer 314 was formed using Alq$_3$ over the third layer 313 by evaporation. The thickness of the fourth layer 314 was set to be 37.5 nm. When the light emitting element was driven, the fourth layer 314 served as an electron transporting layer.

Then, a fifth layer 315 was formed over the fourth layer 314 using lithium fluoride by evaporation. The thickness of the fifth layer 315 was set to be 1 nm. When the light emitting element was driven, the fifth layer 315 served as an electron injecting layer.

Next, a second electrode 302 was formed using aluminum over the fifth layer 315 by evaporation to have a thickness of 200 nm.

The method for manufacturing the light emitting element 8 was described above. A structure of the light emitting element 9 is similar to that of the light emitting element 8 with the exception of a structure of the first layer 311. Accordingly, only a method for forming the first layer 311 of the light emitting element 9 will be described below, and other portions are based on the explanations related to the light emitting element 8.

The first layer 311 of the light emitting element 9 was formed only using t-BuDNA. That is, the first layer 311 did not contain a metal oxide. The thickness of the first layer 311 was set to be 50 nm.

After manufacturing the light emitting elements 8 and 9 as described above, the light emitting elements were sealed using a seal material inside a sealing apparatus under a nitrogen atmosphere. Then, changes in luminance with accumulation of light emitting time and changes in driving voltage with accumulation of light emitting time of the light emitting elements 8 and 9 were measured. The measurement was performed as follows. First, current density required for making the light emitting elements emit light at luminance of 3,000 cd/m$^2$ in an initial state was measured. Then, current with current density required for making the light emitting elements emit light at luminance of 3,000 cd/m$^2$ in an initial state was fed for a given time to make the light emitting elements emit light continuously. Thus, light emission luminance and applied voltage for elapsed time were plotted. Note that in this embodiment, current density required for making the light emitting element 8 emit light at luminance of 3,000 cd/m$^2$ was 23.05 mA/cm$^2$. In this embodiment, current density required for making the light emitting element 9 emit light at luminance of 3,000 cd/m$^2$ was 24.75 mA/cm$^2$. Further, the measurement was performed under a room temperature (about 25° C.).

Figure 44A:
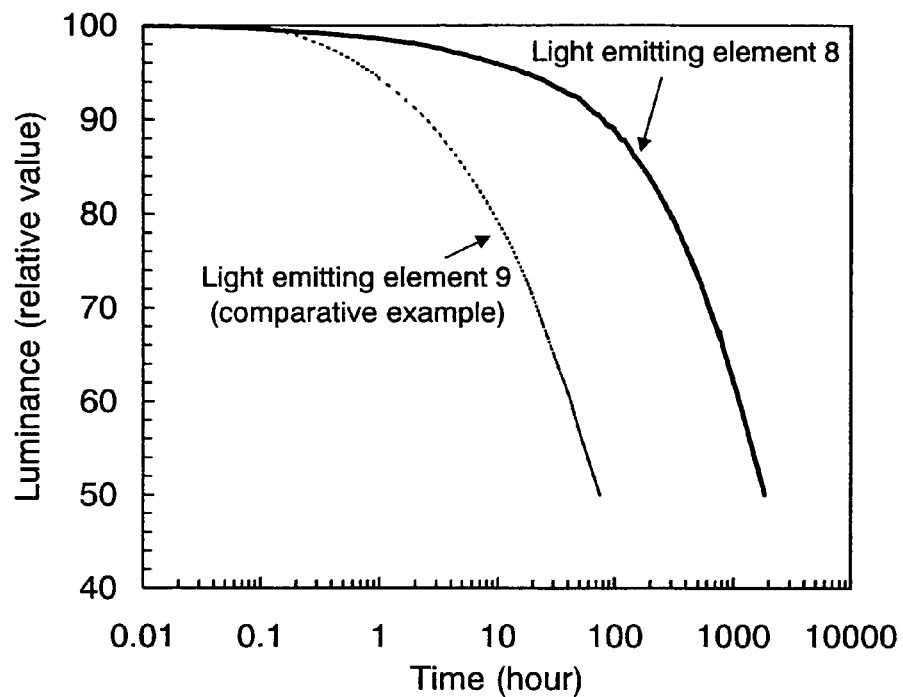
FIG. 44A and 44B are graphs showing changes in luminance with accumulation of light emitting time and changes in driving voltage with accumulation of light emitting time of light emitting elements 8 and 9.
Figure 44B:
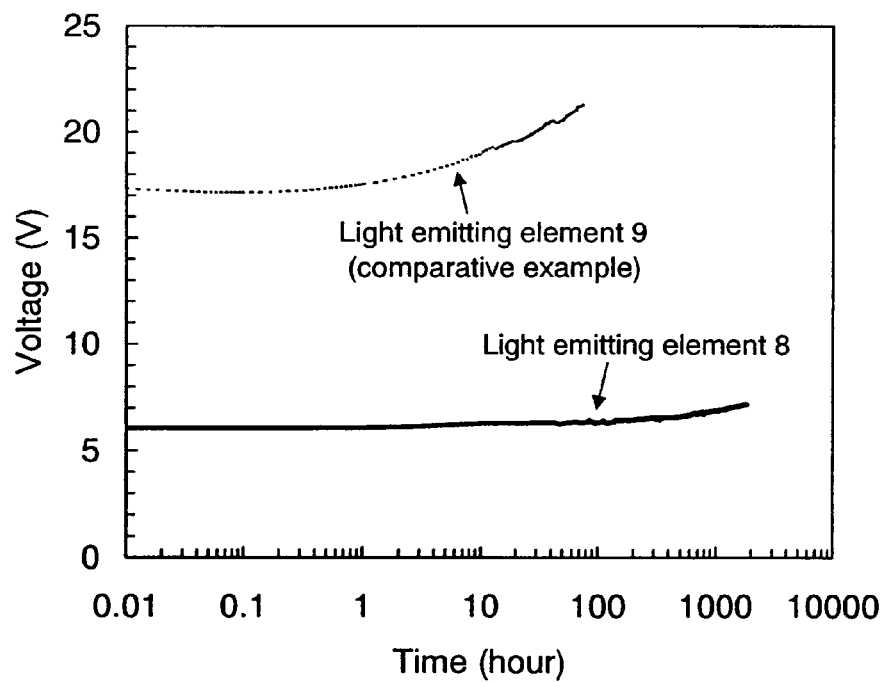

Measurement results are shown in FIGS. 44A and 44B. FIG. 44A is a graph showing changes in luminance with accumulation of light emitting time, wherein a horizontal axis indicates light emitting time (hour) and a vertical axis indicates luminance (a value relative to initial luminance when setting the initial luminance to 100). Further, FIG. 44B is a graph showing changes in driving voltage with accumulation of light emitting time, wherein a horizontal axis indicate light emitting time (hour) and a vertical axis indicates voltage (V) applied to the light emitting elements so as to feed current with current density required for making the light emitting elements emit light with luminance of 3,000 cd/m$^2$.

According to FIG. 44A, it is known that the light emitting element 8 has extremely lesser reduction in luminance with accumulation of the light emitting time and more favorable life than the light emitting element 9 of the comparative example. Moreover, according to FIG. 44B, it is known that the light emitting element 8 has extremely lesser increase in voltage with accumulation of the light emitting time, i.e., lesser increase in resistance with accumulation of the light emitting time than the light emitting element 9 of the comparative example.

Embodiment 11

Examples of light emitting elements using DPAnth as an aromatic hydrocarbon according to the present invention will be described. In this embodiment, three light emitting elements (light emitting elements 10 to 12) having different mixture ratios between a metal oxide used in combination with DPAnth and DPAnth were manufactured. Note that a method for manufacturing the light emitting elements 10 to 12 were similar to one another with the exception that the mixture ratios between the metal oxide and DPAnth were changed from one another.

First, a method for manufacturing the light emitting elements 10 to 12 will be described. Further, each of the light emitting elements is similar to the light emitting element shown in FIG. 23 since five layers are provided between a pair of electrodes in each of the light emitting elements. Accordingly, the light emitting elements will be described with reference to FIG. 23.

As shown in FIG. 23, a first electrode 301 was formed using indium tin oxide containing silicon oxide over a substrate 300 to have a thickness of 110 nm. Note that the first electrode was formed by sputtering.

Next, a first layer 311 containing an aromatic hydrocarbon and molybdenum oxide was formed over the first electrode 301 by co-evaporation. DPAnt was used as the aromatic hydrocarbon. Note that in this embodiment, the first layer 311 was formed by using molybdenum trioxide among molybdenum oxide as an evaporation material. The thickness of the first layer 311 of each of the light emitting elements was set to be 50 nm. In the light emitting element 10, a volume ratio of molybdenum oxide contained in the first layer 311 was set to be 4 volume %. In the light emitting element 11, a volume ratio of molybdenum oxide contained in the first layer 311 was set to be 7 volume %. In the light emitting element 12, a volume ratio of molybdenum oxide contained in the first layer 311 was set to be 10 volume %.

Next, a second layer 312 was formed using NPB over the first layer 311 by evaporation. The thickness of the second layer 312 was set to be 10 nm. The second layer 312 served as a hole transporting layer when each of the light emitting elements was driven.

Subsequently, a third layer 313 containing Alq$_3$ and N,N'-diphenylquinacridone (abbreviation: DPQd) was formed over the second layer 312 by co-evaporation. The thickness of the third layer 313 was set to be 40 nm. Further, a weight ratio between Alq$_3$ and DPQd was set to be 1:0.005=Alq$_3$:DPQd. Accordingly, DPQd was dispersed in a layer made from Alq$_3$. When each of the light emitting elements was driven, the third layer 313 served as a light emitting layer.

Next, a fourth layer 314 was formed using Alq$_3$ over the third layer 313 by evaporation. The thickness of the fourth layer 314 was set to be 30 nm. When each of the light emitting elements was driven, the fourth layer 314 served as an electron transporting layer.

Then, a fifth layer 315 was formed over the fourth layer 314 using lithium fluoride by evaporation. The thickness of the fifth layer 315 was set to be 1 nm. When each of the light emitting elements was driven, the fifth layer 315 served as an electron injecting layer.

Next, a second electrode 302 was formed using aluminum over the fifth layer 315 by evaporation to have a thickness of 200 nm.

Figure 45:
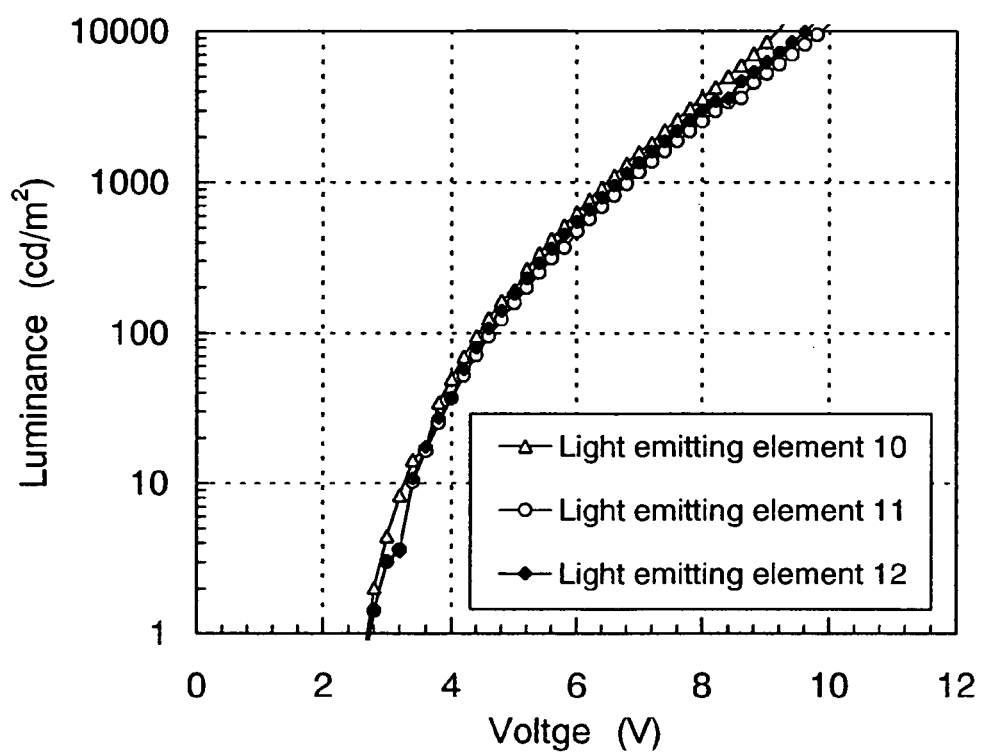
FIG. 45 is a graph showing voltage-luminance characteristics of light emitting elements 10 to 12.

Measurement results of operation characteristics of the light emitting elements 10 to 12 manufactured above are shown in FIG. 45. The operation characteristics thereof were measured by applying voltage to each of the light emitting elements so that potential of the first electrode 301 was higher than that of the second electrode 302. FIG. 45 is a graph showing voltage-luminance characteristics of the light emitting elements, wherein a horizontal axis indicates voltage (V) and a vertical axis indicates luminance (cd/m$^2$). Further, plots represented by white triangles represent characteristics of the light emitting element 10, plots represented by white circles represent characteristics of the light emitting element 11, and plots represented by black diamonds represent characteristics of the light emitting element 12. According to FIG. 45, it is known that there are almost no changes in voltage-luminance characteristics, which are dependent on the rate of molybdenum oxide contained in each of the first layers 331, and each of the light emitting elements 10 to 12 containing molybdenum oxide with 4 to 10 volume % is operated favorably.

Embodiment 12

Examples of light emitting elements using DNA as an aromatic hydrocarbon according to the present invention will be described. In this embodiment, three light emitting elements (light emitting elements 13 to 15) having different mixture ratios between a metal oxide used in combination with DNA and DNA were manufactured. Note that a method for manufacturing the light emitting elements 13 to 15 were similar to one another with the exception that the mixture ratios between the metal oxide and DNA were changed from one another.

First, a method for manufacturing the light emitting elements 13 to 15 will be described. Further, each of the light emitting elements is similar to the light emitting element shown in FIG. 23 since five layers are provided between a pair of electrodes in each of the light emitting elements. Accordingly, the light emitting elements will be described with reference to FIG. 23.

As shown in FIG. 23, a first electrode 301 was formed using indium tin oxide containing silicon oxide over a substrate 300 to have a thickness of 110 nm. The first electrode was formed by sputtering.

Next, a first layer 311 containing an aromatic hydrocarbon and molybdenum oxide was formed over the first electrode 301 by co-evaporation. DNA was used as the aromatic hydrocarbon. Note that in this embodiment, the first layer 311 was formed by using molybdenum trioxide among molybdenum oxide as an evaporation material. The thickness of the first layer 311 of each of the light emitting elements was set to be 50 nm. In the light emitting element 13, a volume ratio of molybdenum oxide contained in the first layer 311 was set to be 4 volume %. In the light emitting element 14, a volume ratio of molybdenum oxide contained in the first layer 311 was set to be 7 volume %. In the light emitting element 15, a volume ratio of molybdenum oxide contained in the first layer 311 was set to be 10 volume %.

Next, a second layer 312 was formed using NPB over the first layer 311 by evaporation. The thickness of the second layer 312 was set to be 10 nm. The second layer 312 served as a hole transporting layer when each of the light emitting elements was driven.

Subsequently, a third layer 313 containing $Alq_3$ and N,N'-diphenylquinacridone (abbreviation: DPQd) was formed over the second layer 312 by co-evaporation. The thickness of the third layer 313 was set to be 40 nm. Further, a weight ratio between $Alq_3$ and DPQd was set to be 1:0.005=$Alq_3$:DPQd. Accordingly, DPQd was dispersed in a layer made from $Alq_3$. When each of the light emitting elements was driven, the third layer 313 served as a light emitting layer.

Next, a fourth layer 314 was formed using $Alq_3$ over the third layer 313 by evaporation. The thickness of the fourth layer 314 was set to be 30 nm. When each of the light emitting elements was driven, the fourth layer 314 served as an electron transporting layer.

Then, a fifth layer 315 was formed using lithium fluoride over the fourth layer 314 by evaporation. The thickness of the fifth layer 315 was set to be 1 nm. When each of the light emitting elements was driven, the fifth layer 315 served as an electron injecting layer.

Next, a second electrode 302 was formed using aluminum over the fifth layer 315 by evaporation to have a thickness of 200 nm.

Figure 46:
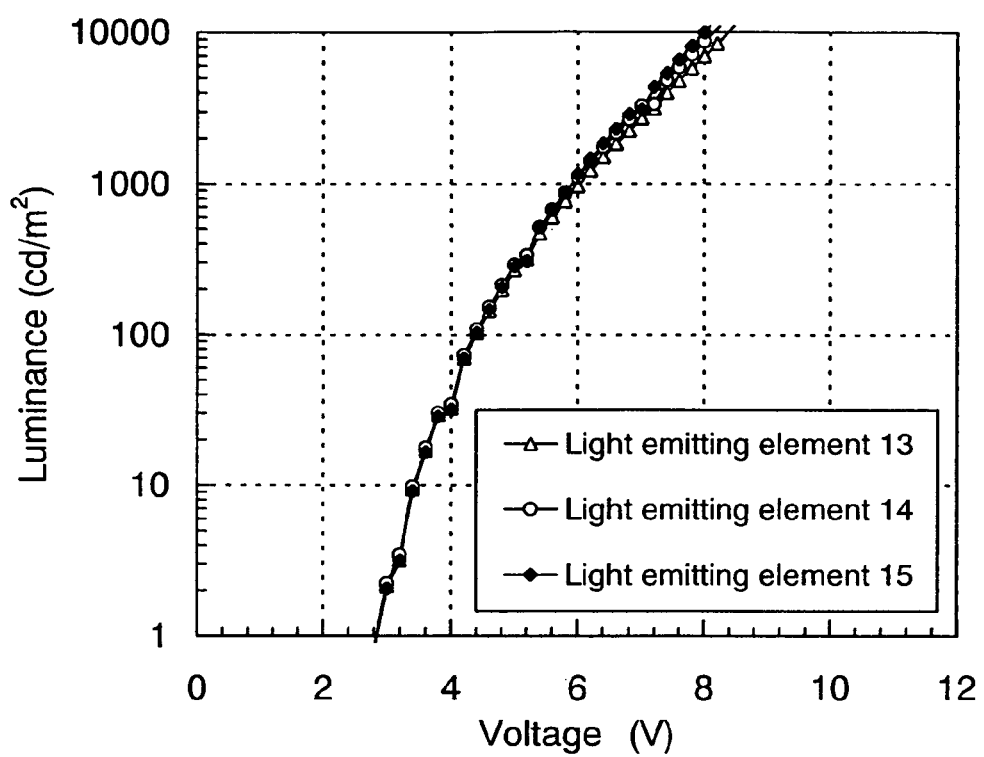
FIG. 46 is a graph showing voltage-luminance characteristics of light emitting elements 13 to 15.

Measurement results of operation characteristics of the light emitting elements 13 to 15 manufactured above are shown in FIG. 46. The operation characteristics thereof were measured by applying voltage to each of the light emitting elements so that potential of the first electrode 301 was higher than that of the second electrode 302. FIG. 46 is a graph showing voltage-luminance characteristics of the light emitting elements, wherein a horizontal axis indicates voltage (V) and a vertical axis indicates luminance ($cd/m^2$). Further, plots represented by white triangles represent characteristics of the light emitting element 13, plots represented by white circles represent characteristics of the light emitting element 14, and plots represented by black diamonds represent characteristics of the light emitting element 15. According to FIG. 46, it is known that there are almost no changes in voltage-luminance characteristics, which are dependent on the rate of molybdenum oxide contained in each of the first layers 331, and each of the light emitting elements 13 to 15 containing molybdenum oxide with 4 to 10 volume % is operated favorably.

Note that in the embodiments of this specification, a rate of molybdenum oxide contained in a mixed layer is represented by a volume ratio in some cases. For example, when molybdenum oxide is contained by a volume ratio of 10 volume % and the volume ratio is converted into a mass ratio, the mass ratio between an organic compound and molybdenum oxide becomes 4:1=the organic compound:molybdenum oxide).

This application is based on Japanese Patent Application serial No. 2005-181806 filed in Japan Patent Office on Jun. 22, 2005 and Japanese Patent Application serial No. 2005-213708 filed in Japan Patent Office on Jul. 25, 2005, the entire contents of which are hereby incorporated by reference.

What is claimed is:

1. A light emitting device comprising:
a first electrode;
a mixed layer over and in contact with the first electrode;
a hole-transporting layer over and in contact with the mixed layer;
a light emitting layer over and in contact with the hole-transporting layer; and
a second electrode over the light emitting layer,
wherein the mixed layer consists essentially of an aromatic hydrocarbon and a metal oxide selected from the group consisting of molybdenum oxide, vanadium oxide, ruthenium oxide, and rhenium oxide,
wherein the aromatic hydrocarbon is an anthracene derivative, and
wherein the hole-transporting layer contains an aromatic amine.

2. A light emitting device according to claim 1, wherein the aromatic hydrocarbon has 14 to 60 carbon atoms.

3. A light emitting device comprising:
a first electrode;
a mixed layer over and in contact with the first electrode;
a hole-transporting layer over and in contact with the mixed layer,
a light emitting layer over and in contact with the hole-transporting layer; and
a second electrode over the light emitting layer,
wherein the mixed layer consists essentially of an aromatic hydrocarbon and a metal oxide selected from the group consisting of molybdenum oxide, vanadium oxide, ruthenium oxide, and rhenium oxide,
wherein the aromatic hydrocarbon is an anthracene derivative, and
wherein the anthracene derivative is any one of 2-tert-butyl-9,10-di(2-naphthyl)anthracene; 9,10-di(naphthalen-1-yl)-2-tert-butyl anthracene; anthracene; 9,10- diphenylanthracene; 9,10-bis(3,5-diphenylphenyl)anthracene; 9,10-di(naphthalen-2-yl)anthracene; 2-tert-butylanthracene; 9,10-di(4-methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; bianthryl; 10,10'-di(2-phenylphenyl)-9,9'-bianthryl; 10,10'-bis[(2,3,4,5,6-pentaphenyl)phenyl]-9,9'-bianthryl; and 9,10-di(4-phenylphenyl)-2-tert-butylanthracene, and wherein the hole-transporting layer contains an aromatic amine.

4. A light emitting device according to claim 1, wherein the hole-transporting layer includes any one of 4,4'-bis[N-(1-naphthyl)-N-phenylamino]biphenyl; 4,4'-bis[N-(3-methylphenyl)-N-phenylamino]biphenyl; 1,3,5-tris[N,N-di(m-tolyl)amino]benzene; 4,4',4"-tris(N-carbazolyl)triphenylamine; 2,3-bis(4-diphenylaminophenyl)quinoxaline; and 2,3-bis{4-[N-(1-naphthyl)-N-phenylamino]phenyl}-dibenzo[f,h]quinoxaline.

5. An electronic appliance comprising the light emitting device according to claim 1.

6. A light emitting device comprising:
a first electrode;
a mixed layer over and in contact with the first electrode;
a hole-transporting layer over and in contact with the mixed layer,
a light emitting layer over and in contact with the hole-transporting layer; and
a second electrode over the light emitting layer,
wherein the mixed layer consists essentially of an aromatic hydrocarbon and a metal oxide selected from the group consisting of molybdenum oxide and ruthenium oxide,
wherein the aromatic hydrocarbon is an anthracene derivative, and
wherein the hole-transporting layer contains an aromatic amine.

7. A light emitting device according to claim 6, wherein the aromatic hydrocarbon has 14 to 60 carbon atoms.

8. A light emitting device according to claim 6,
wherein the anthracene derivative is any one of 2-tert-butyl-9,10-di(2-naphthyl)anthracene; 9,10-di(naphthalen-1-yl)-2-tert-butyl anthracene; anthracene; 9,10-diphenylanthracene; 9,10-bis(3,5-diphenylphenyl)anthracene; 9,10-di(naphthalen-2-yl)anthracene; 2-tert-butylanthracene; 9,10-di(4-methylnaphthalen-1-yl)anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; bianthryl; 10,10'-di(2-phenylphenyl)-9,9'-bianthryl; 10,10'-bis[(2,3,4,5,6-pentaphenyl)phenyl]-9,9'-bianthryl; and 9,10-di(4-phenylphenyl)-2-tert-butylanthracene.

9. A light emitting device according to claim 6, wherein the hole-transporting layer includes any one of 4,4'-bis[N-(1-naphthyl)-N-phenylamino]biphenyl; 4,4'-bis[N-(3-methylphenyl)-N-phenylamino]biphenyl; 1,3,5-tris[N,N-di(m-tolyl)amino]benzene; 4,4',4"-tris(N-carbazolyl)triphenylamine; 2,3-bis(4-diphenylaminophenyl)quinoxaline; and 2,3-bis{4-[N-(1-naphthyl)-N-phenylamino]phenyl}-dibenzo[f,h]quinoxaline.

10. An electronic appliance comprising the light emitting device according to claim 6.

11. A light emitting device according to claim 1, wherein the anthracene derivative does not have an arylamine skeleton.

12. A lighting device comprising the light emitting device according to claim 1.

13. A lighting device comprising the light emitting device according to claim 3.

14. A lighting device comprising the light emitting device according to claim 6.

* * * * *